(12) United States Patent
Hirano et al.

(10) Patent No.: US 7,989,137 B2
(45) Date of Patent: Aug. 2, 2011

(54) RESIST COMPOSITION AND PATTERN-FORMING METHOD USING THE SAME

(75) Inventors: Shuji Hirano, Shizuoka (JP);
Kazuyoshi Mizutani, Shizuoka (JP);
Shinichi Sugiyama, Shizuoka (JP); Jiro Yokoyama, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 195 days.

(21) Appl. No.: 12/238,856

(22) Filed: Sep. 26, 2008

(65) Prior Publication Data

US 2009/0087789 A1    Apr. 2, 2009

(30) Foreign Application Priority Data

Sep. 28, 2007    (JP) ................. 2007-256201

(51) Int. Cl.
*G03F 7/039*  (2006.01)
*G03F 7/20*   (2006.01)
*G03F 7/30*   (2006.01)

(52) U.S. Cl. .............. 430/270.1; 430/311; 430/326; 430/905; 430/910

(58) Field of Classification Search .......... None
See application file for complete search history.

(56) References Cited

U.S. PATENT DOCUMENTS

| | | | |
|---|---|---|---|
| 4,491,628 A | 1/1985 | Ito et al. | |
| 5,561,194 A | 10/1996 | Cornett et al. | |
| 6,656,660 B1 * | 12/2003 | Urano et al. | 430/270.1 |

FOREIGN PATENT DOCUMENTS

| | | |
|---|---|---|
| EP | 1705518 A2 | 9/2006 |
| JP | 5-249682 A | 9/1993 |
| JP | 9-106073 A | 4/1997 |
| JP | 9-211866 A | 8/1997 |
| JP | 9-244248 A | 9/1997 |
| JP | 3116751 B2 | 10/2000 |
| JP | 2002-131915 A | 5/2002 |
| JP | 2004-302434 A | 10/2004 |

OTHER PUBLICATIONS

Derwent Englsih abstract for JP2002-131915.*
Machine-assisted English translation of JP2002-131915 as provided by JPO.*
Extended European Search Report dated May 7, 2009.

* cited by examiner

*Primary Examiner* — Sin J. Lee
(74) *Attorney, Agent, or Firm* — Sughrue Mion, PLLC

(57) ABSTRACT

A resist composition includes (A) a resin including: a repeating unit capable of decomposing by the action of an acid to increase solubility in an alkali developing solution and represented by formula (I), and a repeating unit represented by formula (II); and (B) a compound capable of generating an acid upon irradiation with actinic ray or radiation:

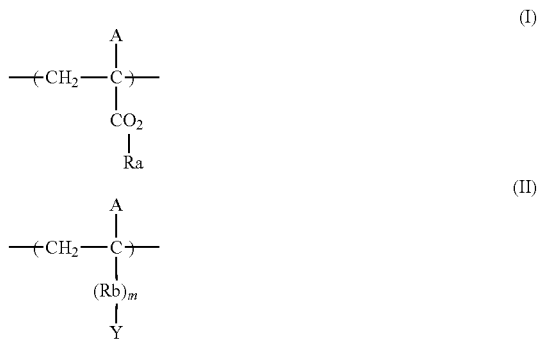

wherein A represents a hydrogen atom, an alkyl group, a hydroxyl group, an alkoxyl group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group; Ra represents a group containing a group capable of decomposing by the action of an acid; Rb represents an alkylene group, a cycloalkylene group, or a group of combining these groups; Y represents a heterocyclic group; and m represents 0 or 1.

5 Claims, No Drawings

RESIST COMPOSITION AND PATTERN-FORMING METHOD USING THE SAME

BACKGROUND OF THE INVENTION

1. Field of the Invention

The present invention relates to a resist composition preferably used in super-microlithography processes such as the manufacture of super LSI and high capacity microchips, and other photofabrication processes, and a pattern-forming method using the same. More specifically, the invention relates to a resist composition capable of forming a highly precise pattern with KrF excimer laser beams, electron beams, or EUV rays, and a pattern-forming method using the same, and further a resist composition suitable for fine processing of semiconductor devices with KrF excimer laser beams, electron beams, or EUV rays, and a pattern-forming method using the same.

2. Description of the Related Art

In the manufacturing process of semiconductor devices such as IC and LSI, fine processing by lithography using photoresist compositions has been conventionally carried out. In recent years, with the increment of integration of integrated circuits, hyperfine pattern formation of the levels of a sub-micron and a quarter-micron has come to be required. Under such a circumstance, the exposure wavelengths show a tendency to be shortening, such as from g-line to i-line, and further to KrF excimer laser beam. Further, lithography using electron beams, X-rays or EUV rays in addition to excimer laser beams has been developed nowadays.

Lithography using electron beams and EUV rays is taken as the pattern forming technique of the next generation or the next to the next generation, so that resists of high sensitivity and high resolution are required. The increase in sensitivity is a very important object in view of shortening of the processing time of wafers, but in positive resists for electron beams and EUV rays, pursuit of increment of sensitivity is accompanied by not only reduction of resolution but also deterioration of line width roughness (LWR), so that the development of a resist satisfying these characteristics at the same time is strongly desired. High sensitivity, high resolution, and good line width roughness are in relationship of trade-off, and how to satisfy these factors at the same time is a very important object.

In lithography using KrF excimer laser beams, it is also an important object to satisfy high sensitivity, high resolution, and good LWR at the same time. Further, line width variation (swing or SW) due to standing wave, shape, and variation of a resist film thickness in a high reflection substrate represented by ion implantation process is also a problem. It is known that the swing due to variation of a resist film thickness in a high reflection substrate is liable to increase when transmittance of a resist is high, and the swing is decreased by the introduction of a dye. However, reduction of resolution and deterioration of LWR are caused by the introduction of a dye, and further there are cases where the dye is sublimated and the baking plate is soiled at the time of baking in forming a resist film. How to satisfy these problems at the same time is very important.

As resists suitable for a lithographic process using KrF excimer laser beams, electron beams, or EUV rays, chemical amplification resists utilizing acid catalytic reaction are primarily used in view of the enhancement of sensitivity, and chemical amplification resist compositions mainly comprising a phenolic polymer having a property of being insoluble or hardly soluble in an alkali developing solution but becoming soluble in an alkali developing solution by the action of an acid (hereinafter referred to as a phenolic acid-decomposable resin) and an acid generator are effectively used in positive resists.

An initial chemical amplification positive resist composition comprising a resin protected with a photo-acid generator and an acid-decomposable group is disclosed in patent document 1 (U.S. Pat. No. 4,491,628). The chemical amplification positive resist composition is a pattern forming material capable of generating an acid at an exposed area upon irradiation with radiation such as far ultraviolet rays, and varying the solubility in a developing solution of the areas irradiated and not irradiated with actinic radiation to form a pattern on a substrate by the reaction with the generated acid as a catalyst.

Various kinds of positive resist compositions containing a resin protected with an acid-decomposable group are so far known. For example, a resist composition using a polyhydroxystyrene resin protected with an alkoxy (acetal) group is disclosed in patent document 2 (JP-A-5-249682 (the term "JP-A" as used herein refers to an "unexamined published Japanese patent application")), a resist composition using a polyhydroxystyrene resin protected with different two kinds of acid-decomposable groups is disclosed in patent document 3 (JP-A-9-211866), a resist composition using a phenolic acid-decomposable resin copolymerized with an acid-decomposable acrylate monomer is disclosed in patent document 4 (U.S. Pat. No. 5,561,194), a polymer having a repeating unit capable of reducing the solubility of the polymer in an alkali developing solution such as methyl methacrylate and styrene is proposed in patent document 5 (Japanese Patent 3116751).

Patent document 6 (JP-A-2004-302434) discloses a resist composition using anthracene rings as a dye, and patent document 7 (JP-A-9-106073) discloses a resist composition using a nitrogen-containing polymer. However, high sensitivity, high resolution, and good LWR in a hyperfine area, and further, the swing due to standing wave, shape, and variation of a resist film thickness in a high reflection substrate represented by KrF ion implantation process have not been satisfied yet at the same time in every combination of these resist compositions in the present situation.

SUMMARY OF THE INVENTION

An object of the invention is to provide a resist composition showing high sensitivity, high resolution, and good LWR, and further, reduced in the swing due to standing wave, shape, and variation of a resist film thickness in a high reflection substrate by KrF ion implantation, and another object is to provide a pattern-forming method using the same.

The invention is as follows.

(1) A resist composition comprising:
(A) a resin comprising:
a repeating unit capable of decomposing by the action of an acid to increase solubility in an alkali developing solution and represented by the following formula (I), and
a repeating unit represented by the following formula (II); and
(B) a compound capable of generating an acid upon irradiation with actinic ray or radiation:

-continued

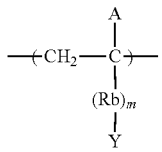
(II)

wherein
A represents a hydrogen atom, an alkyl group, a hydroxyl group, an alkoxyl group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group;

Ra represents a group containing a group capable of decomposing by the action of an acid;

Rb represents an alkylene group, a cycloalkylene group, or a group of combining these groups;

Y represents a heterocyclic group; and m represents 0 or 1.

(2) The resist composition as described in the above (1), wherein the resin (A) further comprises:

a repeating unit represented by the following formula (III):

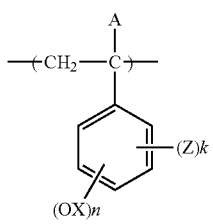
(III)

wherein
A represents a hydrogen atom, an alkyl group, a hydroxyl group, an alkoxyl group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group;

X represents a hydrogen atom or a group containing a group capable of decomposing by the action of an acid, and when there are a plurality of X's, each X may be the same as or different from every other X;

Z represents a substituent, and when there are a plurality of Z's, each Z may be the same as or different from every other Z;

n represents an integer of from 1 to 5;

k represents an integer of from 0 to 4; and n and k satisfy $1 \leq n+k \leq 5$.

(3) The resist composition as described in the above (2), wherein

Ra in the formula (I) in the resin (A) is a group represented by —C(Rc)(Rd)(Re)

wherein
each of Rc, Rd and Re independently represents a hydrogen atom, an alkyl group, a cycloalkyl group or an aryl group, and Rd and Re may be bonded to each other to form a ring.

(4) The resist composition as described in any of the above (1) to (3), wherein the heterocyclic group represented by Y in the formula (II) in the resin (A) is polycyclic.

(5) The resist composition as described in any of the above (1) to (3), wherein the heterocyclic group represented by Y in the formula (II) in the resin (A) is monocyclic.

(6) The resist composition as described in any of the above (1) to (3), wherein the heterocyclic group represented by Y in the formula (II) in the resin (A) is a 5- or 6-membered ring.

(7) The resist composition as described in any of the above (1) to (3), wherein the heterocyclic group represented by Y in the formula (II) in the resin (A) is an aromatic heterocyclic ring.

(8) A pattern-forming method comprising:

forming a resist film with the resist composition as described in any of the above (1) to (7), exposing the resist film, and developing the resist film.

The preferred embodiments of the invention are further described below.

(9) The resist composition as described in any of the above (1) to (7), wherein the repeating unit represented by formula (III) is represented by the following formula (IIIa):

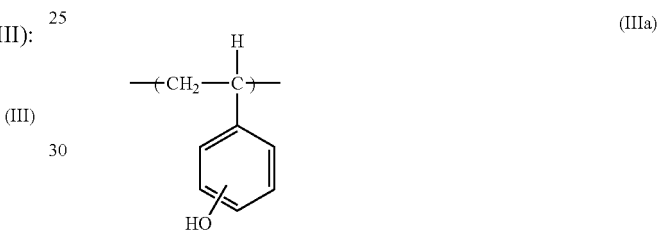
(IIIa)

(10) The resist composition as described in the above (9), wherein the repeating unit represented by formula (III) is represented by the following formula (IIIb):

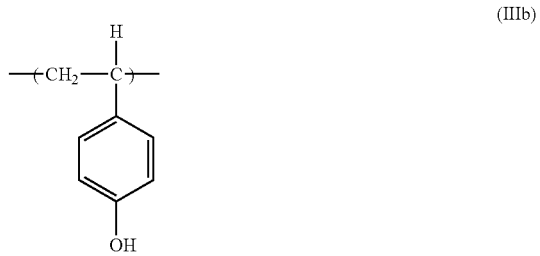
(IIIb)

(11) The resist composition as described in any of the above (1) to (7), (9) and (10), wherein the heterocyclic group represented by Y in the formula (II) in the resin (A) is monocyclic and has an aryl group as a substituent.

(12) The resist composition as described in any of the above (1) to (7), (9) and (10), wherein the heterocyclic group represented by Y in the formula (II) in the resin (A) is a heterocyclic ring having absorption at 248 nm.

(13) The resist composition as described in any of the above (1) to (7), and (9) to (12), wherein m in formula (II) in resin (A) is 0.

(14) The resist composition as described in any of the above (1) to (7), and (9) to (13), further comprising:

(C) a basic compound.

(15) The resist composition as described in any of the above (1) to (7), and (9) to (14), further comprising:
(D) a surfactant.
(16) The resist composition as described in any of the above (1) to (7), and (9) to (15), further comprising
(E) a solvent.
(17) The resist composition as described in the above (16), wherein
the solvent (E) comprises propylene glycol monomethyl ether acetate.
(18) The resist composition as described in the above (17), wherein
the solvent (E) further comprises at least one selected from the group consisting of propylene glycol monomethyl ether, ethyl lactate, butyl acetate, ethoxyethyl propionate, and methyl amyl ketone.
(19) The resist composition as described in any of the above (1) to (7), and (9) to
(18), further comprising:
(F) an antioxidant.
(20) The resist composition as described in any of the above (1) to (7), and (9) to (19), which is exposed by irradiation with KrF, electron beams, X-rays or EUV.
(21) A pattern-forming method comprising:
forming a resist film with the resist composition as described in any of the above (1) to (7) and (9) to (20),
exposing the resist film, and
developing the resist film.

DETAILED DESCRIPTION OF THE INVENTION

The invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

[1] (A) A Resin Having a Repeating Unit Represented by Formula (I) and a Repeating Unit Represented by Formula (II):

The resist composition in the invention contains a resin having a repeating unit represented by formula (I) and a repeating unit represented by formula (II) (hereinafter also referred to as "a resin of component (A)" or "resin (A)").

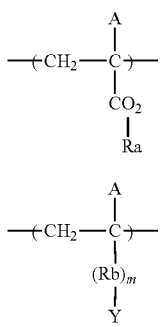

In formulae (I) and (II), A represents a hydrogen atom, an alkyl group, a hydroxyl group, an alkoxyl group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group.

Ra represents a group having a group capable of separating by the action of an acid or a group capable of decomposing by the action of an acid.

Rb represents an alkylene group, a cycloalkylene group, or a group of combining these groups.

Y represents a nitrogen-containing heterocyclic group.

m represents 0 or 1.

The group containing a group capable of decomposing by the action of an acid (an acid-decomposable group) represented by Ra may be a group capable of generating a carboxyl group in the repeating unit represented by formula (I) as a result of Ra being separated by the action of an acid generated from a photo-acid generator, i.e., an acid-decomposable group itself, or may be a group containing an acid-decomposable group, that is, a group capable of decomposing by the action of an acid and generating an alkali soluble group such as a hydroxyl group or a carboxyl group in a residue bonding to the repeating unit.

As the acid-decomposable groups, preferably a group bonding to the ester group in formula (I) via a tertiary carbon atom, and a group having a secondary benzyl group are exemplified, and a hydrocarbon group is preferred.

The hydrocarbon group is preferably a group having an alkyl group, a cycloalkyl group or an aryl group, more preferably a group having an alkyl group or a cycloalkyl group, and still more preferably a group having an alkyl group.

The alkyl group represented by Ra is preferably a straight chain or branched alkyl group having from 1 to 6 carbon atoms, e.g., a t-butyl group can be exemplified.

The cycloalkyl group represented by Ra may have a substituent, and may be monocyclic or polycyclic. Specifically, monocyclic, bicyclic, tricyclic and tetracyclic structures having 5 or more carbon atoms can be exemplified. The number of carbon atoms is preferably from 6 to 30, and especially preferably from 7 to 25.

The examples of the cycloalkyl groups are shown below.

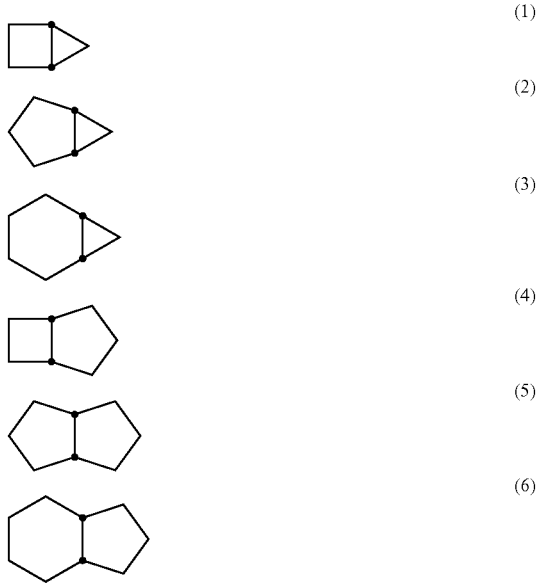

-continued
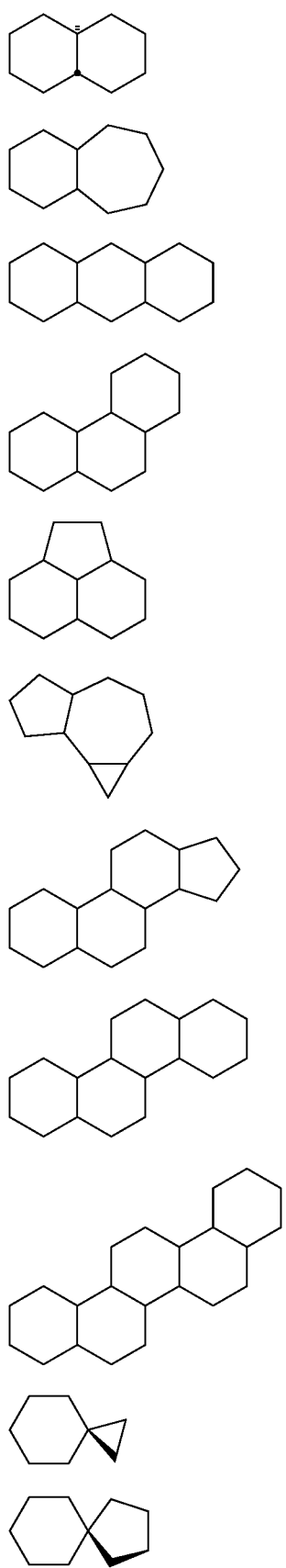
(7)
(8)
(9)
(10)
(11)
(12)
(13)
(14)
(15)
(16)
(17)
-continued
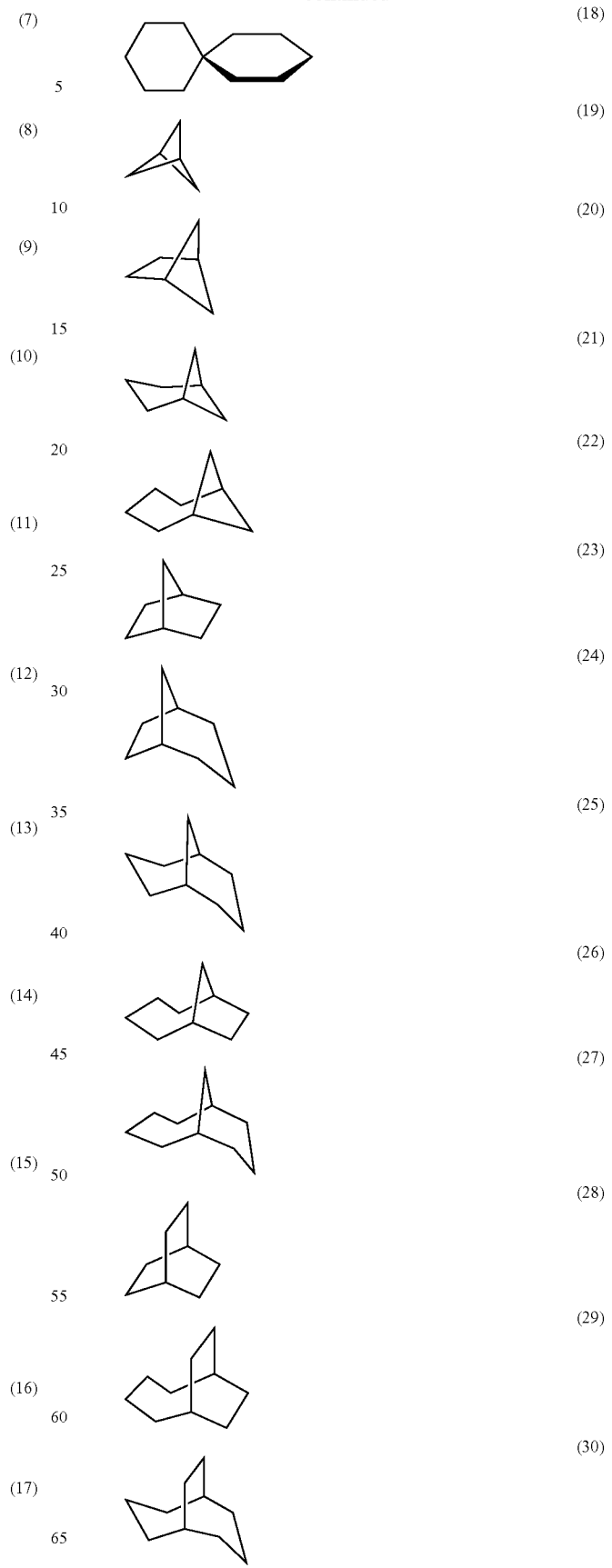
(18)
(19)
(20)
(21)
(22)
(23)
(24)
(25)
(26)
(27)
(28)
(29)
(30)

(31) 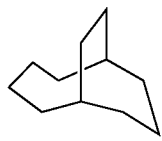

(32) 

(33) 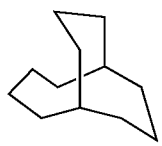

(34) 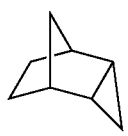

(35) 

(36) 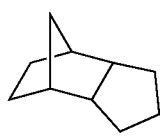

(37) 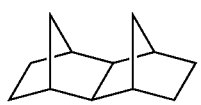

(38) 

(39) 

(40) 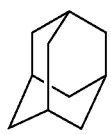

(41) 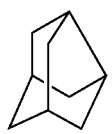

(42) 

(43) 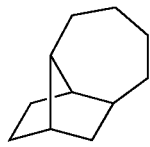

(44) 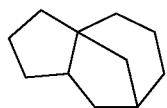

(45) 

(46) 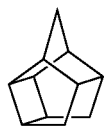

(47) 

(48) 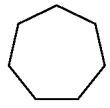

(49) 

(50) 

In the invention, as preferred groups having a cycloalkyl group (also referred to as "alicyclic groups"), an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. As more preferred groups, an adamantyl group, a decalin residue, a norbornyl group, a cedrol group, a cyclohexyl group, a cycloheptyl group, a cyclooctyl group, a cyclodecanyl group, and a cyclododecanyl group are exemplified.

As the substituents of the cycloalkyl groups, e.g., an alkyl group, a halogen atom, a hydroxyl group, an alkoxyl group, a carboxyl group, and an alkoxycarbonyl group are exemplified. The alkyl group is preferably a lower alkyl group, e.g., a methyl group, an ethyl group, a propyl group, an isopropyl group, and a butyl group, and more preferably a methyl group, an ethyl group, a propyl group, and an isopropyl group are exemplified. As the alkoxyl group, an alkoxyl group having from 1 to 4 carbon atoms, e.g., a methoxy group, an ethoxy group, a propoxy group, and a butoxy group can be exemplified. As the substituents that the alkyl group and the alkoxyl group may have, a hydroxyl group, a halogen atom, and an alkoxyl group (preferably having from 1 to 4 carbon atoms) can be exemplified.

As further substituents that the above groups may have, a hydroxyl group, a halogen atom (fluorine, chlorine, bromine, iodine), a nitro group, a cyano group, the above alkyl groups, an alkoxyl group, e.g., a methoxy group, an ethoxy group, a hydroxyethoxy group, a propoxy group, a hydroxypropoxy group, an n-butoxy group, an isobutoxy group, a sec-butoxy group, and a t-butoxy group, an alkoxycarbonyl group, e.g., a methoxycarbonyl group and an ethoxycarbonyl group, an aralkyl group, e.g., a benzyl group, a phenethyl group, and a cumyl group, an aralkyloxy group, an acyl group, e.g., a formyl group, an acetyl group, a butyryl group, a benzoyl group, a cyanamyl group, and a valeryl group, an acyloxy group, e.g., a butyryloxy group, the above alkenyl groups, an alkenyloxy group, e.g., a vinyloxy group, a propenyloxy group, an allyloxy group, and a butenyloxy group, the above aryl groups, an aryloxy group, e.g., a phenoxy group, and an aryloxycarbonyl group, e.g., a benzoyloxy group are exemplified.

As the substituents that the cycloalkyl group in Ra may have, preferably an alkyl group having from 1 to 20 carbon atoms, an aryl group having from 6 to 20 carbon atoms, and an aralkyl group having from 7 to 20 carbon atoms are exemplified. These substituents may further have a substituent.

As the group having an aryl structure in Ra, an aryl group having from 6 to 14 carbon atoms, e.g., a phenyl group, a xylyl group, a toluoyl group, a cumenyl group, a naphthyl group, and an anthracenyl group are preferred.

As the group having an aryl structure in Ra, a group represented by the following formula (IRa) is more preferred.

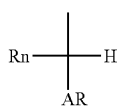

(IRa)

In formula (IRa), AR represents an aryl group, e.g., a benzene ring or a naphthalene ring, and each may have one or more substituents. As the substituents, a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group, and a dodecyl group are exemplified, and preferably a straight chain or branched alkyl group having from 1 to 20 carbon atoms, an alkoxyl group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethyl-carbonyloxy group, and a heterocyclic residue, e.g., a pyrrolidone residue, are exemplified, and a straight chain or branched alkyl group having from 1 to 5 carbon atoms is preferred in view of resolution. More preferred substituent is benzene or paramethylbenzene.

Rn represents an alkyl group, a cycloalkyl group, or an aryl group.

The alkyl group represented by Rn in formula (IRa) may have a substituent, and may be either straight chain or branched. The straight chain alkyl group preferably has from 1 to 30 carbon atoms, and more preferably from 1 to 20 carbon atoms, e.g., a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, and an n-decanyl group are exemplified. The branched alkyl group preferably has from 3 to 30 carbon atoms, and more preferably from 3 to 20 carbon atoms, e.g., an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decanoyl group are exemplified. As preferred substituents, an alkoxyl group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue, e.g., a pyrrolidone residue are exemplified, and a $CF_3$ group, an alkyloxycarbonylmethyl group, an alkylcarbonyloxymethyl group, a hydroxymethyl group, and an alkoxymethyl group are preferred of these groups.

As the cycloalkyl group represented by Rn, the same cycloalkyl groups as represented by Ra can be exemplified.

As the aryl group represented by Rn, the same groups as AR can be exemplified.

As the alkyl group, cycloalkyl group and aryl group represented by A in formulae (I) and (II), the same groups as the alkyl group, cycloalkyl group and aryl group represented by Rn are exemplified.

As the halogen atom represented by A, a fluorine atom, a chlorine atom, a bromine atom and an iodine atom are exemplified, and a fluorine atom is preferred.

The alkoxyl group represented by A may have a substituent, e.g., an alkoxyl group having from 1 to 8 carbon atoms, e.g., a methoxy group, an ethoxy group, a propoxy group, a butoxy group, a pentyloxy group, a hexyloxy group and a cyclohexyloxy group are exemplified.

As the alkyl group contained in the alkyloxycarbonyl group and an alkylcarbonyloxy group represented by A, the same alkyl group as represented by Rn are exemplified.

The acyl group, and the acyl group in the acyloxy group represented by A may have a substituent, for example, an acyl group having from 2 to 8 carbon atoms, specifically a formyl group, an acetyl group, a propanoyl group, a butanoyl group, a pivaloyl group, and a benzoyl group can be preferably exemplified.

As the aralkyl group represented by A, an aralkyl group having from 7 to 12 carbon atoms is preferred, e.g., a benzyl group, a phenethyl group, and a naphthyl-methyl group are exemplified.

A preferably has 16 or less carbon atoms, and more preferably represents a hydrogen atom or a methyl group.

The specific examples of the repeating units represented by formula (I) are shown below, but the invention is not restricted thereto.

(I-1)

(I-2)

(I-3)

(I-4) 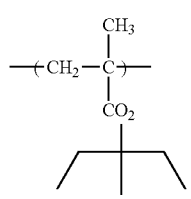
(I-5) 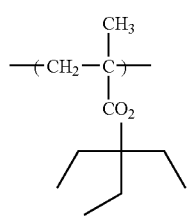
(I-6) 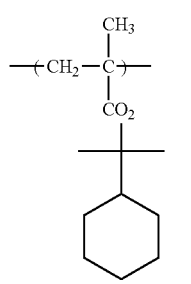
(I-7) 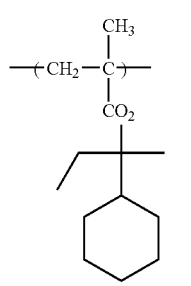
(I-8) 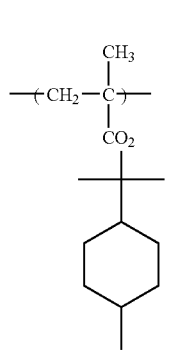
(I-9) 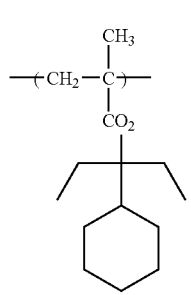
(I-10) 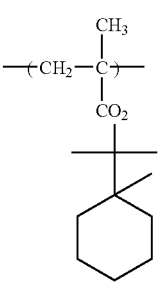
(I-11) 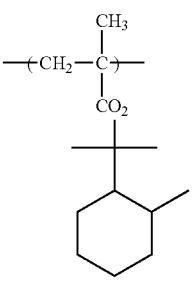
(I-12) 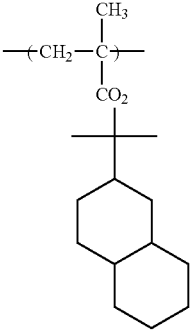
(I-13) 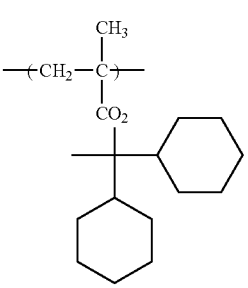
(I-14) 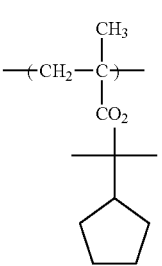

(I-15) 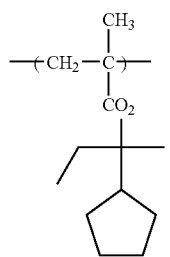
(I-16) 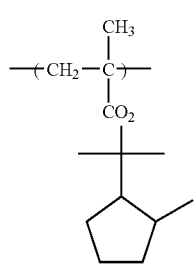
(I-17) 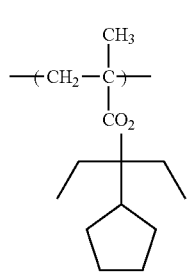
(I-18) 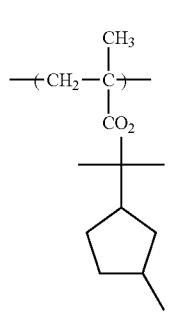
(I-19) 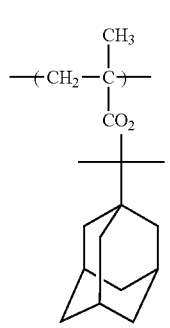
(I-20) 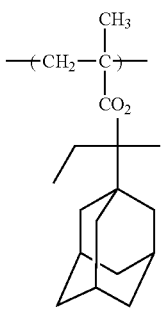
(I-21) 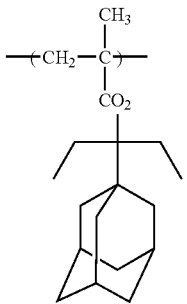
(I-22) 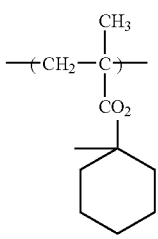
(I-23) 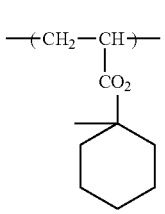
(I-24) 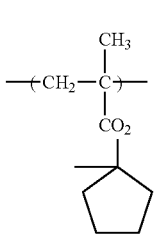
(I-25) 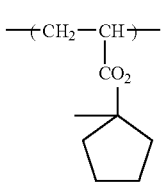

(I-26) 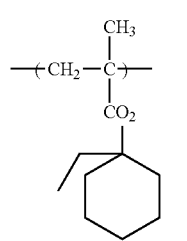
(I-27) 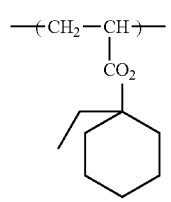
(I-28) 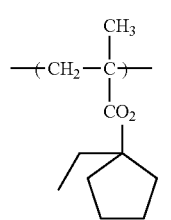
(I-29) 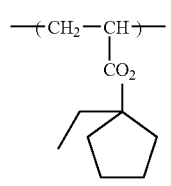
(I-30) 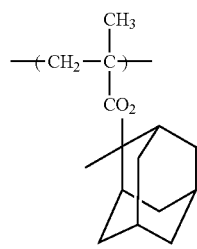
(I-31) 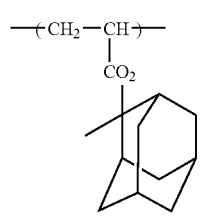
(I-32) 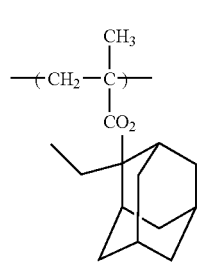
(I-33) 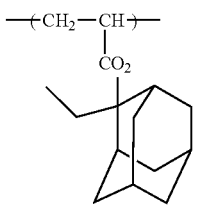
(I-34) 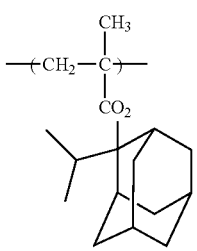
(I-35) 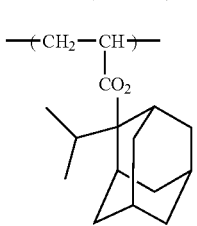
(I-36) 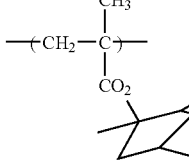
(I-37) 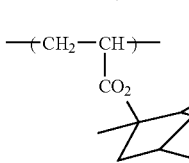
(I-38) 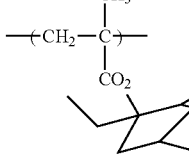
(I-39) 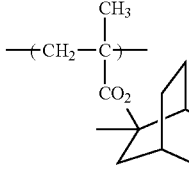
(I-40) 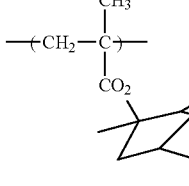

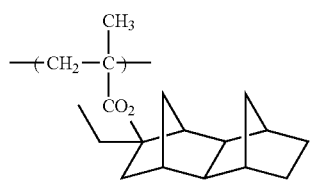 (I-41)
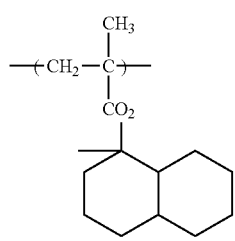 (I-42)
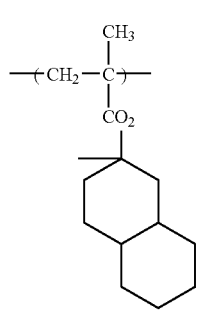 (I-43)
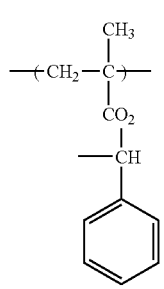 (I-44)
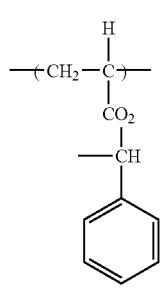 (I-45)
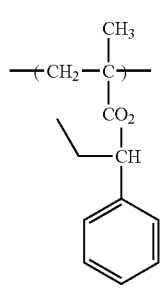 (I-46)
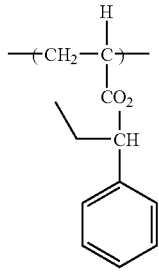 (I-47)
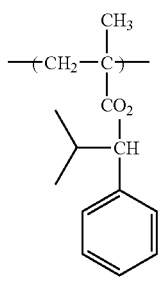 (I-48)
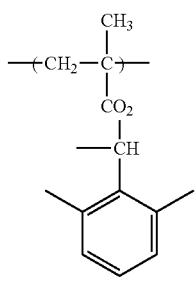 (I-49)
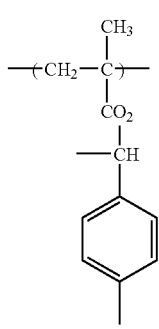 (I-50)
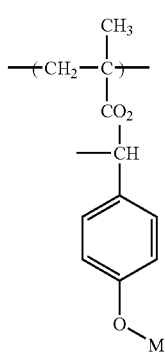 (I-51)

(I-52) 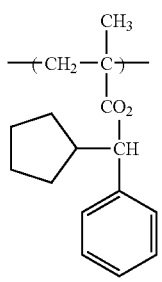

(I-53) 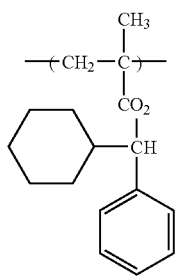

(I-54) 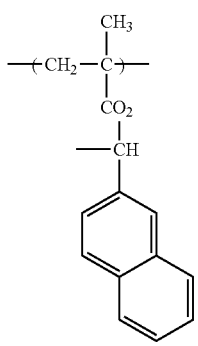

(I-55) 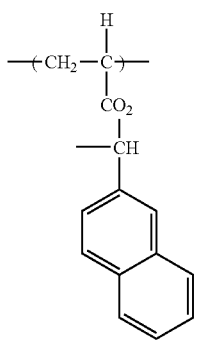

(I-56) 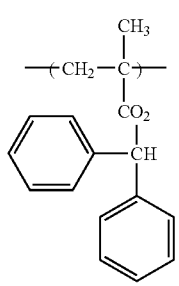

(I-57) 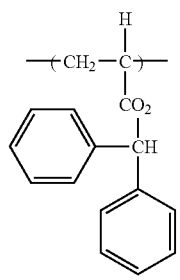

In formula (II), Rb represents an alkylene group, a cycloalkylene group, or a group combining these groups. The alkylene group, cycloalkylene group, or group combining these groups may have a substituent, and the number of carbon atoms of Rb is preferably 18 or less, and more preferably 6 or less, including the substituent. As the substituents, an alkoxyl group, a halogen atom, a hydroxyl group, a carboxyl group, and an alkoxycarbonyl group are exemplified.

As the alkylene group represented by Rb, alkylene groups corresponding to the alkyl groups represented by Rn are exemplified, which may be either straight chain or branched, and, e.g., a methylene group, an ethylene group, a straight chain or branched propylene group, a straight chain or branched butylene group, a straight chain or branched pentylene group, and a straight chain or branched hexylene group are exemplified.

As the cycloalkylene group represented by Rb, cycloalkylene groups corresponding to the cycloalkyl groups represented by Ra are exemplified, which may be either monocyclic or polycyclic, and specifically divalent groups including monocyclic, bicyclic, tricyclic and tetracyclic structures having 5 or more carbon atoms can be exemplified. The examples of the substituents include an alkoxyl group, a halogen atom, a hydroxyl group, a carboxyl group, and an alkoxycarbonyl group can be exemplified.

m represents 0 or 1, and preferably 0.

Y represents a heterocyclic group.

The bonding part with Rb may be the hetero atom of the heterocyclic group represented by Y or may be a carbon atom. The hetero group of the heterocyclic group may be nitrogen, sulfur or oxygen. The hetero group on one and the same ring may comprise a plurality or may comprise different kinds. The hetero group is preferably oxygen or nitrogen, and more preferably nitrogen.

The heterocyclic group may be an aliphatic heterocyclic group or an aromatic heterocyclic group, and more preferably an aromatic heterocyclic group.

The heterocyclic group is preferably any of 3- to 8-membered rings, and more preferably a 5- or 6-membered ring.

The heterocyclic group may be monocyclic or polycyclic, and more preferably polycyclic. When the heterocyclic group is a monocyclic group, it is preferred to have an aryl group as the substituent.

To these heterocyclic groups may further be bonded a substituent such as an alkyl group, a cycloalkyl group, an aryl group, an aralkyl group, an alkoxyl group, a halogen atom, a carboxyl group, an alkoxycarbonyl group, a hydroxyl group, a mercapto group, a cyano group or a nitro group.

As the aliphatic heterocyclic ring, specifically a piperidyl group, a piperazinyl group, a morpholinyl group, a quinuclidinyl group, a pyrrolidinyl group, an azetidyl group, an oxetanyl group, an aziridyl group, a tetrahydrofuranyl group, and a tetrahydrothiophenyl group are exemplified, and preferably a piperidyl group, a pyrrolidinyl group, a tetrahydrofuranyl group, and a tetrahydrothiophenyl group are exemplified, but the aliphatic heterocyclic ring is not restricted to these groups.

The examples of the aliphatic heterocyclic rings are shown below.

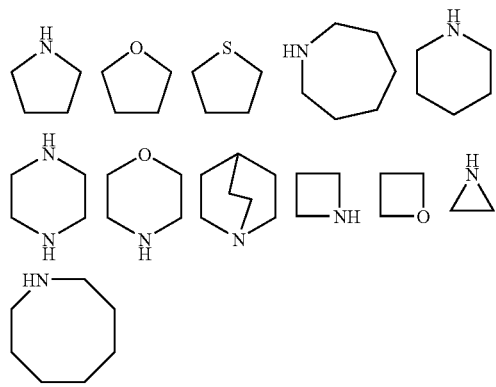

As the aromatic heterocyclic rings, specifically a pyridyl group, a pyrazinyl group, a pyrimidinyl group, a quinolyl group, isoquinolyl group, a naphthyridinyl group, a quinoxalinyl group, a quinazolinyl group, a purinyl group, an acridinyl group, a phenothiazinyl group, a pyrrolyl group, an imidazolidinyl group, an imidazolinyl group, an imidazolyl group, a pyrazolyl group, an indolinyl group, an indolyl group, an isoindolinyl group, an isoindolyl group, a carbazolyl group, an oxazolyl group, a thiazolyl group, a furanyl group, a thiophenyl group, an isooxazolyl group, a pyridazinyl group, a triazinyl group, a coumarinyl group, a chromonyl group, a benz-imidazolyl group, a benzofuranyl group, a dibenzofuranyl group, a phenoxazinyl group, a benzothiophenyl group, a dibenzothiophenyl group, a phthalimido group, and a naphthalimido group can be exemplified, but the invention is not restricted thereto.

The examples of the aromatic heterocyclic rings are shown below.

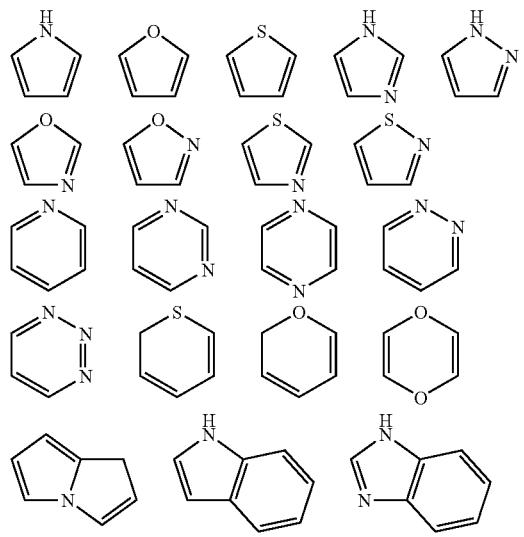
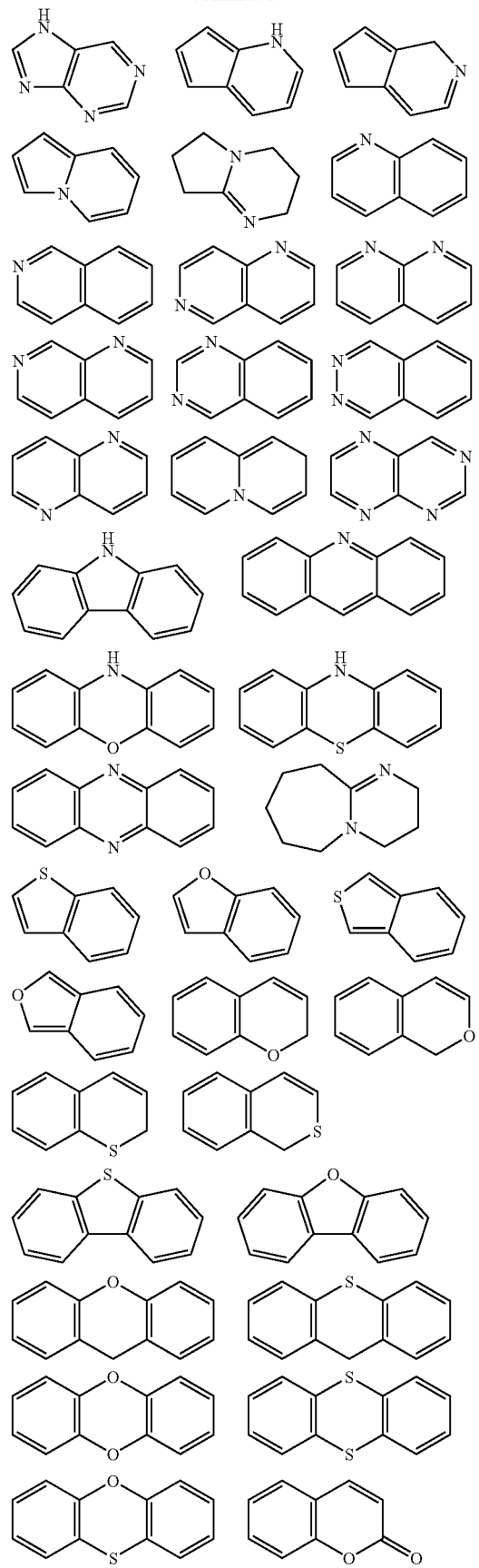

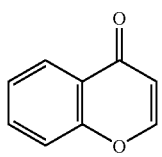 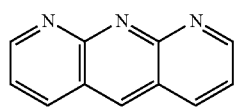
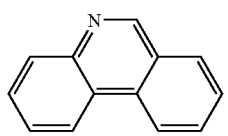 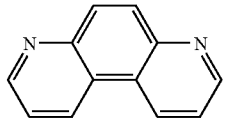
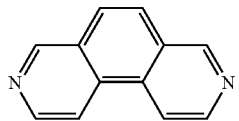 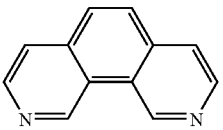
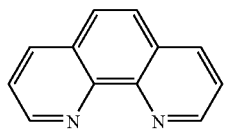 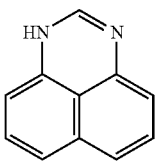
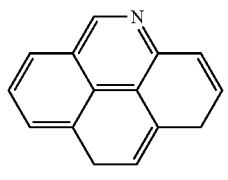 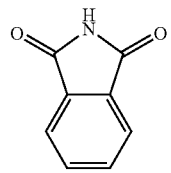
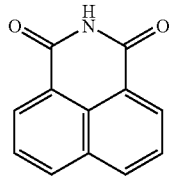 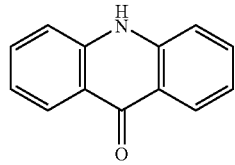

Monomers corresponding to the repeating unit represented by formula (II) can be synthesized according to the method of olefinization from monomers having an aldehyde group or a ketone group as the substituent, as described, e.g., in Synthetic Communication, 22 (4), 513-518 (1992).

The specific examples of the repeating units represented by formula (II) are shown below, but the invention is not restricted thereto.

II-1

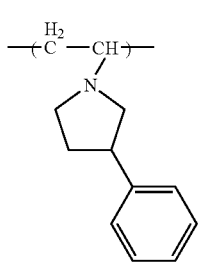

II-2

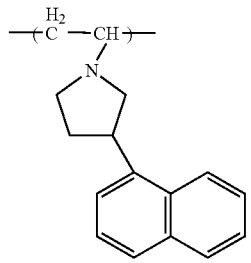

II-3

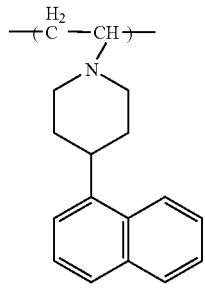

II-4

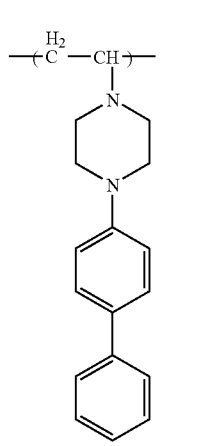

II-5

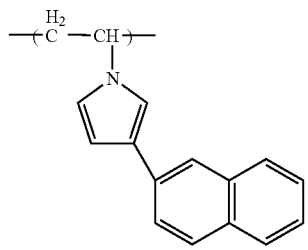

II-6

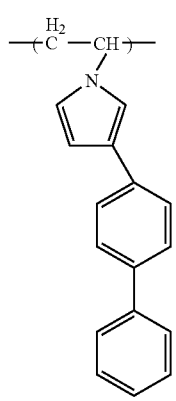

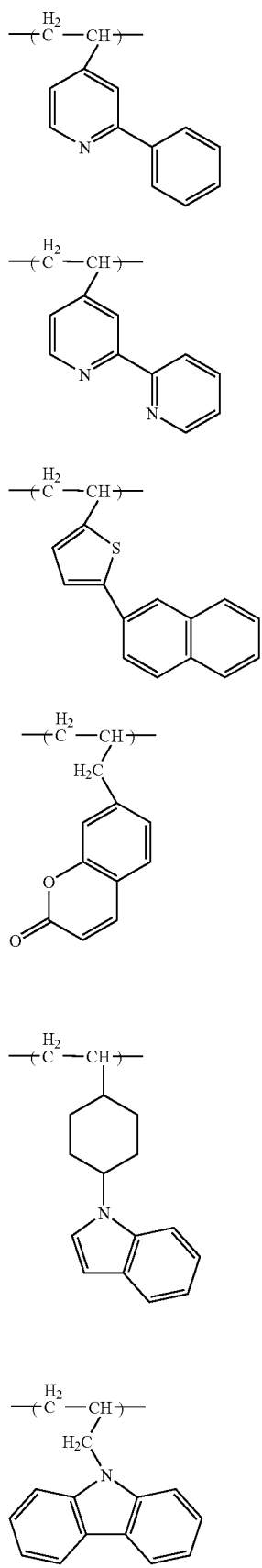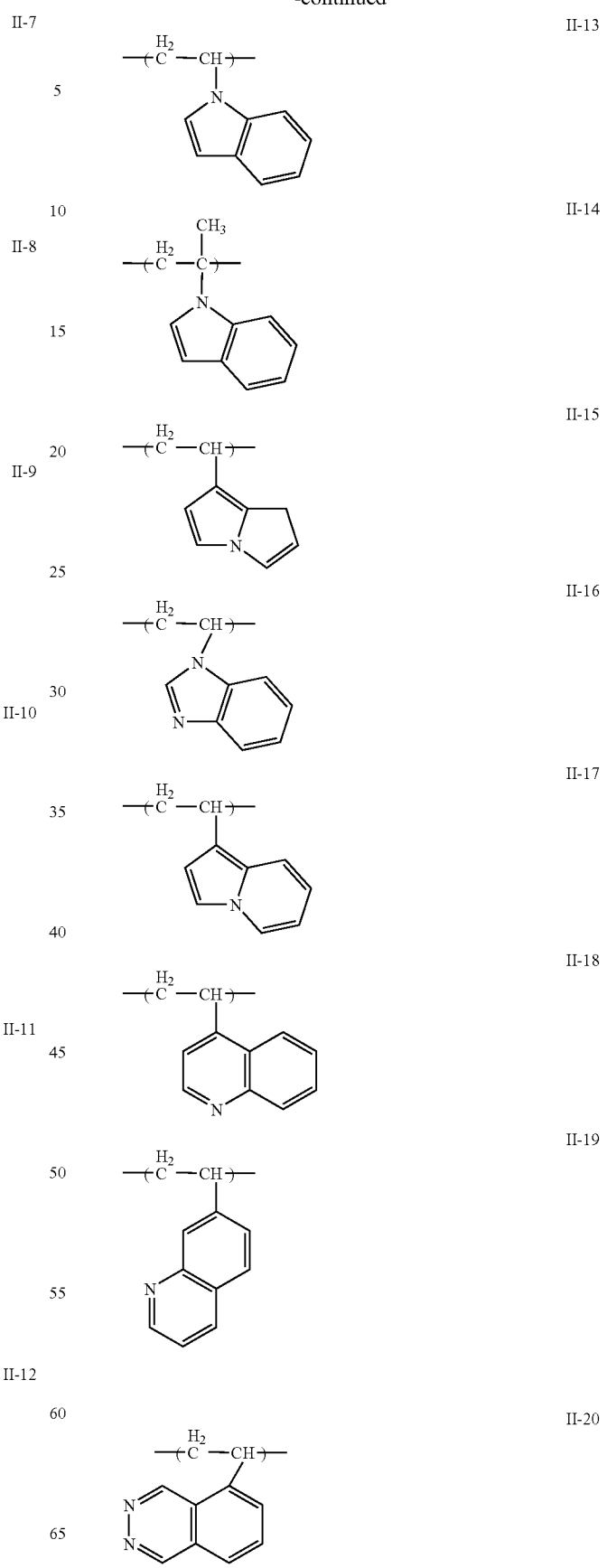

II-21 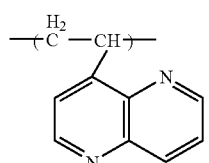
II-22 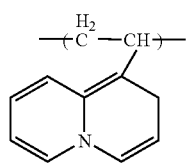
II-23 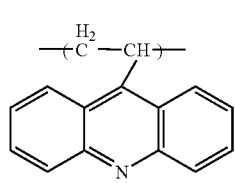
II-24 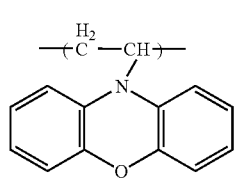
II-25 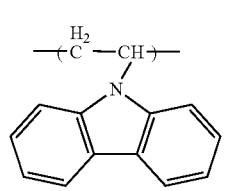
II-26 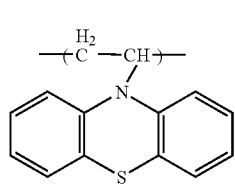
II-27 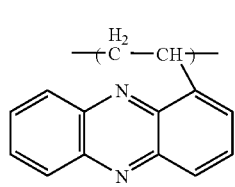
II-28 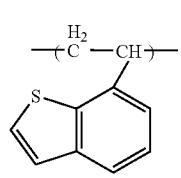
II-29 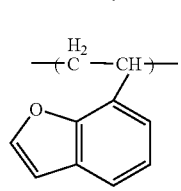
II-30 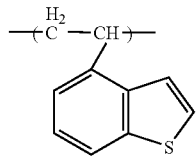
II-31 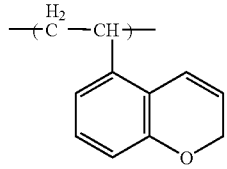
II-32 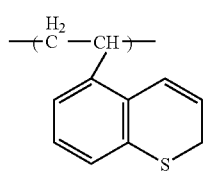
II-33 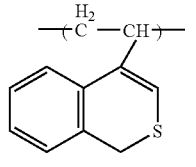
II-34 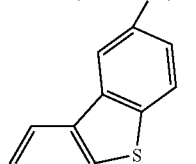
II-35 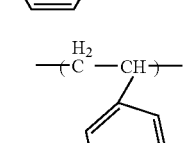
II-36 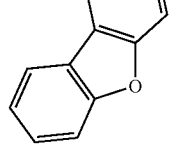
II-37 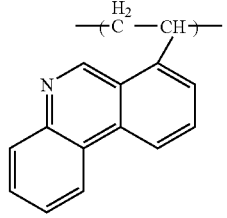

II-38 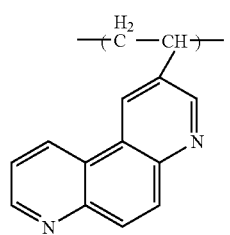
II-39 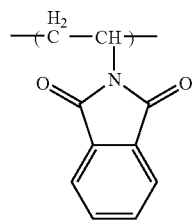
II-40 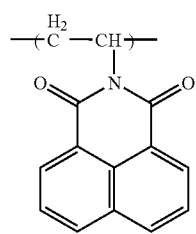
II-41 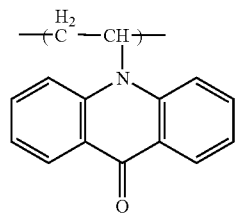
II-42 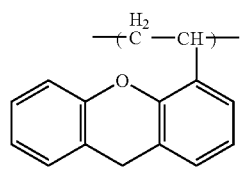
II-43 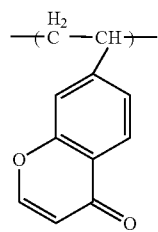
II-44 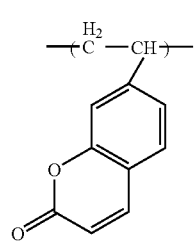
II-45 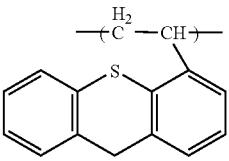
II-46 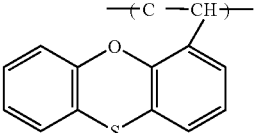
II-47 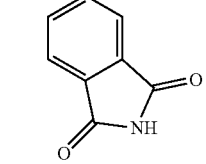
II-48 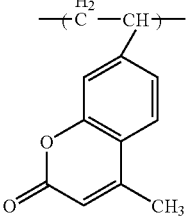
II-49 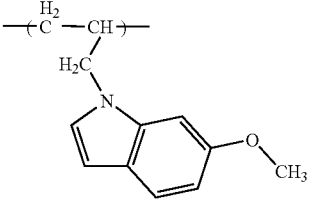
II-50 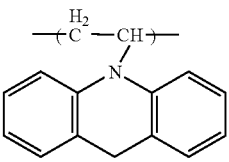
II-51 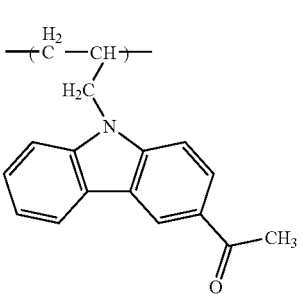

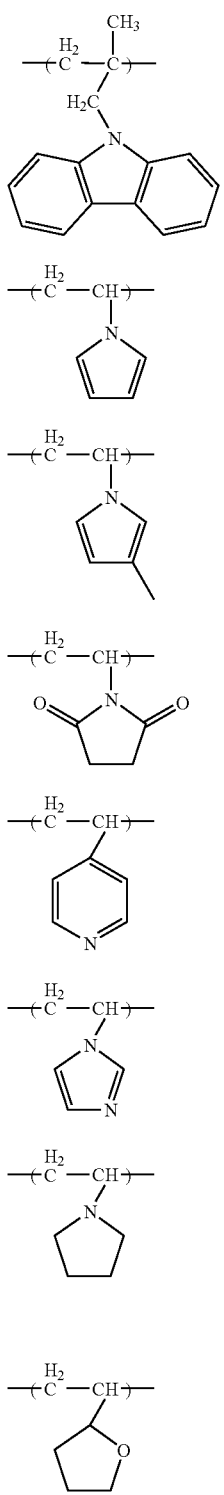

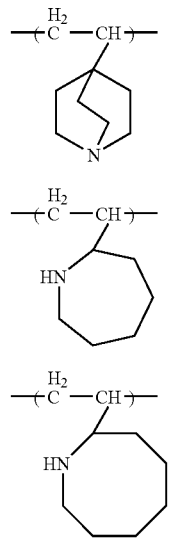

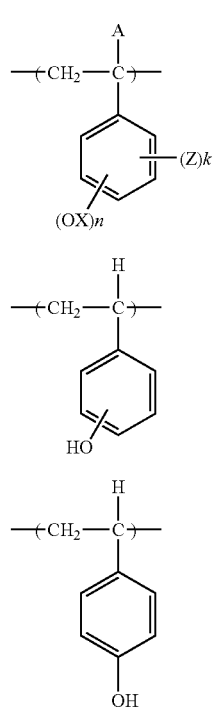

It is preferred for resin (A) to have at least one repeating unit represented by the following formula (III), more preferably the following formula (IIIa), and especially preferably the following formula (IIIb).

In formula (III), A is the same with A in formula (I).

Z represents a substituent.

As the substituents of Z, e.g., a halogen atom, an alkyl group, an alicyclic group, an aryl group, an alkoxyl group, an acyl group, —OC(=O)Rf, —OC(=O)ORf, —C(=O)ORf, —C(=O)N(Rg)Rf, —N(Rg)C(=O)Rf, —N(Rg)C(=O)ORf, —N(Rg)SO$_2$Rf, —SRf, —SO$_2$Rf, —SO$_3$Rf or —SO$_2$N(Rg)Rf can be exemplified. In the formulae, each of Rf and Rg independently represents a hydrogen atom, an alkyl group, a hydroxyl group, an alkoxyl group, a halogen atom, a cyano group, a nitro group, an acyl group, an acyloxy group, a cycloalkyl group, an aryl group, a carboxyl group, an alkyloxy-carbonyl group, an alkylcarbonyloxy group, or an aralkyl group. As the alkyl group, alkoxyl group, halogen atom, acyl group, acyloxy group, cycloalkyl group, aryl group, alkyloxycarbonyl group, alkylcarbonyloxy group, and aralkyl group represented by Rf and Rg, the same groups as these groups represented by A in formula (I) can be exemplified.

As the alkyl group represented by Z, the same alkyl groups as represented by Ra in formula (I) can be exemplified.

As the alicyclic group represented by Z, the same alicyclic groups as represented by Ra in formula (I) can be exemplified.

As the alkoxyl group represented by Z, the same alkoxyl groups as represented by A in formula (I) can be exemplified.

As the aryl group represented by Z, the same aryl groups as represented by Rn in formula (I) can be exemplified.

As the acyl group represented by Z, the same acyl groups as represented by A in formula (I) can be exemplified.

As the alkyl group, alkoxyl group, halogen atom, acyl group, acyloxy group, cycloalkyl group, aryl group, alkyloxycarbonyloxy group, alkylcarbonyloxy group, and aralkyl group represented by Rf and Rg, the same groups as these groups represented by A in formula (I) can be exemplified.

X represents a hydrogen atom or a group containing a group decomposing by the action of an acid.

The group containing a group capable of decomposing by the action of an acid may be a group capable of generating a hydroxyl group in the repeating unit represented by formula (III) as a result of separation of X, i.e., an acid-decomposable group itself, or may be a group containing an acid-decomposable group, that is, a group capable of decomposing by the action of an acid to generate an alkali-soluble group such as a hydroxyl group or a carboxyl group in the residue bonding to the repeating unit.

As the group containing a group capable of decomposing by the action of an acid, e.g., a tertiary alkyl group such as a t-butyl group and a t-amyl group, a t-butoxy-carbonyl group, a t-butoxycarbonylmethyl group, and an acetal group represented by —C($L_1$)($L_2$)—O—$Z^2$ are exemplified.

$L_1$ and $L_2$, which may be the same or different, each represents an atom or a group selected from a hydrogen atom, an alkyl group, a cycloalkyl group, and an aralkyl group.

$Z^2$ represents an alkyl group, a cycloalkyl group, or an aralkyl group.

$Z^2$ and $L_1$ may be bonded to each other to form a 5- or 6-membered ring.

As the aralkyl group represented by $L_1$, $L_2$ and $Z^2$, aralkyl groups having from 7 to 15 carbon atoms, e.g., a benzyl group and a phenethyl group can be exemplified. These groups may have a substituent.

As preferred substituents of the aralkyl group, an alkoxyl group, a hydroxyl group, a halogen atom, a nitro group, an acyl group, an acylamino group, a sulfonylamino group, an alkylthio group, an arylthio group, and an aralkylthio group are exemplified. As the aralkyl group having a substituent, e.g., an alkoxybenzyl group, a hydroxybenzyl group and a phenylthiophenethyl group can be exemplified.

The range of the number of substituents of the aralkyl group represented by $L_1$, $L_2$ and $Z^2$ is preferably 12 or less.

As the 5- or 6-membered ring formed by $Z^2$ and $L_1$ by bonding to each other, a tetrahydropyran ring and a tetrahydrofuran ring are exemplified.

In the invention, $Z^2$ preferably represents a straight chain or branched alkyl group, by which the advantage of the invention becomes more conspicuous.

In formula (III), n represents an integer of from 1 to 5, and preferably 1. k represents an integer of from 0 to 4, and they satisfy $1 \leqq n+k \leqq 5$. When k is from 2 to 4, each Z may be the same with or different from every other Z.

The monomer corresponding to the repeating unit represented by formula (III) can be synthesized by acetalization of a hydroxy-substituted styrene monomer and a vinyl ether compound in a solvent, e.g., THF or methylene chloride, in the presence of an acid catalyst, e.g., p-toluenesulfonic acid or pyridine p-toluenesulfonate, or by t-Boc protection by using t-butyl dicarbonate in the presence of a basic catalyst, e.g., triethylamine, pyridine or DBU. Incidentally, commercially available products may be used.

The specific examples of the repeating units represented by formula (III) are shown below, but the invention is not restricted thereto.

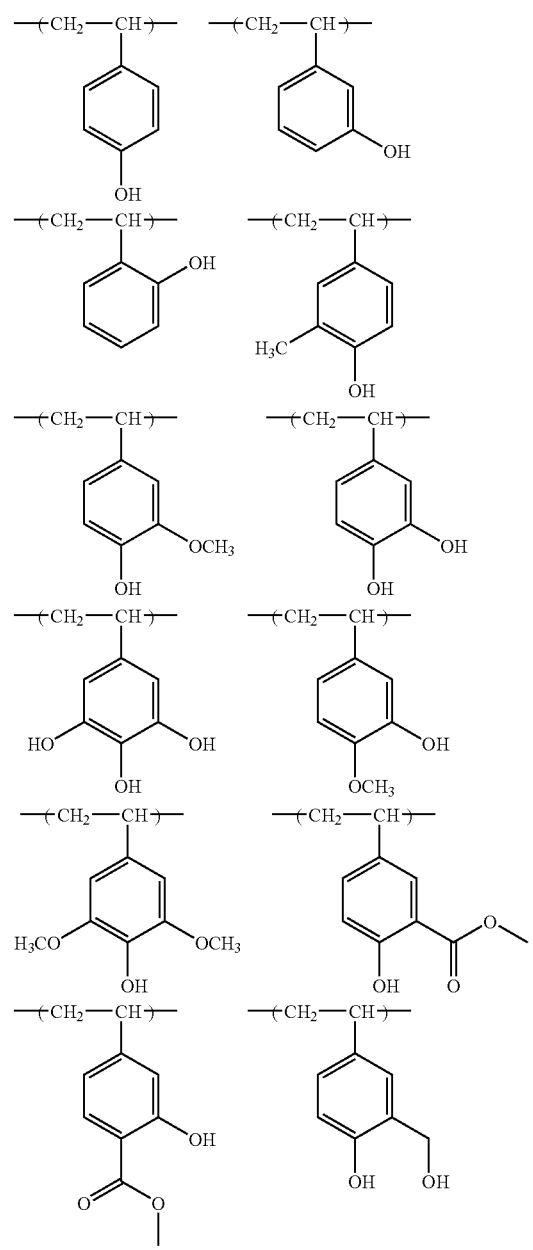

-continued

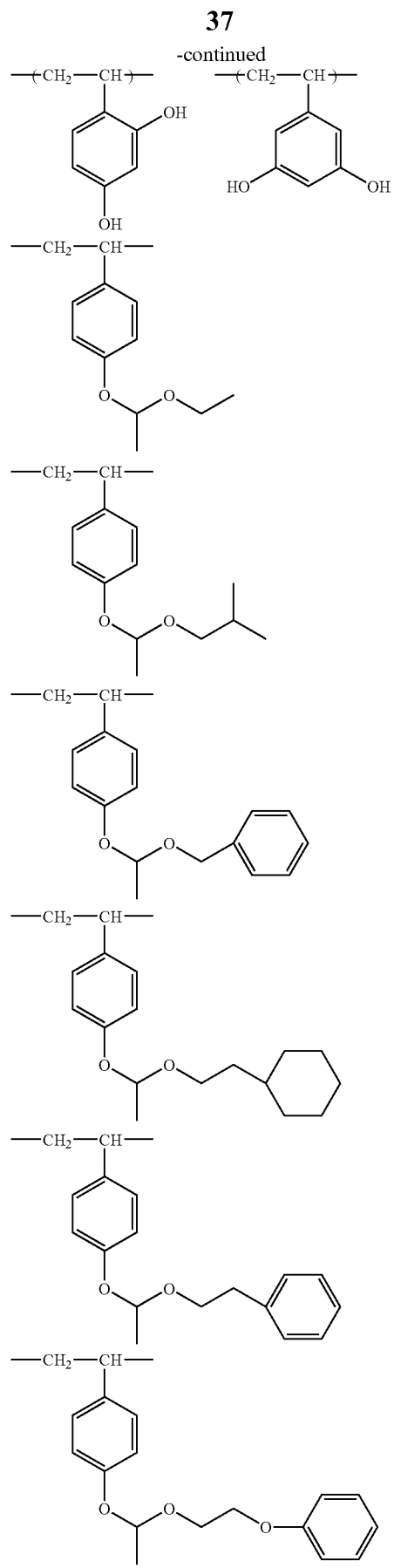
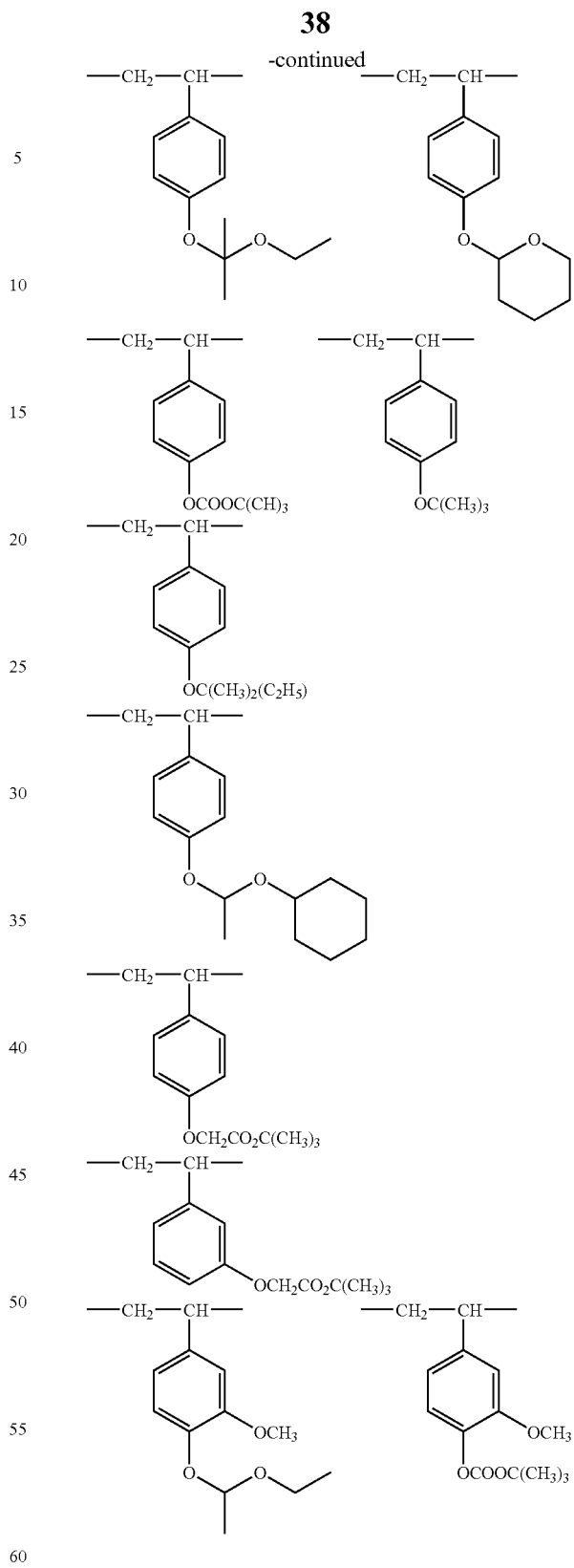

For maintaining a good developing property in an alkali developing solution, resin (A) may be copolymerized with appropriate other polymerizable monomer so that an alkali soluble group, e.g., a phenolic hydroxyl group or a carboxyl group can be introduced, or for the improvement of film quality, resin (A) may be copolymerized with other hydrophobic monomer such as alkyl acrylate or alkyl methacrylate.

For the adjustment of hydrophilicity/hydrophobicity of resin (A), resin (A) may be copolymerized with methacrylate or acrylate containing a hydrophilic group such as alkyleneoxy or lactone.

In addition, resin (A) may be copolymerized with styrene (which may be substituted with an alkyl group, a halogen atom, an alkylthio group, a sulfonyl group, or an ester group), vinyl naphthalene (which may be substituted with an alkyl group, a halogen atom, an alkylthio group, a sulfonyl group, or an ester group), vinyl anthracene (which may be substituted with an alkyl group, a halogen atom, an alkylthio group, a sulfonyl group, or an ester group), acrylamides, methacrylamides, allyl compounds, vinyl ethers, or vinyl esters.

The content of the repeating unit represented by formula (I) in resin (A) is preferably from 2 to 75 mol % in all the repeating units constituting the resin, more preferably from 3 to 50 mol %, and especially preferably from 10 to 40 mol %.

The content of the repeating unit represented by formula (II) in resin (A) is preferably from 1 to 75 mol % in all the repeating units constituting the resin, more preferably from 1 to 50 mol %, and especially preferably from 1 to 35 mol %.

In resin (A), the content of the repeating unit represented by formula (III) or a repeating unit having an alkali-soluble group such as a hydroxyl group, a carboxyl group, or a sulfonic acid group is preferably from 1 to 95 mol % in all the repeating units constituting the resin, more preferably from 3 to 90 mol %, and especially preferably from 5 to 85 mol %.

The weight average molecular weight (Mw) of resin (A) is preferably in the range of from 1,000 to 200,000. In the light of the dissolution speed of the resin itself in alkali and sensitivity, the weight average molecular weight is preferably 200,000 or less. Polydispersity (Mw/Mn) of resin (A) is preferably from 1.0 to 3.0, more preferably from 1.0 to 2.5, and especially preferably from 1.0 to 2.0.

The weight average molecular weight (Mw) of resin (A) is preferably in the range of from 1,000 to 200,000, more preferably in the range of from 1,000 to 100,000, especially preferably in the range of from 1,000 to 50,000, and most preferably in the range of from 1,000 to 30,000.

Here, the weight average molecular weight is defined as the polystyrene equivalent by gel permeation chromatography.

Resin (A) having polydispersity of from 1.3 to 2.0 can be synthesized by radical polymerization by using an azo series polymerization initiator. Resin (A) having more preferred polydispersity of from 1.0 to 1.5 can be synthesized by living radical polymerization.

Resin (A) may be used in combination of two or more kinds, or may be used in combination with other resins capable of decomposing by the action of an acid to increase solubility in an alkali developing solution.

The addition amount of resin (A) is generally from 10 to 96 mass % in a total amount based on all the solids content of the resist composition, preferably from 15 to 96 mass %, and especially preferably from 20 to 95 mass %.

The content of the group capable of decomposing by the action of an acid is expressed by B/(B+S) with the number of the groups capable of decomposing by an acid in the resin being (B) and the number of the alkali-soluble groups not protected with the group capable of separating by the action of an acid being (S). The content is preferably from 0.01 to 0.7, and more preferably from 0.05 to 0.50.

[2] (B) A Compound Capable of Generating an Acid Upon Irradiation with Actinic Ray or Radiation:

The resist composition in the invention contains a compound capable of generating an acid upon irradiation with actinic ray or radiation (hereinafter also referred to as "an acid generator").

As such acid generators, a photo-initiator for cationic photopolymerization, a photo-initiator for radical photopolymerization, photodecoloring agent for dyestuffs, a photodiscoloring agent, well-known compounds capable of generating an acid upon irradiation with actinic ray or radiation that are used in micro-resists and the like, and the mixtures of these compounds can be optionally selected and used.

For example, as the compounds capable of generating an acid upon irradiation with actinic ray or radiation, diazonium salt, phosphonium salt, sulfonium salt, iodonium salt, imidosulfonate, oximesulfonate, diazodisulfone, disulfone, and o-nitrobenzylsulfonate can be exemplified.

Further, compounds obtained by introducing a group or a compound capable of generating an acid upon irradiation with actinic ray or radiation to the main chain or side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029 can be used.

The compounds generating an acid by the action of light as disclosed in U.S. Pat. No. 3,779,778 and EP 126,712 can also be used.

As preferred compounds among the compounds capable of decomposing upon irradiation with actinic ray or radiation to generate an acid, compounds represented by any of the following formulae (ZI), (ZII) and (ZIII) can be exemplified.

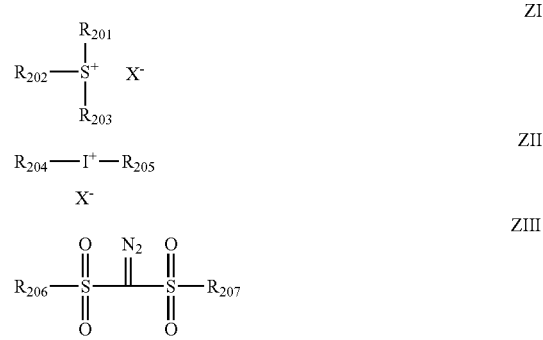

In formula (ZI), each of $R_{201}$, $R_{202}$ and $R_{203}$ independently represents an organic group.

$X^-$ represents a non-nucleophilic anion, preferably a sulfonate anion, a carboxylate anion, a bis(alkylsulfonyl)amide anion, a tris(alkylsulfonyl)methide anion, $BF_4^-$, $PF_6^-$, and $SbF_6^-$ are exemplified, and preferably an organic anion containing a carbon atom.

As the preferred organic anions, organic anions represented by any of the following formulae (AN1) to (AN4) are exemplified.

-continued

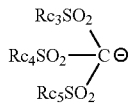
(AN4)

In formulae (AN1) and (AN2), Rc, represents an organic group.

As the organic group represented by $Rc_1$, organic groups having from 1 to 30 carbon atoms are exemplified, and preferably an alkyl group and an aryl group each of which may be substituted, and groups obtained by combining two or more of these groups with a linking group such as a single bond, —O—, —$CO_2$—, —S—, —$SO_3$—, or —$SO_2N(Rd_1)$— can be exemplified.

$Rd_1$ represents a hydrogen atom or an alkyl group and may form a cyclic structure with a bonding alkyl group or aryl group.

The organic group represented by Rc, is more preferably an alkyl group substituted with a fluorine atom or a fluoroalkyl group on the 1-position, and a phenyl group substituted with a fluorine atom or a fluoroalkyl group. The acidity of an acid generated by light irradiation increases and sensitivity is improved by the presence of a fluorine atom or a fluoroalkyl group. When $Rc_1$ has 5 or more carbon atoms, it is preferred that all the hydrogen atoms are not substituted with fluorine atoms in at least one carbon atom and a part of the hydrogen atoms remains, and it is more preferred that the number of hydrogen atoms is more numerous than the number of fluorine atoms. Harm to ecology reduces by being free from perfluoroalkyl groups having 5 or more carbon atoms.

$Rc_1$ is most preferably a group represented by the following formula.

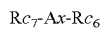

In the above formula, $Rc_6$ represents a perfluoroalkylene group preferably having 4 or less carbon atoms, more preferably from 2 to 4 carbon atoms, and still more preferably 2 or 3 carbon atoms, or a phenylene group substituted with 1 to 4 fluorine atoms and/or from 1 to 3 fluoroalkyl groups.

Ax represents a linking group (preferably a single bond, —O—, —$CO_2$—, —S—, —$SO_3$—, or —$SO_2N(Rd_1)$-). $Rd_1$ represents a hydrogen atom or an alkyl group, and may be bonded to $Rc_7$ to form a cyclic structure.

$Rc_7$ represents a hydrogen atom, a fluorine atom, a straight chain or branched alkyl group, a monocyclic or polycyclic cycloalkyl group, or an aryl group, each of which groups may be substituted. It is preferred that the alkyl group, cycloalkyl group, and aryl group that may be substituted should not contain a fluorine atom as the substituent.

In formula (AN3) and (AN4), each of $Rc_3$, $Rc_4$ and $Rc_5$ represents an organic group.

As the preferred organic groups represented by $Rc_3$, $Rc_4$ and $Rc_5$ in formulae (AN3) and (AN4), the same groups as the preferred organic groups represented by Rc, can be exemplified.

$Rc_3$ and $Rc_4$ may be bonded to each other to form a ring.

As the groups formed by $Rc_3$ and $Rc_4$ by bonding, an alkylene group and an arylene group are exemplified, and preferably a perfluoroalkylene group having from 2 to 4 carbon atoms is exemplified. By forming a ring by bonding $Rc_3$ and $Rc_4$, the acidity of an acid generated by light irradiation increases and sensitivity is improved, so that preferred.

The number of carbon atoms of the organic group represented by $R_{201}$, $R_{202}$ and $R_{203}$ is generally from 1 to 30, and preferably from 1 to 20.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring.

As the group formed by bonding two of $R_{201}$, $R_{202}$ and $R_{203}$, an alkylene group (e.g., a butylene group and a pentylene group) can be exemplified.

As the examples of the organic groups represented by $R_{201}$, $R_{202}$ and $R_{203}$, the corresponding groups in the later-described compounds represented by formula (ZI-1), (ZI-2) or (ZI-3) can be exemplified.

The compound represented by formula (ZI) may be a compound having a plurality of structures represented by formula (ZI). For instance, compound (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (ZI-1), (ZI-2) and (ZI-3) can be exemplified as more preferred component (ZI).

Compound (ZI-1) is an arylsulfonium compound that at least one of $R_{201}$ to $R_{203}$ in formula (ZI) represents an aryl group, i.e., a compound having arylsulfonium as a cation.

All of $R_{201}$ to $R_{203}$ of the arylsulfonium compound may be aryl groups, or a part of $R_{201}$ to $R_{203}$ may be an aryl group and the remainder may be an alkyl group or a cycloalkyl group.

As the arylsulfonium compounds, e.g., a triarylsulfonium compound, a diaryl-alkylsulfonium compound, an aryl-dialkylsulfonium compound, a diarylcycloalkyl-sulfonium compound, and an aryldicycloalkylsulfonium compound are exemplified.

As the aryl group of the arylsulfonium compound, an aryl group, e.g., a phenyl group and a naphthyl group, and a heteroaryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group that the arylsulfonium compound may have according to necessity is preferably a straight chain or branched alkyl group having from 1 to 15 carbon atoms, e.g., a methyl group, an ethyl group, a propyl group, an n-butyl group, a sec-butyl group, and a t-butyl group can be exemplified.

The cycloalkyl group that the arylsulfonium compound may have according to necessity is preferably a cycloalkyl group having from 3 to 15 carbon atoms, e.g., a cyclopropyl group, a cyclobutyl group, and a cyclohexyl group can be exemplified.

The aryl group, alkyl group and cycloalkyl group represented by $R_{201}$, $R_{202}$ and $R_{203}$ may each have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and the especially preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When each of $R_{201}$, $R_{202}$ and $R_{203}$ represents an aryl group, it is preferred that the substituent is substituted on the p-position of the aryl group.

Compound (ZI-2) is described below.

Compound (ZI-2) is a compound in the case where each of $R_{201}$, $R_{202}$ and $R_{203}$ in formula (ZI) independently represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

Each of $R_{201}$, $R_{202}$ and $R_{203}$ preferably independently represents an alkyl group, a cycloalkyl group, an allyl group, or a vinyl group, more preferably represents a straight chain, branched or cyclic 2-oxoalkyl group, or an alkoxycarbonylmethyl group, and especially preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 10 carbon atoms, e.g., a methyl group, an ethyl group, a propyl group, a butyl group, and a pentyl group can be exemplified. The alkyl group represented by $R_{201}$, $R_{202}$ and $R_{203}$ is more preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group and a norbornyl group can be exemplified. The cycloalkyl group represented by $R_{201}$, $R_{202}$ and $R_{203}$ is more preferably a cyclic 2-oxoalkyl group.

The 2-oxoalkyl group represented by $R_{201}$, $R_{202}$ and $R_{203}$ may be any of straight chain, branched, and cyclic, and a group having >C=O on the 2-position of the above alkyl group and cycloalkyl group can be exemplified as a preferred group.

As the alkoxyl group in the alkoxycarbonylmethyl group represented by $R_{201}$, $R_{202}$ and $R_{203}$, preferably an alkoxyl group having from 1 to 5 carbon atoms, e.g., a methoxy group, an ethoxy group, a propoxy group, a butoxy group, and a pentoxy group can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3) and has a phenacylsulfonium salt structure.

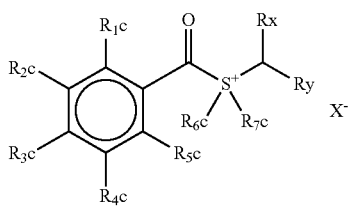

(ZI-3)

In formula (ZI-3), each of $R_{1c}$, $R_{2c}$, $R_{3c}$, $R_{4c}$ and $R_{5c}$ independently represents a hydrogen atom, an alkyl group, a cycloalkyl group, an alkoxy group, or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group, or a vinyl group.

Any two or more of $R_{1c}$ to $R_{7c}$, and $R_x$ and $R_y$ may be bonded to each other to form cyclic structures, respectively, and the cyclic structures may contain an oxygen atom, a sulfur atom, an ester bond, or an amido bond. As the groups formed by any two or more of $R_{1c}$ to $R_{7c}$, and $R_x$ and $R_y$, a butylene group and a pentylene group can be exemplified.

$X^-$ represents a non-nucleophilic anion, and the same non-nucleophilic anions as represented by $X^-$ in formula (ZI) can be exemplified.

The alkyl group represented by $R_{1c}$ to $R_{7c}$ may be either straight chain or branched, e.g., an alkyl group having from 1 to 20 carbon atoms, preferably a straight chain or branched alkyl group having from 1 to 12 carbon atoms, e.g., a methyl group, an ethyl group, a straight chain or branched propyl group, a straight chain or branched butyl group, and a straight chain or branched pentyl group can be exemplified.

The cycloalkyl group represented by $R_{1c}$ to $R_{7c}$ is preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, and cyclic, e.g., an alkoxyl group having from 1 to 10 carbon atoms, preferably a straight chain or branched alkoxyl group having from 1 to 5 carbon atoms, e.g., a methoxy group, an ethoxy group, a straight chain or branched propoxy group, a straight chain or branched butoxy group, and a straight chain or branched pentoxy group, a cyclic alkoxyl group having from 3 to 8 carbon atoms, e.g., a cyclopentyloxy group, and a cyclohexyloxy group can be exemplified.

Preferably any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15, by which the solubility in a solvent is improved and the generation of particles during preservation can be restrained.

As the alkyl group represented by $R_x$ and $R_y$, the same alkyl group as represented by $R_{1c}$ to $R_{5c}$ can be exemplified. The alkyl group represented by $R_x$ and $R_y$ is more preferably a straight chain or branched 2-oxoalkyl group or an alkoxycarbonylmethyl group.

As the straight chain, branched, or cyclic 2-oxoalkyl group, a group having >C=O on the 2-position of the alkyl group or the cycloalkyl group represented by $R_{1c}$ to $R_{7c}$ can be exemplified.

As the alkoxyl group in the alkoxycarbonylmethyl group, the same alkoxyl group as represented by $R_{1c}$ to $R_{5c}$ can be exemplified.

Each of $R_x$ and $R_y$ preferably represents an alkyl group having 4 or more carbon atoms, more preferably 6 or more carbon atoms, and still more preferably an alkyl group having 8 or more carbon atoms.

In formulae (ZII) and (ZIII), each of $R_{204}$, $R_{205}$, $R_{206}$ and $R_{207}$ independently represents an aryl group, an alkyl group or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ may be either straight chain or branched, and preferably a straight chain or branched alkyl group having from 1 to 10 carbon atoms, e.g., a methyl group, an ethyl group, a propyl group, a butyl group, and a pentyl group can be exemplified.

The cycloalkyl group represented by $R_{204}$ to $R_{207}$ is preferably a cycloalkyl group having from 3 to 10 carbon atoms, e.g., a cyclopentyl group, a cyclohexyl group, and a norbornyl group can be exemplified.

As the examples of the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, and a phenylthio group can be exemplified.

$X^-$ represents a non-nucleophilic anion, and the same non-nucleophilic anion represented by $X^-$ in formula (ZI) can be exemplified.

Of the compounds capable of generating an acid upon irradiation with actinic ray or radiation, compounds represented by the following formula (ZIV), (ZV) or (ZVI) can further be exemplified as preferred compounds.

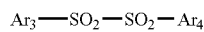
(ZIV)

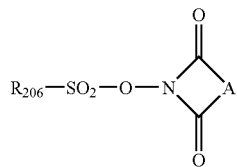
(ZV)

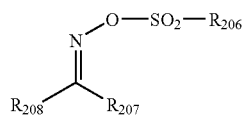
(ZVI)

In formulae (ZIV) to (ZVI), each of $Ar_3$ and $Ar_4$ independently represents an aryl group.

$R_{206}$ represents an alkyl group, a cycloalkyl group, or an aryl group.

Each of $R_{207}$ and $R_{208}$ represents an alkyl group, a cycloalkyl group, an aryl group, or an electron attractive group. $R_{207}$ preferably represents an aryl group. $R_{208}$ preferably represents an electron attractive group, and more preferably a cyano group or a fluoroalkyl group.

A represents an alkylene group, an alkenylene group, or an arylene group. These groups may each have a substituent, and as the examples of the substituents, the same substituents as $R_{204}$ to $R_{207}$ may have can be exemplified.

Of the compounds capable of generating an acid upon irradiation with actinic ray or radiation, the compounds represented by formula (ZI), (ZII) or (ZIII) are more preferred, and the compounds represented by formula (ZI-1), (ZIII) and (ZVI) are still more preferred.

Of the compounds capable of decomposing upon irradiation with actinic ray or radiation to generate an acid, especially preferred examples are shown below.

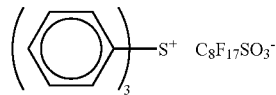
(z1)

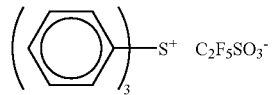
(z2)

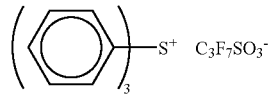
(z3)

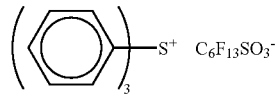
(z4)

(z5)

(z6)

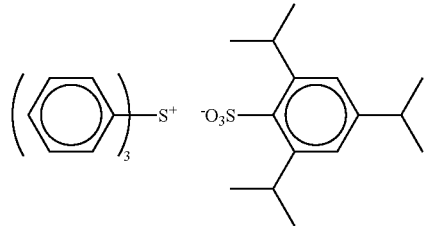
(z7)

(z8)

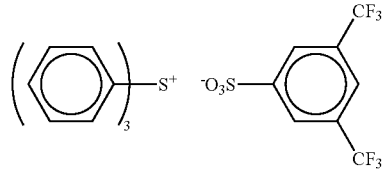
(z9)

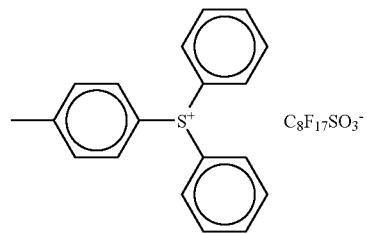
(z10)

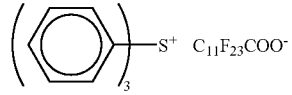
(z11)

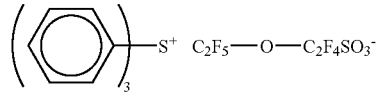
(z12)

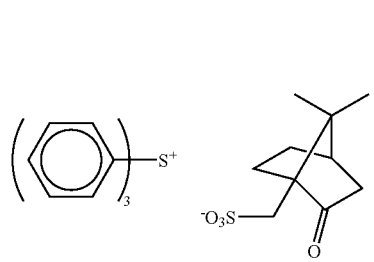

-continued
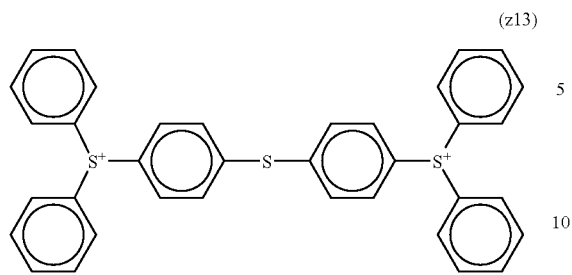
(z13)
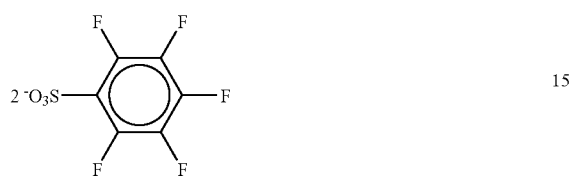
(z14)
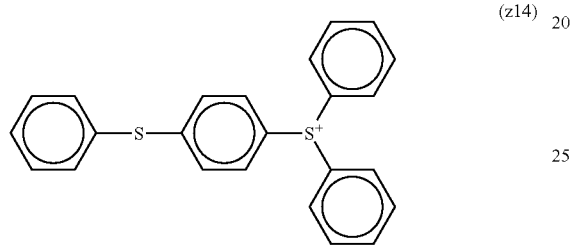
(z15)
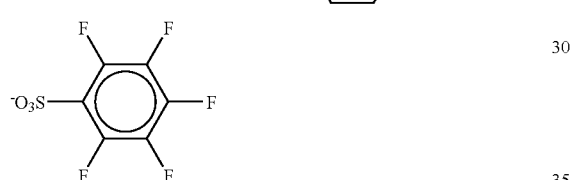
(z16)
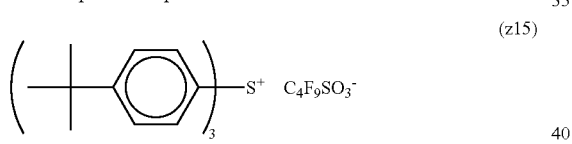
(z17)
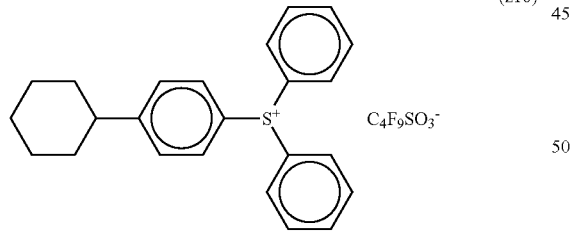
-continued
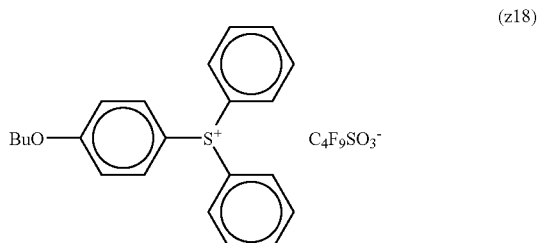
(z18)
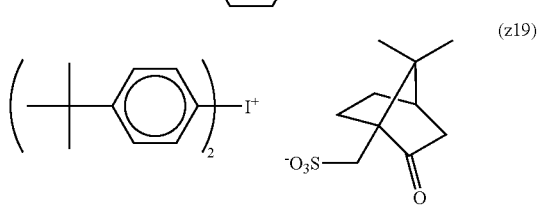
(z19)
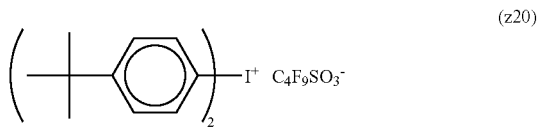
(z20)
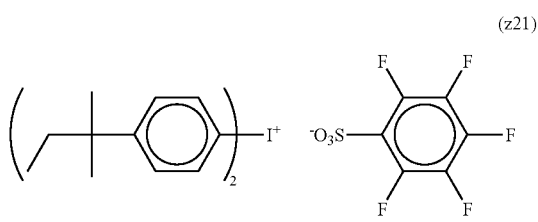
(z21)
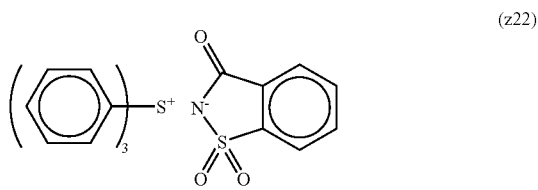
(z22)
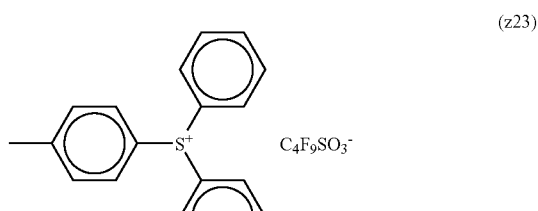
(z23)
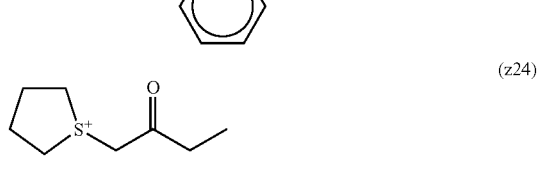
(z24)
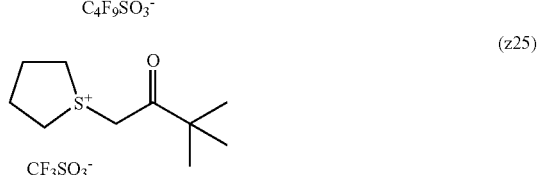
(z25)
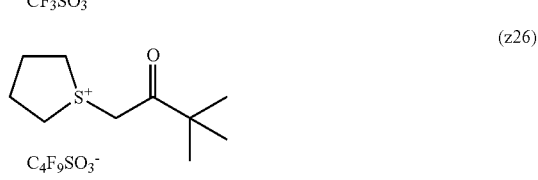
(z26)

(z27) 
(z28) 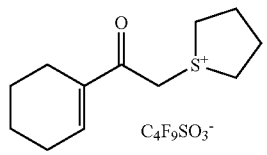
(z29) 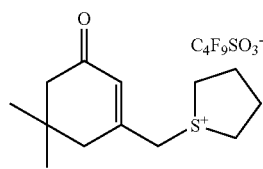
(z30) 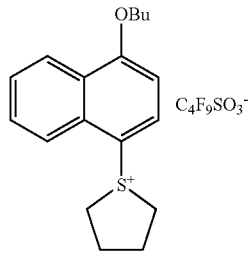
(z31) 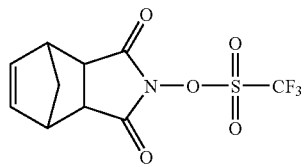
(z32) 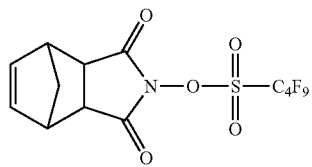
(z33) 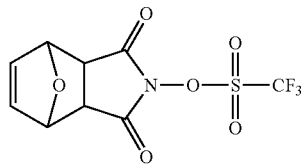
(z34) 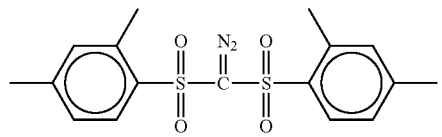
(z35) 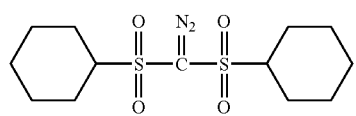
(z36) 
(z37) 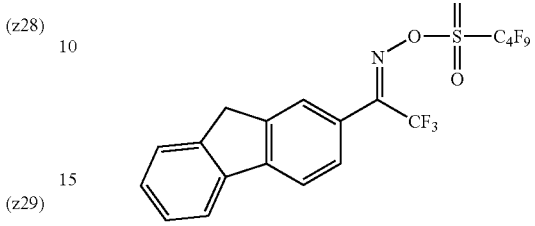
(z38) 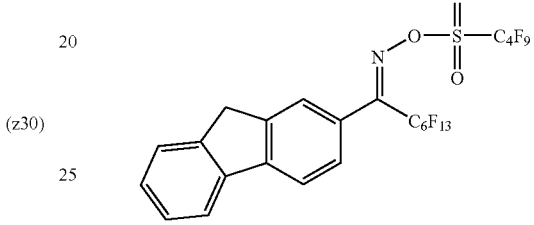
(z39) 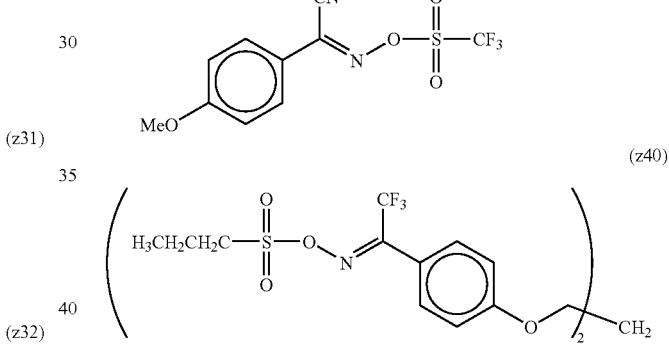
(z40) 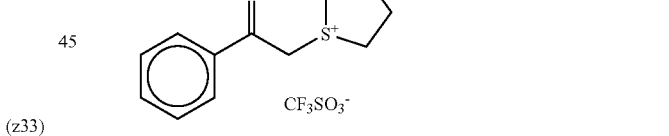
(z41) 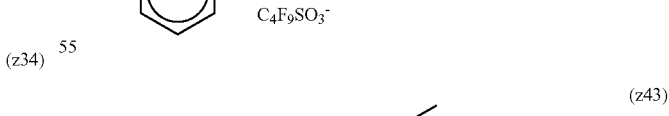
(z42) 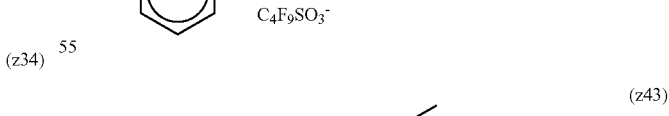
(z43) 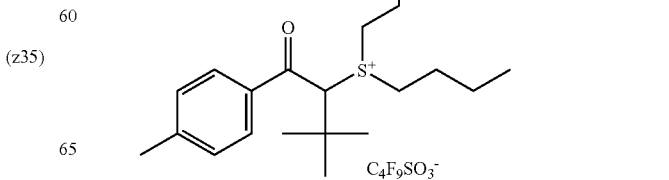

-continued
(z44) 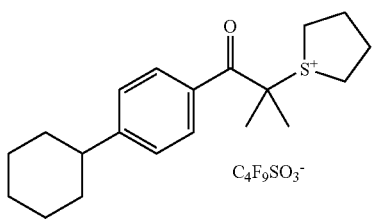
(z45) 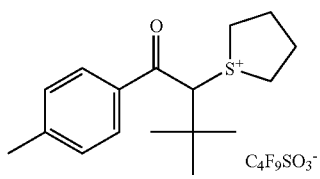
(z46) 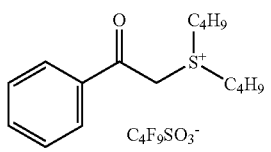
(z47) 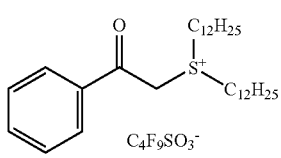
(z48) 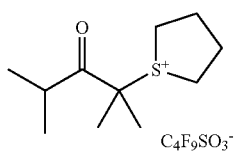
(z49) 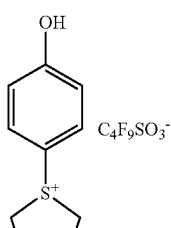
(z50) 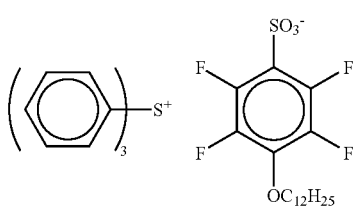
(z51) 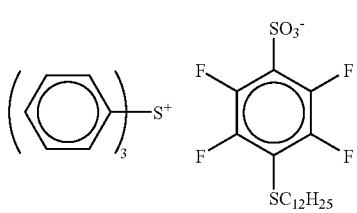
-continued
(z52) 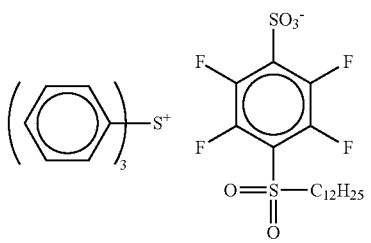
(z53) 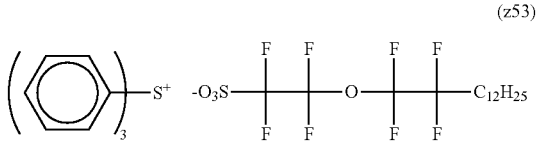
(z54) 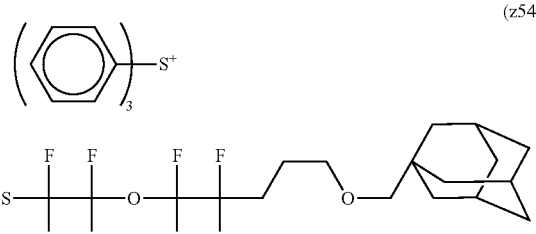
(z55) 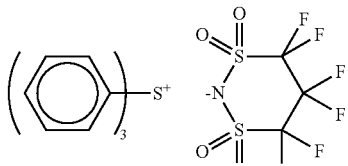
(z56) 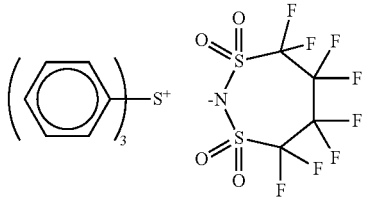
(z57) 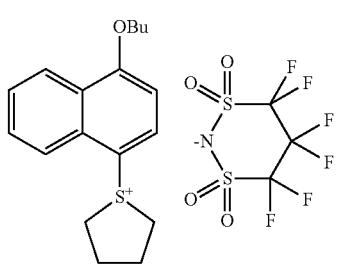
(z58) 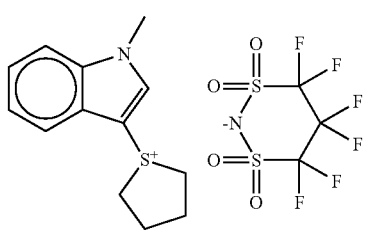

(z59) 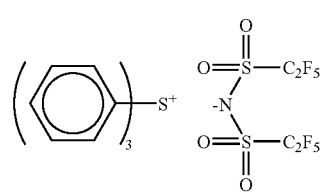
(z60) 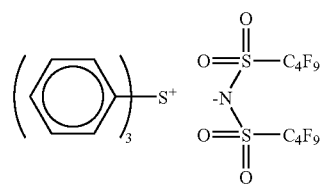
(z61) 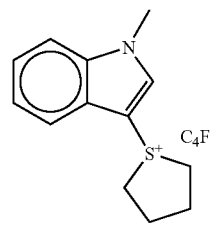
(z62) 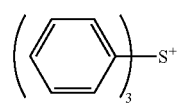
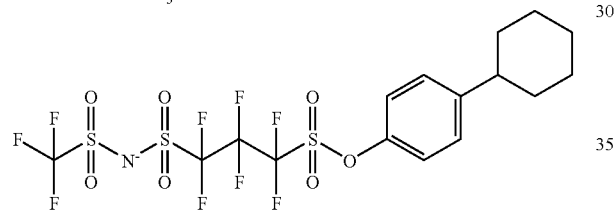
(z63) 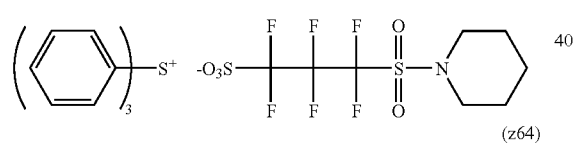
(z64) 
(z65) 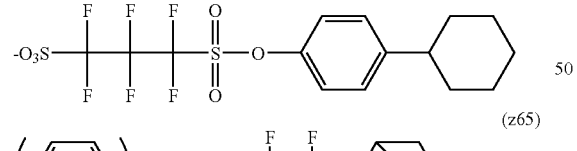
(z66) 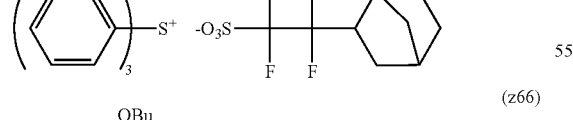
(z67) 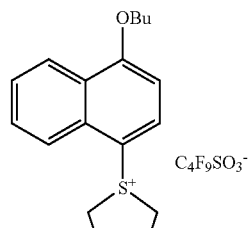
(z68) 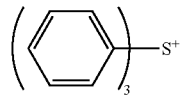
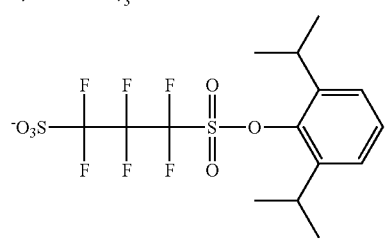
(z69) 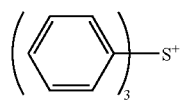
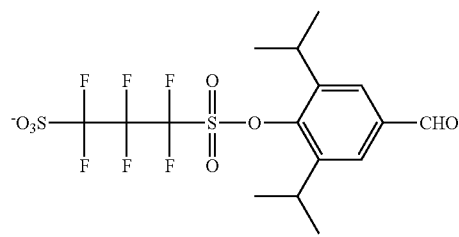
(z70) 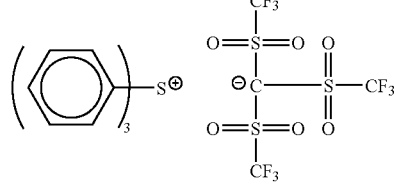
(z71) 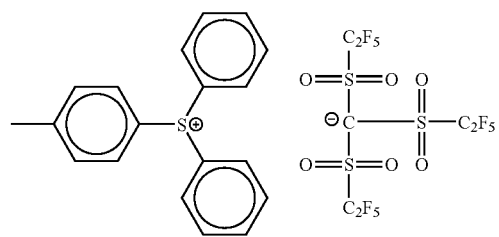
(z72) 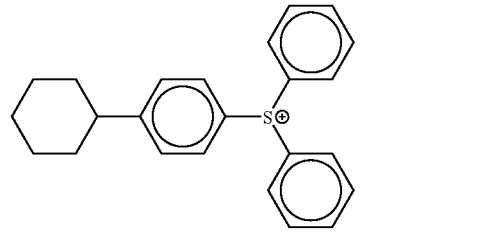
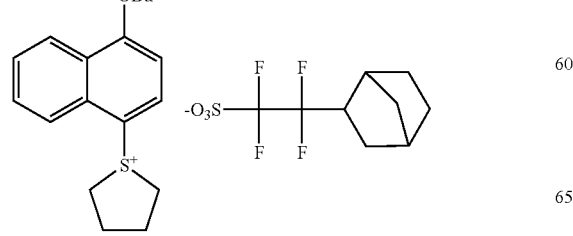

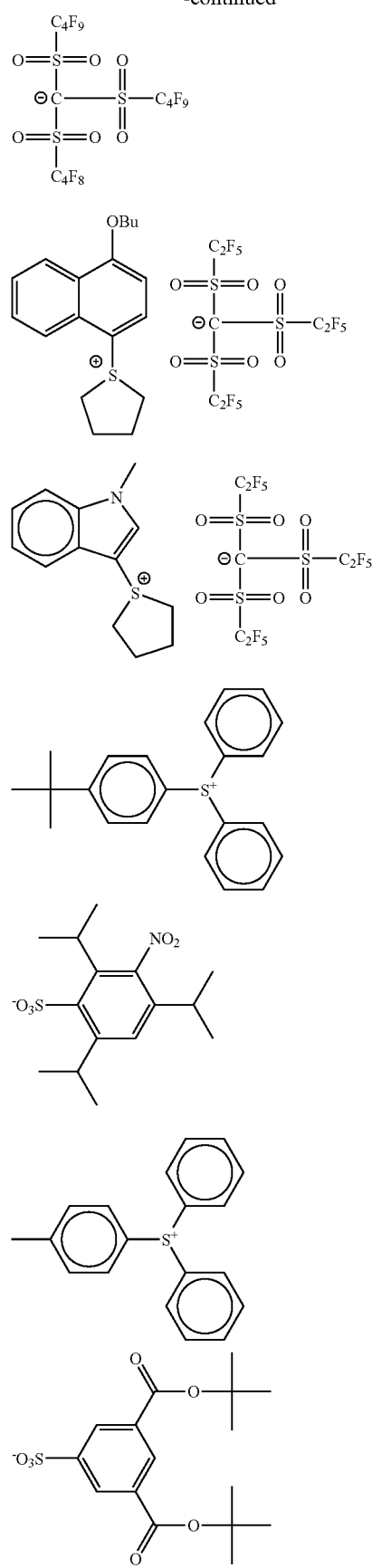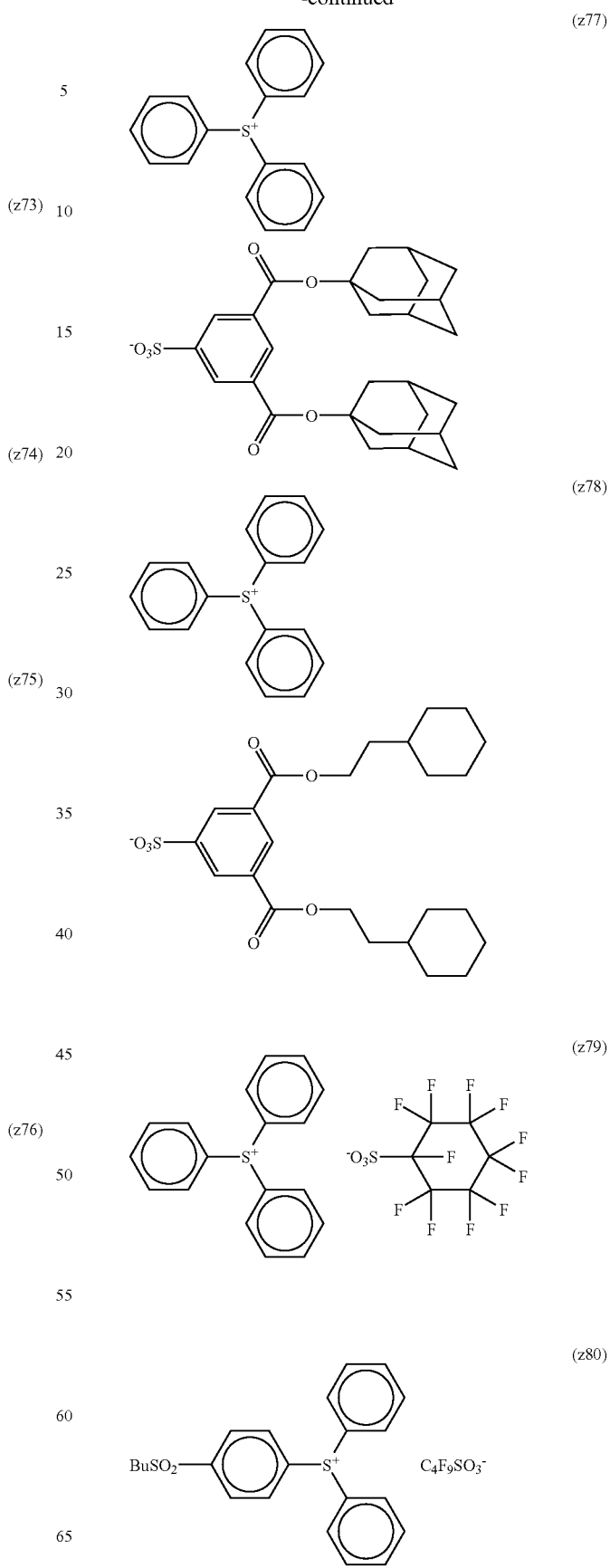

-continued

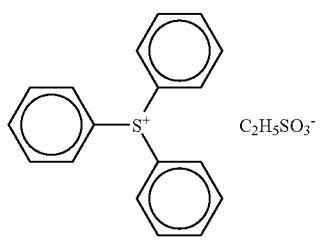 (z81)

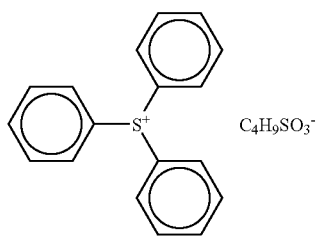 (z82)

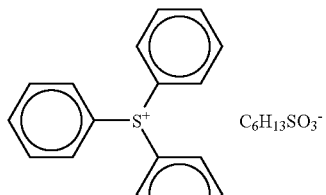 (z83)

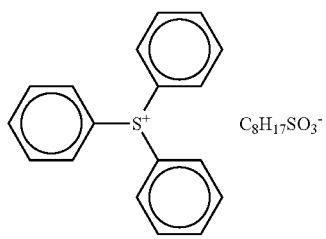 (z84)

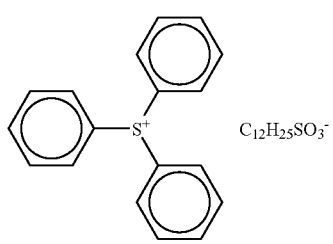 (z85)

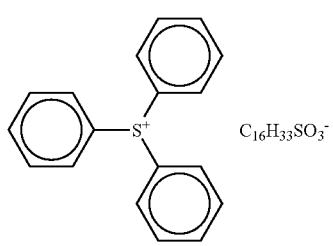 (z86)

-continued

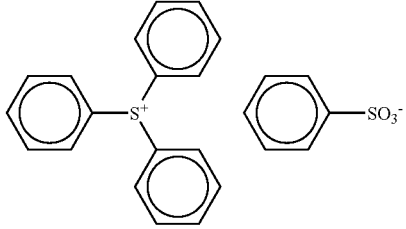 (z87)

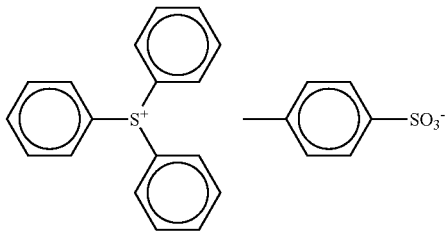 (z88)

The acid generators can be used by one kind alone, or two or more kinds can be used in combination. When two or more compounds are used in combination, it is preferred to combine compounds capable of generating two kinds of organic acids in which the total atom number exclusive of a hydrogen atom differs by 2 or more.

The content of the acid generators in the composition is preferably from 0.1 to 20 mass % based on all the solids content of the resist composition, more preferably from 0.5 to 10 mass %, and still more preferably from 1 to 7 mass %.

Carboxylic Acid Generator:

The composition of the invention may use a compound capable of generating a carboxylic acid upon irradiation with actinic ray or radiation (also referred to as a carboxylic acid generator) and it is preferred to use the carboxylic acid generator in combination with a sulfonic acid generator.

As the carboxylic acid generator, a compound represented by the following formula (C) is preferably used.

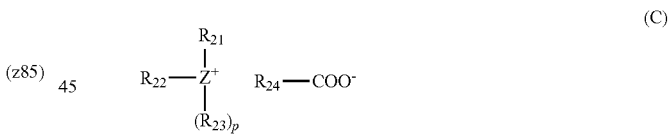 (C)

In formula (C), each of $R_{21}$, $R_{22}$ and $R_{23}$ independently represents an alkyl group, a cycloalkyl group, an alkenyl group or an aryl group; $R_{24}$ represents a hydrogen atom, an alkyl group, a cycloalkyl group, an alkenyl group or an aryl group; Z represents a sulfur atom or an iodine atom. When Z represents a sulfur atom, p is 1, and when Z represents an iodine atom, p is 0.

In formula (C), each of $R_{21}$, $R_{22}$ and $R_{23}$ independently represents an alkyl group, a cycloalkyl group, an alkenyl group or an aryl group, and these groups may each have a substituent.

As the examples of the substituents that the alkyl group, cycloalkyl group, or alkenyl group may have, a halogen atom (e.g., a chlorine atom, a bromine atom, a fluorine atom, etc.), an aryl group (e.g., a phenyl group, a naphthyl group, etc.), a hydroxyl group, an alkoxyl group (e.g., a methoxy group, an ethoxy group, a butoxy group, etc.), etc., can be exemplified.

As the examples of the substituents that the aryl group may have, a halogen atom (e.g., a chlorine atom, a bromine atom, a fluorine atom, etc.), a nitro group, a cyano group, an alkyl group (e.g., a methyl group, an ethyl group, a t-butyl group, a t-amyl group, an octyl group, etc.), a hydroxyl group, an alkoxyl group (e.g., a methoxy group, an ethoxy group, a butoxy group, etc.), etc., can be exemplified.

Each of $R_{21}$, $R_{22}$ and $R_{23}$ preferably represents an alkyl group having from 1 to 12 carbon atoms, a cycloalkyl group having from 3 to 12 carbon atoms, an alkenyl group having from 2 to 12 carbon atoms, or an aryl group having from 6 to 24 carbon atoms, more preferably an alkyl group having from 1 to 6 carbon atoms, a cycloalkyl group having from 3 to 6 carbon atoms, or an aryl group having from 6 to 18 carbon atoms, and especially preferably an aryl group having from 6 to 15 carbon atoms. These groups may each have a substituent.

$R_{24}$ represents a hydrogen atom, an alkyl group, a cycloalkyl group, an alkenyl group, or an aryl group.

As the examples of the substituents that the alkyl group, cycloalkyl group and alkenyl group may have, the same groups as described above as the examples of the substituents at the time when $R_{21}$ represents an alkyl group are exemplified. As the examples of the substituents of the aryl group, the same groups as described above as the examples of the substituents at the time when $R_{21}$ represents an aryl group are exemplified.

$R_{24}$ preferably represents a hydrogen atom, an alkyl group having from 1 to 30 carbon atoms, a cycloalkyl group having from 3 to 30 carbon atoms, an alkenyl group having from 2 to 30 carbon atoms, or an aryl group having from 6 to 24 carbon atoms, more preferably an alkyl group having from 1 to 18 carbon atoms, a cycloalkyl group having from 3 to 18 carbon atoms, or an aryl group having from 6 to 18 carbon atoms, and especially preferably an alkyl group having from 1 to 12 carbon atoms, a cycloalkyl group having from 3 to 12 carbon atoms, or an aryl group having from 6 to 15 carbon atoms. These groups may each have a substituent.

Z represents a sulfur atom or an iodine atom. p is 1 when Z represents a sulfur atom, and is 0 when Z represents an iodine atom.

Incidentally, two or more cationic portions of formula (C) may be bonded via a single bond or a linking group (e.g., —S— or —O—) to form a cationic structure having a plurality of cationic portions of formula (C).

The preferred specific examples of the carboxylic acid generators are shown below, but of course the invention is by no means restricted thereto.

C-1

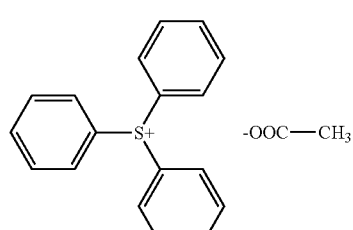

C-2

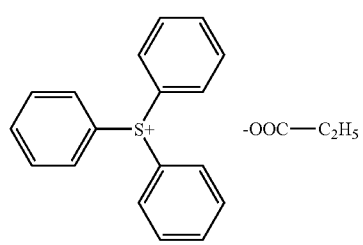

C-3

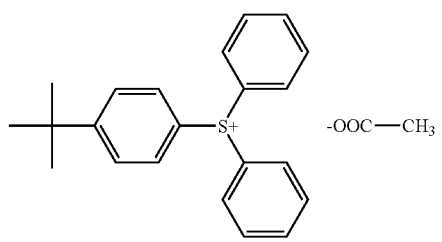

C-4

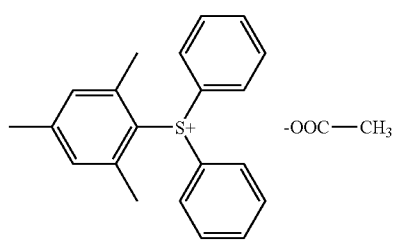

C-5

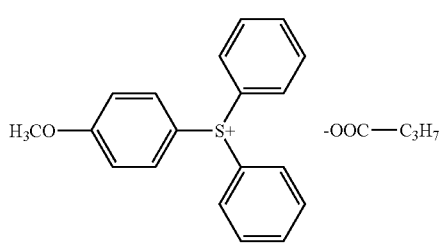

C-6

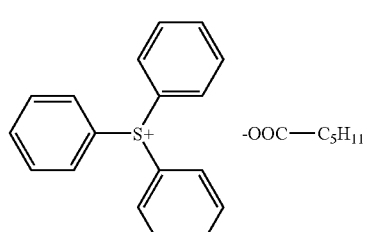

C-7

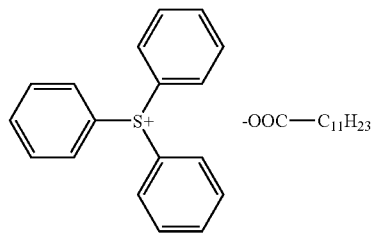

C-8

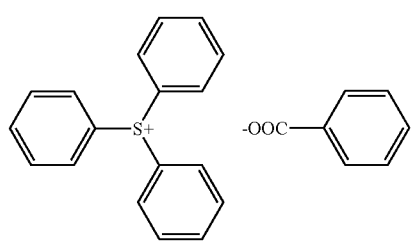

-continued
C-9
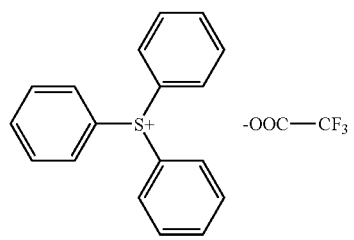
C-10
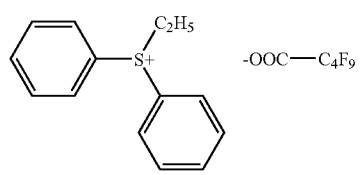
C-11
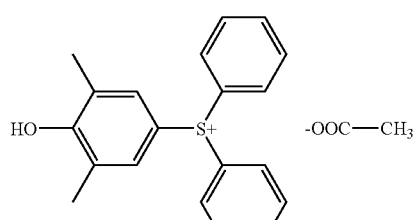
C-12
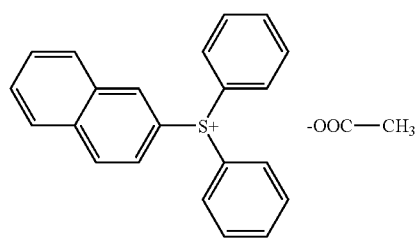
C-13
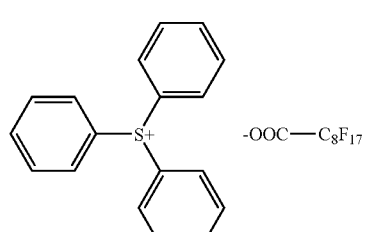
C-14
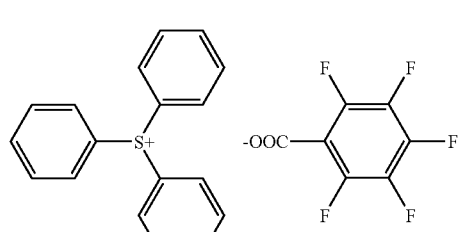
C-15
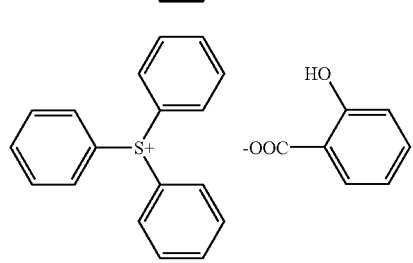
-continued
C-16
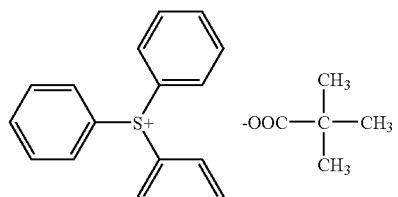
C-17
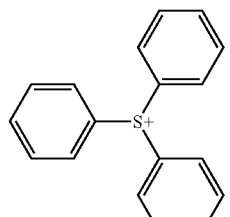
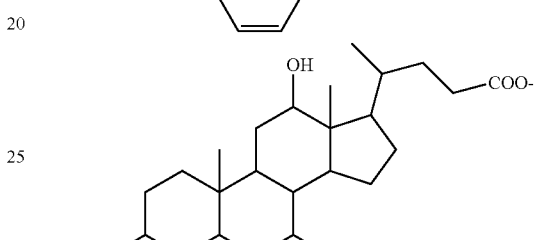
C-18
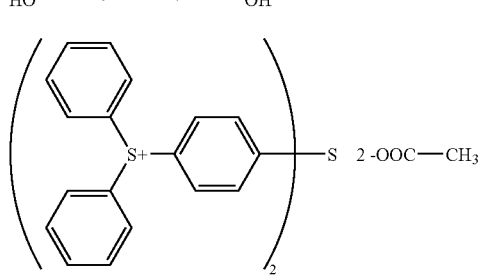
C-19
C-20
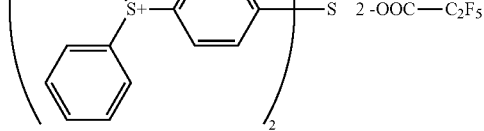
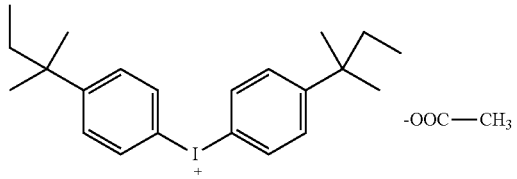
C-21
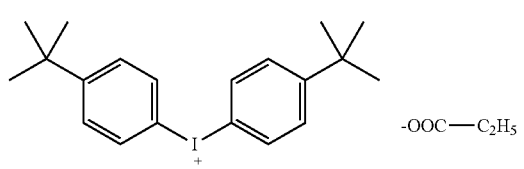

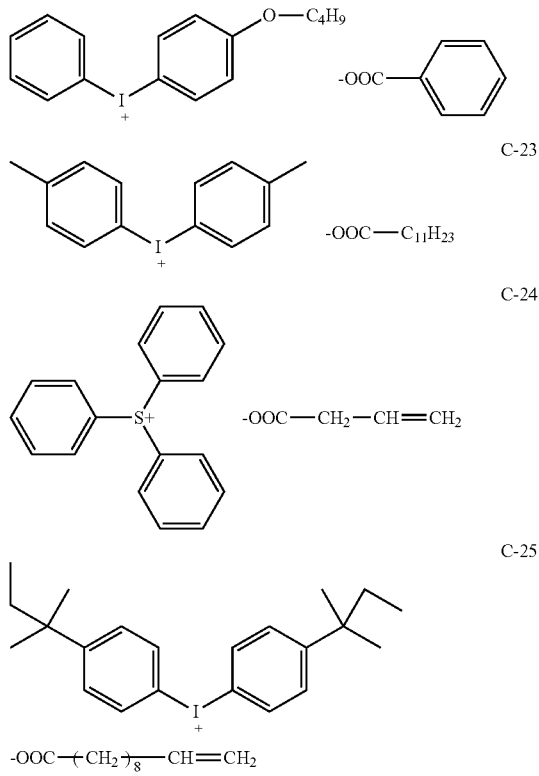

The content of the carboxylic acid generator in the positive resist composition in the invention is preferably from 0.01 to 10 mass % based on all the solids content of the composition, more preferably from 0.03 to 5 mass %, and especially preferably from 0.05 to 3 mass %. These carboxylic acid generators may be used by one kind alone, or two or more compounds may be used as admixture.

The carboxylic acid generator can be synthesized according to known methods, e.g., the synthesis method disclosed in JP-A-2002-27806.

When sulfonic acid generator (B) and carboxylic acid generator (C) are used in combination, C/B (weight ratio) is generally from 99.9/0.1 to 50/50, preferably from 99/1 to 60/40, and especially preferably from 98/2 to 70/30.

[3] A Compound Having a Proton Accepting Functional Group and Capable of Generating a Compound in which Proton Accepting Property Lowers and Vanishes or Changes from Proton Acceptive to Acidic by Decomposition Upon Irradiation with Actinic Ray or Radiation:

In the light of sensitivity, resolution and line edge roughness, it is preferred for the positive resist composition in the invention to have a compound having a proton accepting functional group (hereinafter also referred to as "compound (PA)") capable of generating a compound in which proton accepting property lowers and vanishes or changes from proton acceptive to acidic by decomposition upon irradiation with actinic ray or radiation.

As the compound whose proton accepting property lowers or vanishes, or changes from proton acceptive to acidic that is generated by the decomposition of compound (PA) upon irradiation with actinic ray or radiation, a compound represented by the following formula (PA-I) can be exemplified.

$$Q\text{-}A\text{-}(X)_n\text{-}B\text{-}R \qquad \text{(PA-I)}$$

In formula (PA-I), A represents a divalent linking group.

Q represents a sulfo group (—SO$_3$H), or a carboxyl group (—CO$_2$H).

X represents —SO$_2$— or —CO—.

n represents 0 or 1.

B represents a single bond, an oxygen atom, or —N(Rx)—.

Rx represents a hydrogen atom or a monovalent organic group.

R represents a monovalent organic group having a proton acceptor functional group or a monovalent organic group having an ammonium group.

The divalent linking group represented by A is preferably a divalent linking group having from 2 to 12 carbon atoms, e.g., an alkylene group and a phenylene group are exemplified. The divalent linking group is more preferably an alkylene group having at least one fluorine atom, and the number of carbon atoms is preferably from 2 to 6, and more preferably from 2 to 4. The alkylene group may have a linking group such as an oxygen atom or a sulfur atom in the alkylene chain. The alkylene group is especially preferably an alkylene group in which from 30 to 100% of the number of hydrogen atoms are substituted with fluorine atoms, and it is more preferred for the carbon atom bonding to Q site to have a fluorine atom. A perfluoroalkylene group is more preferred, and a perfluoroethylene group, a perfluoropropylene group, and a perfluorobutylene group are still more preferred.

The monovalent organic group represented by Rx has preferably from 4 to 30 carbon atoms, e.g., an alkyl group, a cycloalkyl group, an aryl group, an aralkyl group, and an alkenyl group can be exemplified.

The alkyl group represented by Rx may have a substituent. The alkyl group is preferably a straight chain and branched alkyl group having from 1 to 20 carbon atoms, and an oxygen atom, a sulfur atom or a nitrogen atom may be contained in the alkyl chain. Specifically, straight chain alkyl groups, e.g., a methyl group, an ethyl group, an n-propyl group, an n-butyl group, an n-pentyl group, an n-hexyl group, an n-octyl group, an n-dodecyl group, an n-tetradecyl group, and an n-octadecyl group, and branched alkyl groups, e.g., an isopropyl group, an isobutyl group, a t-butyl group, a neopentyl group, and a 2-ethylhexyl group can be exemplified.

As the alkyl group having a substituent, especially a straight chain or branched alkyl group substituted with a cycloalkyl group (e.g., an adamantylmethyl group, an adamantylethyl group, a cyclohexylethyl group, a camphor residue, etc.) can be exemplified.

The cycloalkyl group represented by Rx may have a substituent. The cycloalkyl group is preferably a cycloalkyl group having from 3 to 20 carbon atoms, and may contain an oxygen atom in the ring. Specifically, a cyclopropyl group, a cyclopentyl group, a cyclohexyl group, a norbornyl group, and an adamantyl group can be exemplified.

The aryl group represented by Rx may have a substituent, and preferably an aryl group having from 6 to 14 carbon atoms, e.g., a phenyl group and a naphthyl group are exemplified.

The aralkyl group represented by Rx may have a substituent, and preferably an aralkyl group having from 7 to 20 carbon atoms, e.g., a benzyl group, a phenethyl group, a naphthylmethyl group and a naphthylethyl group are exemplified.

The alkenyl group represented by $R_x$ may have a substituent, and, for example, a group having a double bond on arbitrary position of the alkyl group represented by $R_x$ can be exemplified.

The proton acceptor functional group in R means a functional group having a group capable of electrostatically interacting with a proton or having electron, for example, it means a functional group having a macro-cyclic structure such as cyclic polyether, or a functional group having a nitrogen atom having a lone electron pair not contributing to π conjugation. The nitrogen atom having a lone electron pair not contributing to π conjugation is, for example, a nitrogen atom having a partial structure represented by the following formula.

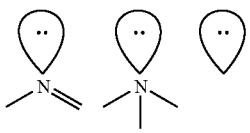

Lone electron pair

As preferred partial structures of the proton acceptor functional group, e.g., crown ether, azacrown ether, tertiary amine, secondary amine, primary amine, pyridine, imidazole, and pyrazine structures can be exemplified.

As preferred partial structures of the ammonium group, e.g., tertiary ammonium, secondary ammonium, primary ammonium, pyridinium, imidazolinium, and pyrazinium structures can be exemplified.

The groups containing these structures preferably have from 4 to 30 carbon atoms and, e.g., an alkyl group, a cycloalkyl group, an aryl group, an aralkyl group and an alkenyl group can be exemplified.

In the alkyl group, cycloalkyl group, aryl group, aralkyl group and alkenyl group containing a proton acceptor functional group or an ammonium group represented by R, the alkyl group, cycloalkyl group, aryl group, aralkyl group and alkenyl group are the same as the alkyl group, cycloalkyl group, aryl group, aralkyl group and alkenyl group exemplified above as represented by Rx.

As the substituents that these groups may have, e.g., a halogen atom, a hydroxyl group, a nitro group, a cyano group, a carboxyl group, a carbonyl group, a cycloalkyl group (preferably having from 3 to 10 carbon atoms), an aryl group (preferably having from 6 to 14 carbon atoms), an alkoxyl group (preferably having from 1 to 10 carbon atoms), an acyl group (preferably having from 2 to 20 carbon atoms), an acyloxy group (preferably having from 2 to 10 carbon atoms, an alkoxy-carbonyl group (preferably having from 2 to 20 carbon atoms), and an aminoacyl group (preferably having from 2 to 20 carbon atoms are exemplified. In connection with the cyclic structures in the aryl group and the cycloalkyl group, an alkyl group (preferably having from 1 to 20 carbon atoms) can further be exemplified as the substituent. Regarding the aminoacyl group, one or two alkyl groups (preferably having from 1 to 20 carbon atoms) can further be exemplified as the substituent.

When B represents —N(Rx)-, it is preferred that R and Rx are bonded to each other to form a ring. Stability is improved by forming a ring structure, and preservation stability of the composition using the compound heightens. The number of carbon atoms to form a ring is preferably from 4 to 20, the ring may be monocyclic or polycyclic, and an oxygen atom, a sulfur atom or a nitrogen atom may be contained in the ring.

As the monocyclic structures, a 4-membered ring, a 5-membered ring, a 6-membered ring, a 7-membered ring and an 8-membered ring, each containing a nitrogen atom, can be exemplified. As the polycyclic structures, structures comprising combinations of two or three or more monocyclic structures can be exemplified. The monocyclic structures and polycyclic structures may each have a substituent, e.g., a halogen atom, a hydroxyl group, a cyano group, a carboxyl group, a carbonyl group, a cycloalkyl group (preferably having from 3 to 10 carbon atoms), an aryl group (preferably having from 6 to 14 carbon atoms), an alkoxyl group (preferably having from 1 to 10 carbon atoms), an acyl group (preferably having from 2 to 15 carbon atoms), an acyloxy group (preferably having from 2 to 15 carbon atoms), an alkoxycarbonyl group (preferably having from 2 to 15 carbon atoms), and an aminoacyl group (preferably having from 2 to 20 carbon atoms) are preferred. In connection with the cyclic structures in the aryl group and the cycloalkyl group, an alkyl group (preferably having from 1 to 15 carbon atoms) can further be exemplified as the substituents. Concerning the aminoacyl group, one or two alkyl groups (preferably having from 1 to 15 carbon atoms) can be exemplified as the substituent.

Of the compounds represented by formula (PA-I), a compound whose Q site is a sulfonic acid can be synthesized according to ordinary sulfonamidation reaction. For example, the compound can be obtained by a method of reacting the sulfonyl halide portion on the one side of a bissulfonyl halide compound selectively with an amine compound to form a sulfonamido bond, and then hydrolyzing the sulfonyl halide portion on the other side, or a method of ring opening by reacting a cyclic sulfonic acid anhydride with an amine compound.

The specific examples of the compounds represented by formula (PA-I) are shown below, but the invention is not restricted thereto.

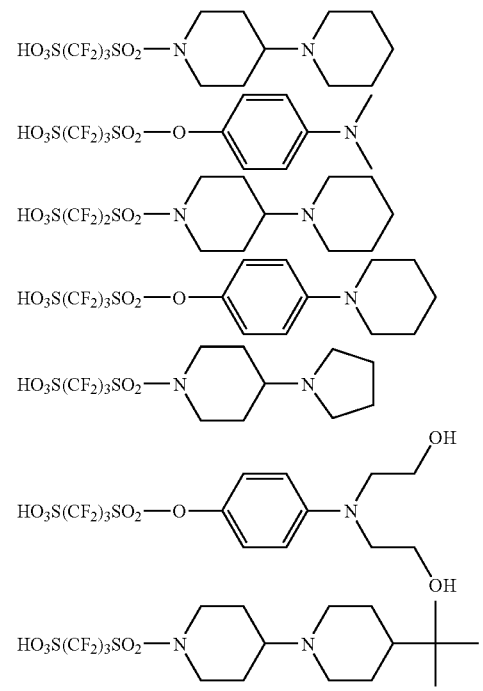

-continued

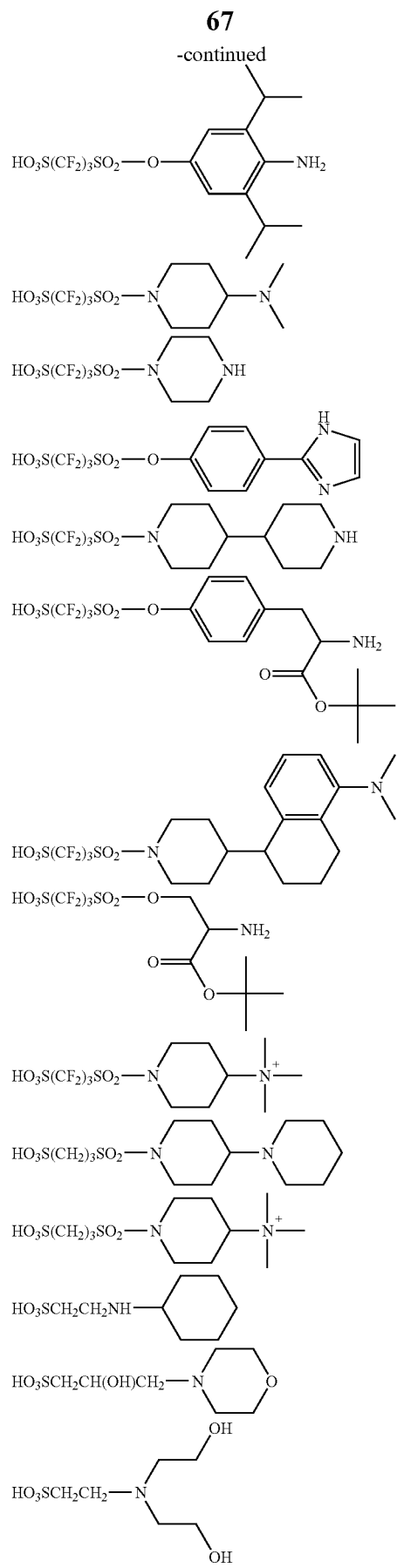

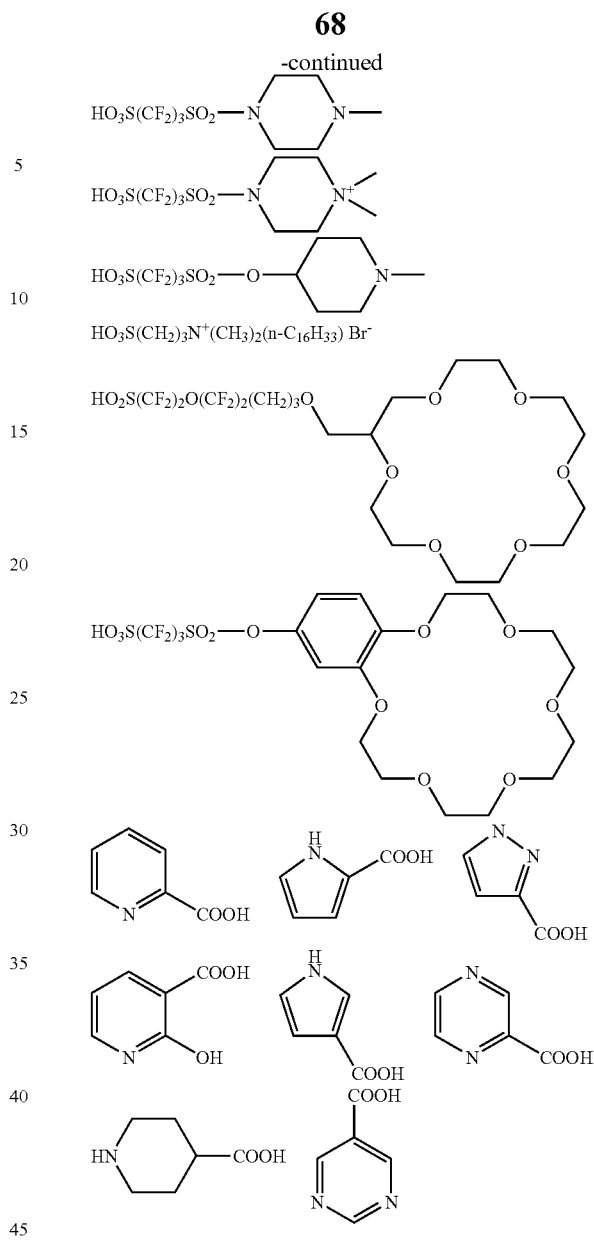

As the compound in which proton accepting property lowers and vanishes or changes from proton acceptive to acidic that is generated by the decomposition of compound (PA) upon irradiation with actinic ray or radiation, a compound represented by the following formula (PA-II) can further be exemplified.

$$Q_1\text{-}X_1\text{---}NH\text{---}X_2\text{-}Q_2 \qquad \text{(PA-II)}$$

In formula (PA-II), each of $Q_1$ and $Q_2$ independently represents a monovalent organic group. However, either $Q_1$ or $Q_2$ has a proton acceptor functional group. $Q_1$ and $Q_2$ may be bonded to each other to form a ring, and the formed ring may have a proton acceptor functional group.

Each of $X_1$ and $X_2$ independently represents —CO— or —SO$_2$—.

The monovalent organic group represented by $Q_1$ and $Q_2$ in formula (PA-II) preferably has from 1 to 40 carbon atoms, e.g., an alkyl group, a cycloalkyl group, an aryl group, an aralkyl group and an alkenyl group can be exemplified.

The alkyl group represented by $Q_1$ and $Q_2$ may have a substituent. The alkyl group is preferably a straight chain or branched alkyl group having from 1 to 30 carbon atoms, and an oxygen atom, a sulfur atom or a nitrogen atom may be contained in the alkyl chain. Specifically, straight chain alkyl groups, e.g., a methyl group, an ethyl group, an n-propyl group, an n-butyl group, an n-pentyl group, an n-hexyl group, an n-octyl group, an n-dodecyl group, an n-tetradecyl group, and an n-octadecyl group, and branched alkyl groups, e.g., an isopropyl group, an isobutyl group, a t-butyl group, a neopentyl group, and a 2-ethylhexyl group can be exemplified.

The cycloalkyl group represented by $Q_1$ and $Q_2$ may have a substituent. The cycloalkyl group is preferably a cycloalkyl group having from 3 to 20 carbon atoms, and an oxygen atom or a nitrogen atom may be contained in the ring. Specifically, a cyclopropyl group, a cyclopentyl group, a cyclohexyl group, a norbornyl group and an adamantyl group can be exemplified.

The aryl group represented by $Q_1$ and $Q_2$ may have a substituent. The aryl group is preferably an aryl group having from 6 to 14 carbon atoms, and, e.g., a phenyl group and a naphthyl group are exemplified.

The aralkyl group represented by $Q_1$ and $Q_2$ may have a substituent. The aralkyl group is preferably an aralkyl group having from 7 to 20 carbon atoms, and, e.g., a benzyl group, a phenethyl group, a naphthylmethyl group, and a naphthylethyl group are exemplified.

The alkenyl group represented by $Q_1$ and $Q_2$ may have a substituent, and groups having a double bond on arbitrary position of the above alkyl groups are exemplified.

As the substituents that each of the above groups may have, e.g., a halogen atom, a hydroxyl group, a nitro group, a cyano group, a carboxyl group, a carbonyl group, a cycloalkyl group (preferably having from 3 to 10 carbon atoms), an aryl group (preferably having from 6 to 14 carbon atoms), an alkoxyl group (preferably having from 1 to 10 carbon atoms), an acyl group (preferably having from 2 to 20 carbon atoms), an acyloxy group (preferably having from 2 to 10 carbon atoms), an alkoxy-carbonyl group (preferably having from 2 to 20 carbon atoms), and an aminoacyl group (preferably having from 2 to 10 carbon atoms) are exemplified. In connection with the cyclic structures in the aryl group and the cycloalkyl group, an alkyl group (preferably having from 1 to 10 carbon atoms) can further be exemplified as the substituents. Concerning the aminoacyl group, an alkyl group (preferably having from 1 to 10 carbon atoms) can further be exemplified as the substituent. As the alkyl groups having a substituent, perfluoroalkyl groups, e.g., a perfluoromethyl group, a perfluoroethyl group, a perfluoropropyl group, and a perfluorobutyl group can be exemplified.

Either of the monovalent organic groups represented by $Q_1$ and $Q_2$ has a proton acceptor functional group.

The proton acceptor functional group means a functional group having a group capable of electrostatically interacting with a proton or having lone electron pair, for example, a functional group having a macro-cyclic structure such as cyclic polyether, or a functional group having a nitrogen atom having a lone electron pair little in contribution to π conjugation can be exemplified. The nitrogen atom having a lone electron pair little in contribution to π conjugation is, for example, a nitrogen atom having a partial structure represented by the following formula.

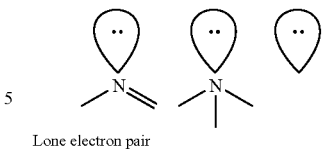

Lone electron pair

As preferred partial structures of the proton acceptor functional group, e.g., crown ether, azacrown ether, tertiary amine, secondary amine, primary amine, pyridine, imidazole, pyrazine, and aniline structures can be exemplified. The groups containing these structures preferably have from 4 to 30 carbon atoms and, e.g., an alkyl group, a cycloalkyl group, an aryl group, an aralkyl group and an alkenyl group can be exemplified. The alkyl group, cycloalkyl group, aryl group, aralkyl group and alkenyl group are the same as those described above.

As the substituents that each of the above groups may have, e.g., a halogen atom, a hydroxyl group, a nitro group, a cyano group, a carboxyl group, a carbonyl group, a cycloalkyl group (preferably having from 3 to 10 carbon atoms), an aryl group (preferably having from 6 to 14 carbon atoms), an alkoxyl group (preferably having from 1 to 10 carbon atoms), an acyl group (preferably having from 2 to 20 carbon atoms), an acyloxy group (preferably having from 2 to 10 carbon atoms, an alkoxy-carbonyl group (preferably having from 2 to 20 carbon atoms), and an aminoacyl group (preferably having from 2 to 20 carbon atoms are exemplified. In connection with the cyclic structures in the aryl group and the cycloalkyl group, an alkyl group (preferably having from 1 to 20 carbon atoms) can further be exemplified as the substituent. With respect to the aminoacyl group, an alkyl groups (preferably having from 1 to 20 carbon atoms) can further be exemplified as the substituent.

The proton acceptor functional group may be substituted with an organic group having a bond that is cut by an acid. As the organic group having a bond that is cut by an acid, e.g., an amido group, an ester group (preferably a tertiary alkyloxy-carbonyl group), an acetal group (preferably a 1-alkyloxy-alkyloxy group), a carbamoyl group, and a carbonate group are exemplified.

As the structure that $Q_1$ and $Q_2$ are bonded to each other to form a ring, and the formed ring has a proton acceptor functional group, e.g., the structure that the organic group represented by $Q_1$ and $Q_2$ is further bonded with an alkylene group, an oxy group, or imino group can be exemplified.

In formula (PA-II), it is preferred that at least either $X_1$ or $X_2$ is —$SO_2$—.

The compound represented by formula (PA-II) is preferably a compound represented by the following formula (PA-III).

$$Q_1\text{-}X_1\text{—NH—}X_2\text{-A-}(X_3)_n\text{—B-}Q_3 \qquad \text{(PA-III)}$$

In formula (PA-III), each of $Q_1$ and $Q_3$ independently represents a monovalent organic group. However, either $Q_1$ or $Q_3$ has a proton acceptor functional group. $Q_1$ and $Q_3$ may be bonded to each other to form a ring, and the formed ring may have a proton acceptor functional group.

Each of $X_1$, $X_2$ and $X_3$ independently represents —CO— or —$SO_2$—.

A represents a divalent linking group.

B represents a single bond, an oxygen atom, or —N(Qx)-.

Qx represents a hydrogen atom or a monovalent organic group.

When B represents —N(Qx)-, $Q_3$ and Qx may be bonded to each other to form a ring.

n represents 0 or 1.

$Q_1$, has the same meaning as $Q_1$ in formula (PA-II).

As the organic group represented by $Q_3$, the same organic groups represented by $Q_1$ and $Q_2$ in formula (PA-II) can be exemplified.

The divalent linking group represented by A is preferably a divalent linking group having a fluorine atom and from 1 to 8 carbon atoms, e.g., an alkylene group having a fluorine atom and from 1 to 8 carbon atoms, and a phenylene group having a fluorine atom are exemplified, and more preferably an alkylene group having a fluorine atom. The preferred carbon atom number is from 2 to 6, and more preferably from 2 to 4. A linking group such as an oxygen atom or a sulfur atom may be contained in the alkylene chain. The alkylene group is preferably an alkylene group in which from 30 to 100% of the number of hydrogen atoms are substituted with fluorine atoms. A perfluoroalkylene group is more preferred, and a perfluoroethylene group, a perfluoropropylene group, and a perfluorobutylene group are especially preferred.

The monovalent organic group represented by Qx has preferably from 4 to 30 carbon atoms, e.g., an alkyl group, a cycloalkyl group, an aryl group, an aralkyl group, and an alkenyl group can be exemplified. As the alkyl group, cycloalkyl group, aryl group, aralkyl group, and alkenyl group, the same groups as described above can be exemplified.

In formula (PA-III), each of $X_1$, $X_2$ and $X_3$ preferably represents —$SO_2$—.

The specific examples of the compounds represented by formula (PA-II) are shown below, but the invention is not restricted thereto.

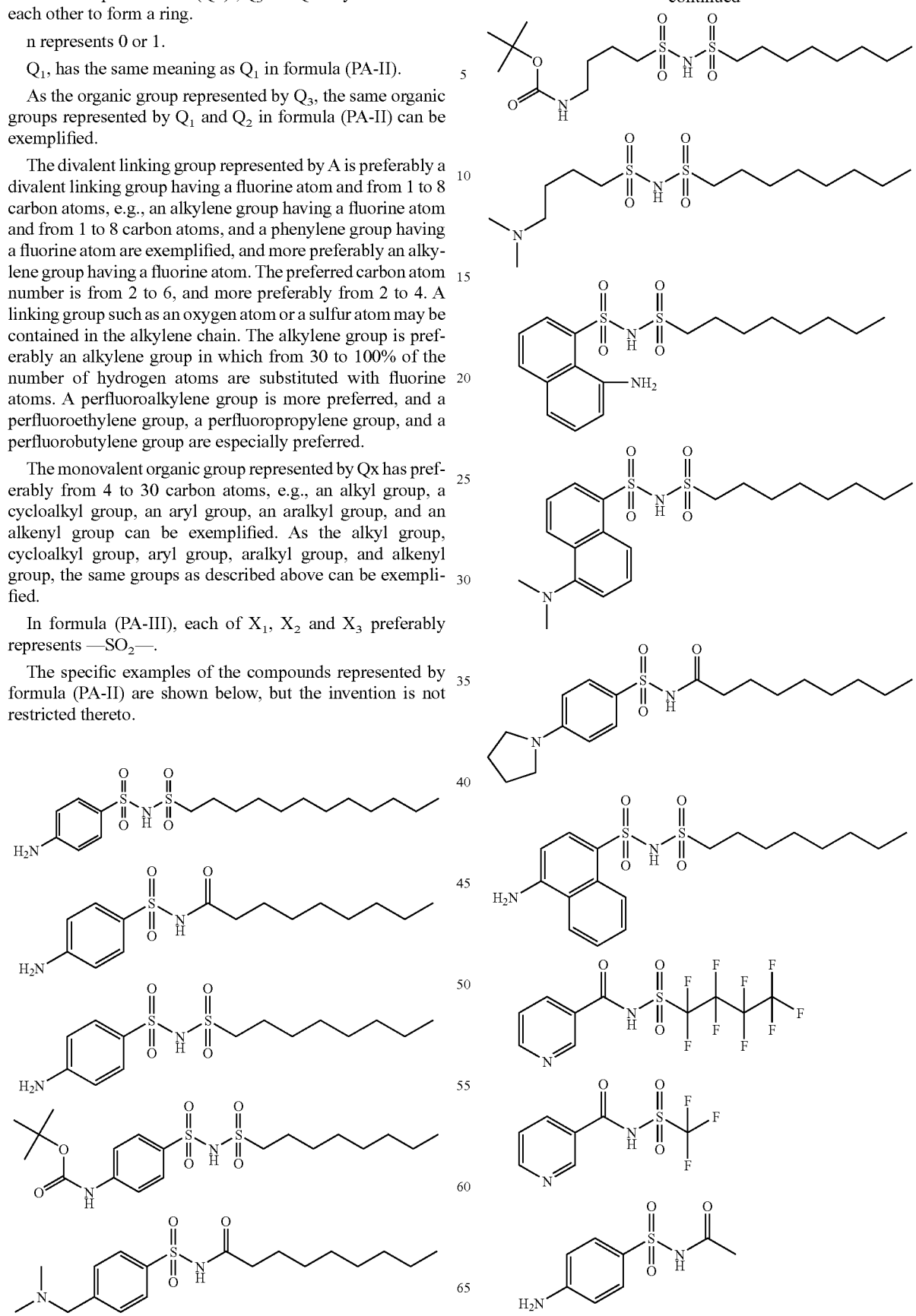

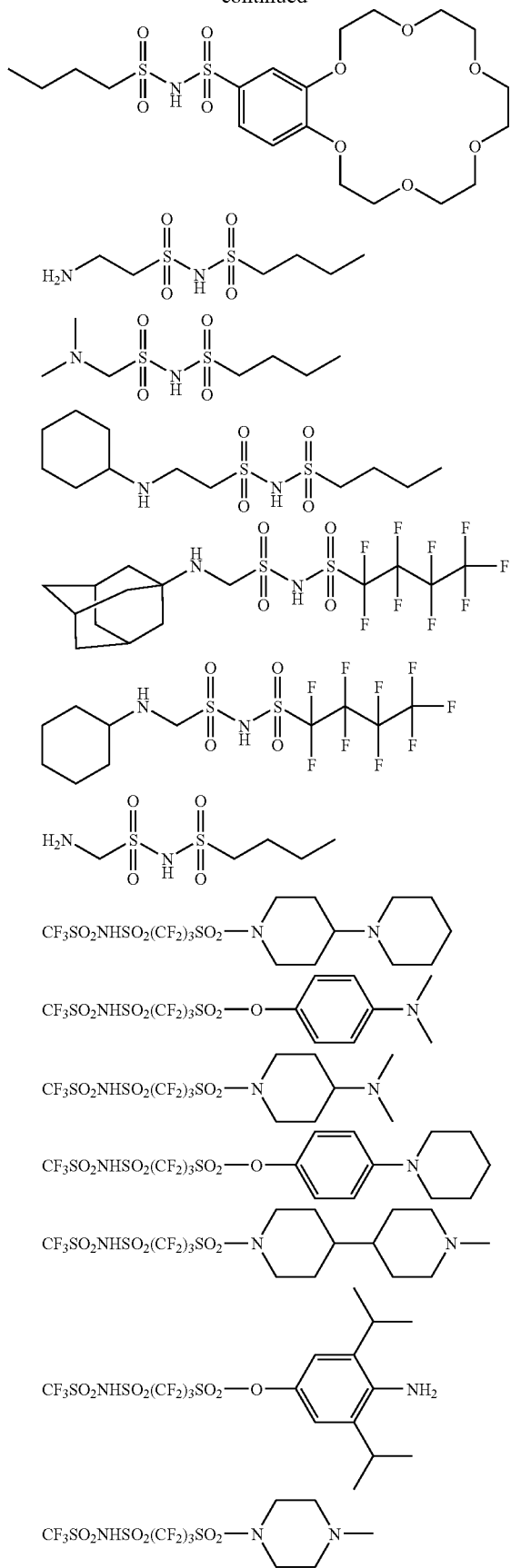

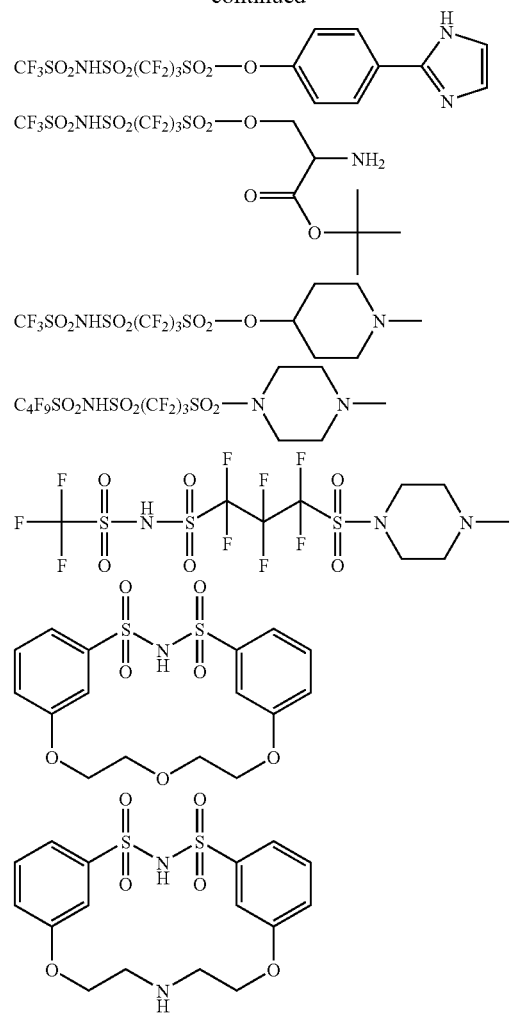

Compound (PA) is preferably a sulfonium salt compound of the compound represented by formula (PA-I), (PA-II) or (PA-III), or an iodonium salt compound of the compound represented by formula (PA-I), (PA-II) or (PA-III), and more preferably a compound represented by the following formula (PA1) or (PA2).

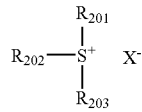
(PA1)

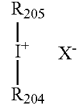
(PA2)

In formula (PA1), each of $R_{201}$, $R_{202}$ and $R_{203}$ independently represents an organic group.

$X^-$ represents a sulfonate anion or a carboxylate anion obtained by taking off the hydrogen atom of the —$SO_3H$ site or the —COOH site of the compound represented by formula (PA-I), or the anion of the compound represented by formula (PA-II) or (PA-III).

The carbon atom number of the organic group represented by $R_{201}$, $R_{202}$ and $R_{203}$ is generally from 1 to 30, and preferably from 1 to 20.

Two of $R_{201}$, $R_{202}$ and $R_{203}$ may be bonded to form a cyclic structure, and an oxygen atom, a sulfur atom, an ester bond, an amido bond or a carbonyl group may be contained in the ring. As the group formed by bonding two of $R_{201}$, $R_{202}$ and $R_{203}$, an alkylene group (e.g., a butylene group and a pentylene group) can be exemplified.

As the specific examples of the organic groups represented by $R_{201}$, $R_{202}$ and $R_{203}$, the corresponding groups in the later-described compounds represented by formula (A1a), (A1b) or (A1c) can be exemplified.

Incidentally, the compound represented by formula (PA1) may be a compound having a plurality of structures represented by formula (PA1). For instance, compound (PA1) may be a compound having a structure that at least one of $R_{201}$, $R_{202}$ and $R_{203}$ of a compound represented by formula (PA1) is bonded to at least one of $R_{201}$, $R_{202}$ and $R_{203}$ of another compound represented by formula (PA1).

As further preferred (PA1) component, the compound represented by formula (A1a), (A1b) or (A1c) described below can be exemplified.

Compound (A1a) is an arylsulfonium compound that at least one of $R_{201}$ to $R_{203}$ in formula (PA1) represents an aryl group, i.e., a compound having arylsulfonium as a cation.

In the arylsulfonium compound, all of $R_{20}$ to $R_{203}$ of may be aryl groups, or a part of $R_{201}$ to $R_{203}$ may be an aryl group and the remainder may be an alkyl group or a cycloalkyl group.

As the arylsulfonium compounds, e.g., a triarylsulfonium compound, a diarylalkylsulfonium compound, a diarylcycloalkylsulfonium compound, an aryldialkylsulfonium compound, an aryldicycloalkylsulfonium compound, and an arylalkylcycloalkylsulfonium compound are exemplified.

As the aryl groups of the arylsulfonium compound, a phenyl group and a naphthyl group are preferred, and a phenyl group is more preferred. When the arylsulfonium compound has two or more aryl groups, these two or more aryl groups may be the same with or different from each other.

The alkyl group that the arylsulfonium compound may have according to necessity is preferably a straight chain or branched alkyl group having from 1 to 15 carbon atoms, e.g., a methyl group, an ethyl group, a propyl group, an n-butyl group, a sec-butyl group, and a t-butyl group can be exemplified.

The cycloalkyl group that the arylsulfonium compound may have according to necessity is preferably a cycloalkyl group having from 3 to 15 carbon atoms, e.g., a cyclopropyl group, a cyclobutyl group, and a cyclohexyl group can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and most preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When each of $R_{201}$, $R_{202}$ and $R_{203}$ represents an aryl group, it is preferred that the substituent is substituted on the p-position of the aryl group.

Compound (A1b) is described below.

Compound (A1b) is a compound in the case where each of $R_{201}$, $R_{202}$ and $R_{203}$ in formula (PA1) independently represents an organic group not having an aromatic ring. The aromatic ring here also includes an aromatic ring having a hetero atom.

The organic group not having an aromatic ring represented by $R_{201}$, $R_{202}$ and $R_{203}$ generally is an organic group having from 1 to 30 carbon atoms, and preferably from 1 to 20 carbon atoms.

Each of $R_{201}$, $R_{202}$ and $R_{203}$ independently preferably represents an alkyl group, a cycloalkyl group, an allyl group, or a vinyl group, more preferably represents a straight chain or branched 2-oxoalkyl group, a 2-oxocycloalkyl group, or an alkoxycarbonylmethyl group, and especially preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 20 carbon atoms, e.g., a methyl group, an ethyl group, a propyl group, a butyl group, and a pentyl group can be exemplified. The alkyl group represented by $R_{201}$, $R_{202}$ and $R_{203}$ is more preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group, and a norbornyl group can be exemplified. The cycloalkyl group represented by $R_{201}$, $R_{202}$ and $R_{203}$ is more preferably a 2-oxocycloalkyl group.

The straight chain or branched 2-oxoalkyl group represented by $R_{201}$, $R_{202}$ and $R_{203}$ may have a double bond in the chain, and preferably a group having $>C=O$ on the 2-position of the above alkyl group can be exemplified.

The 2-oxocycloalkyl group represented by $R_{201}$, $R_{202}$ and $R_{203}$ may have a double bond in the chain, and preferably a group having $>C=O$ on the 2-position of the above cycloalkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms, e.g., a methoxy group, an ethoxy group, a propoxy group, a butoxy group, and a pentoxy group can be exemplified.

$R_{201}$, $R_{202}$ and $R_{203}$ may further be substituted with a halogen atom, an alkoxyl group (e.g., having from 1 to 5 carbon atoms), an alkoxycarbonyl group (e.g., having from 1 to 5 carbon atoms), a hydroxyl group, a cyano group, or a nitro group.

Compound (A1c) is a compound represented by the following formula (A1c) and has an arylacylsulfonium salt structure.

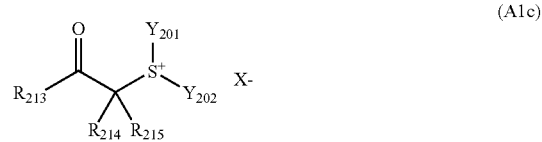

(A1c)

In formula (A1c), $R_{213}$ represents an aryl group that may have a substituent, and preferably a phenyl group or a naphthyl group. As preferred substituents in $R_{213}$, an alkyl group, an alkoxyl group, an acyl group, a nitro group, a hydroxyl group, an alkoxycarbonyl group, and a carboxyl group are exemplified.

Each of $R_{214}$ and $R_{215}$ independently represents a hydrogen atom, an alkyl group or a cycloalkyl group.

Each of $Y_{201}$ and $Y_{202}$ independently represents an alkyl group, a cycloalkyl group, an aryl group, or a vinyl group.

$X^-$ represents a sulfonate anion or a carboxylate anion obtained by taking off the hydrogen atom of the —$SO_3H$ site or the —COOH site of the compound represented by formula (PA-I), or the anion of the compound represented by formula (PA-II) or (PA-III).

$R_{213}$ and $R_{214}$ may be bonded to each other to form a cyclic structure, $R_{214}$ and $R_{215}$ may be bonded to each other to form a cyclic structure, and $Y_{201}$ and $Y_{202}$ may be bonded to each other to form a cyclic structure. These cyclic structures may contain an oxygen atom, a sulfur atom, an ester bond, or an amido bond. As the groups formed by bonding $R_{213}$ and $R_{214}$, $R_{214}$ and $R_{215}$, and $Y_{201}$ and $Y_{202}$, a butylene group and a pentylene group can be exemplified.

As the alkyl group represented by $R_{214}$, $R_{215}$, $Y_{201}$ and $Y_{202}$, a straight chain or branched alkyl group having from 1 to 20 carbon atoms is preferred. As the alkyl group represented by $Y_{201}$ and $Y_{202}$, a 2-oxoalkyl group having >C=O on the 2-position of an alkyl group, an alkoxycarbonylalkyl group (preferably the alkoxyl group has from 2 to 20 carbon atoms), and a carboxyalkyl group are more preferred.

As the cycloalkyl group represented by $R_{214}$, $R_{215}$, $Y_{201}$ and $Y_{202}$, a cycloalkyl group having from 3 to 20 carbon atoms is preferred.

Each of $Y_{201}$ and $Y_{202}$ preferably represents an alkyl group having 4 or more carbon atoms, more preferably an alkyl group having from 4 to 6 carbon atoms, and still more preferably an alkyl group having from 4 to 12 carbon atoms.

Further, it is preferred that at least one of $R_{214}$ and $R_{215}$ represents an alkyl group, and more preferably both $R_{214}$ and $R_{215}$ represent an alkyl group.

In formula (PA2), each of $R_{204}$ and $R_{205}$ independently represents an aryl group, an alkyl group, or a cycloalkyl group.

$X^-$ represents a sulfonate anion or a carboxylate anion obtained by taking off the hydrogen atom of the —$SO_3H$ site or the —COOH site of the compound represented by formula (PA-I), or the anion of the compound represented by formula (PA-II) or (PA-III).

The aryl group represented by $R_{204}$ and $R_{205}$ is preferably a phenyl group or a naphthyl group, and more preferably a phenyl group.

The alkyl group represented by $R_{204}$ and $R_{205}$ may be either straight chain or branched, preferably a straight chain or branched alkyl group having from 1 to 10 carbon atoms, and, e.g., a methyl group, an ethyl group, a propyl group, a butyl group, and a pentyl group can be exemplified.

As the cycloalkyl group represented by $R_{204}$ and $R_{205}$, a cycloalkyl group having from 3 to 10 carbon atoms, e.g., a cyclopentyl group, a cyclohexyl group, and a norbornyl group can be preferably exemplified.

$R_{204}$ and $R_{205}$ may have a substituent. As the substituents of $R_{204}$ and $R_{205}$, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

As the compound capable of generating the compound represented by formula (PA-I), (PA-II) or (PA-III) upon irradiation with actinic ray or radiation, the compound represented by formula (PA1) is preferred, and the compound represented by any of formulae (A1a) to (A1c) are more preferred.

Compound (PA) decomposes upon irradiation with actinic ray or radiation to generate, e.g., the compound represented by formula (PA-1) or (PA-2).

The compound represented by formula (PA-1) is a compound whose proton accepting property is lowered or vanished, or the compound is changed from proton acceptive to acidic as compared with compound (PA) by having a sulfo group or a carboxyl group together with a proton accepting functional group.

The compound represented by formula (PA-2) is a compound whose proton accepting property is lowered or vanished, or the compound is changed from proton acceptive to acidic as compared with compound (PA) by having an organic sulfonylimino group or an organic carbonylimino group together with a proton accepting functional group.

In the invention, that proton accepting property lowers means that when a non-covalent complex of the proton adduct is formed from a compound having a proton accepting functional group and a proton, the equilibrium constant in the chemical equilibrium decreases.

Proton accepting property can be confirmed by measuring pH.

The specific examples of compounds (PA) capable of generating the compound represented by formula (PA-I) upon irradiation with actinic ray or radiation are shown below, but the invention is not restricted to these compounds.

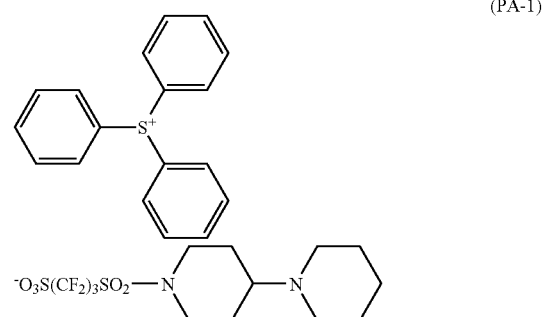

(PA-1)

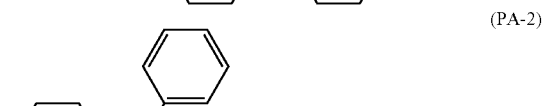

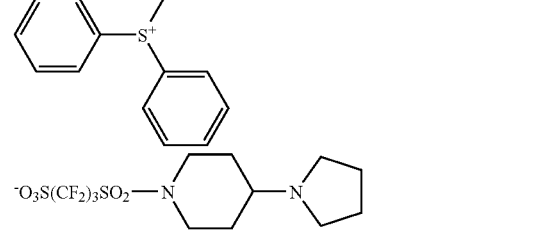

(PA-2)

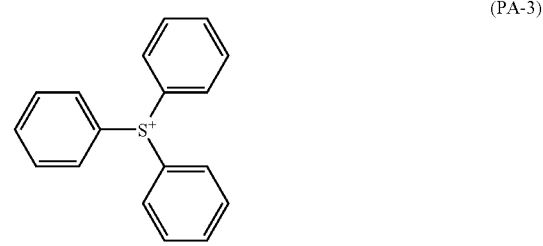

(PA-3)

-continued
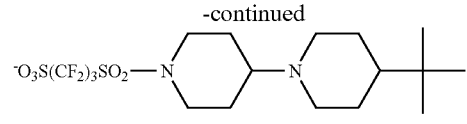
(PA-4)
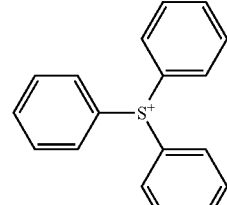
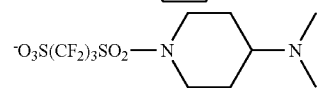
(PA-5)
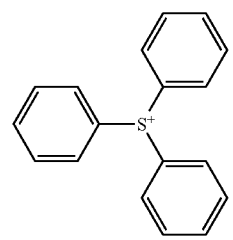 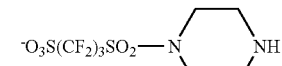
(PA-6)
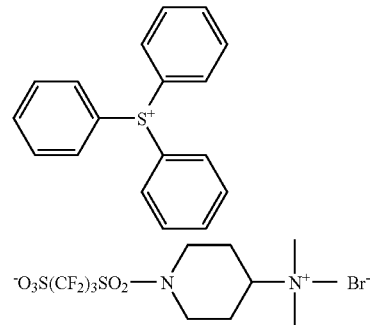
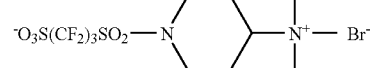
(PA-7)
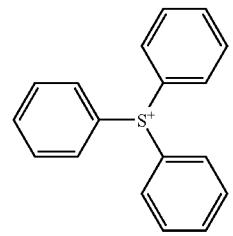
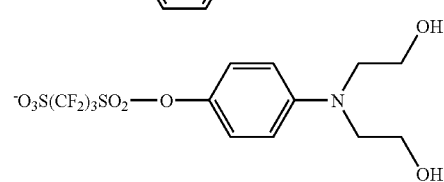
(PA-8)
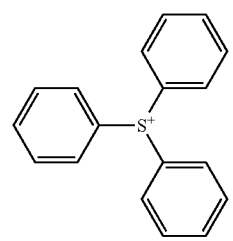
-continued
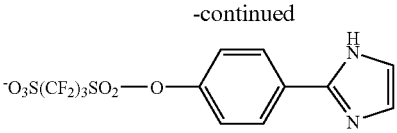
(PA-9)
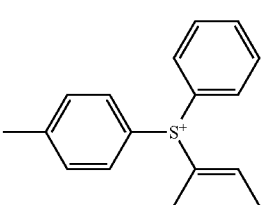
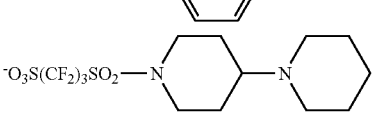
(PA-10)
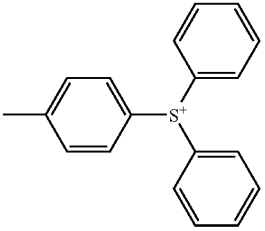
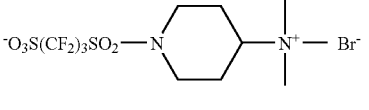
(PA-11)
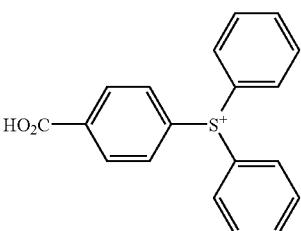
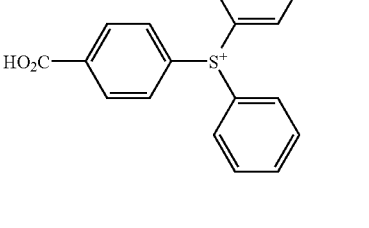
(PA-12)
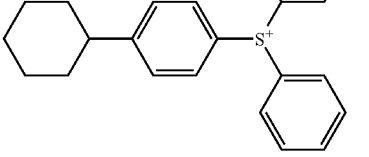
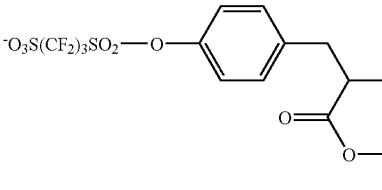

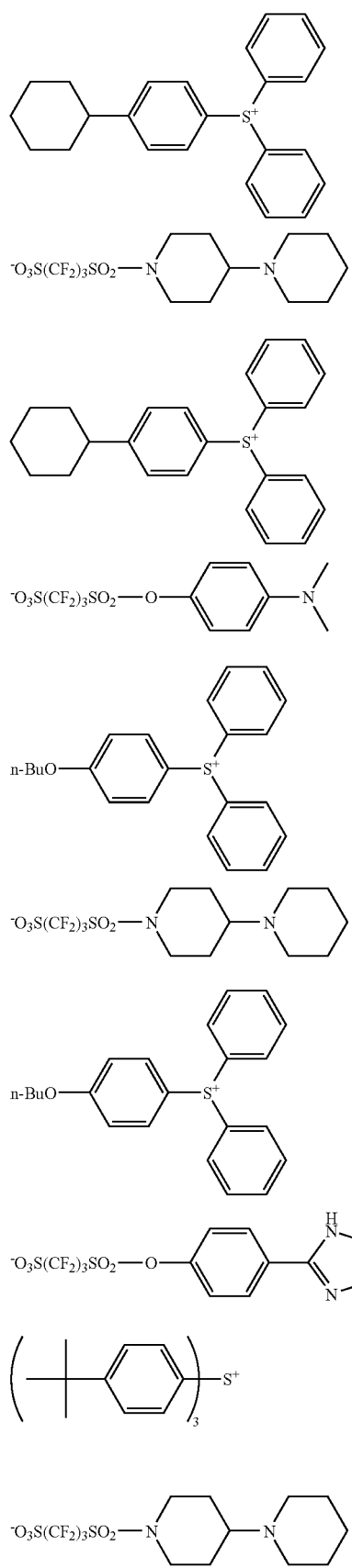

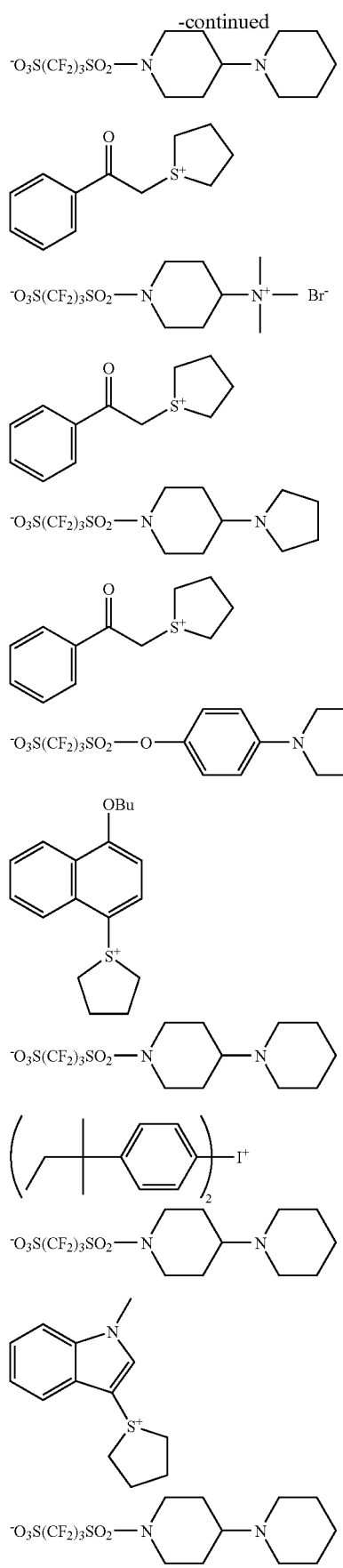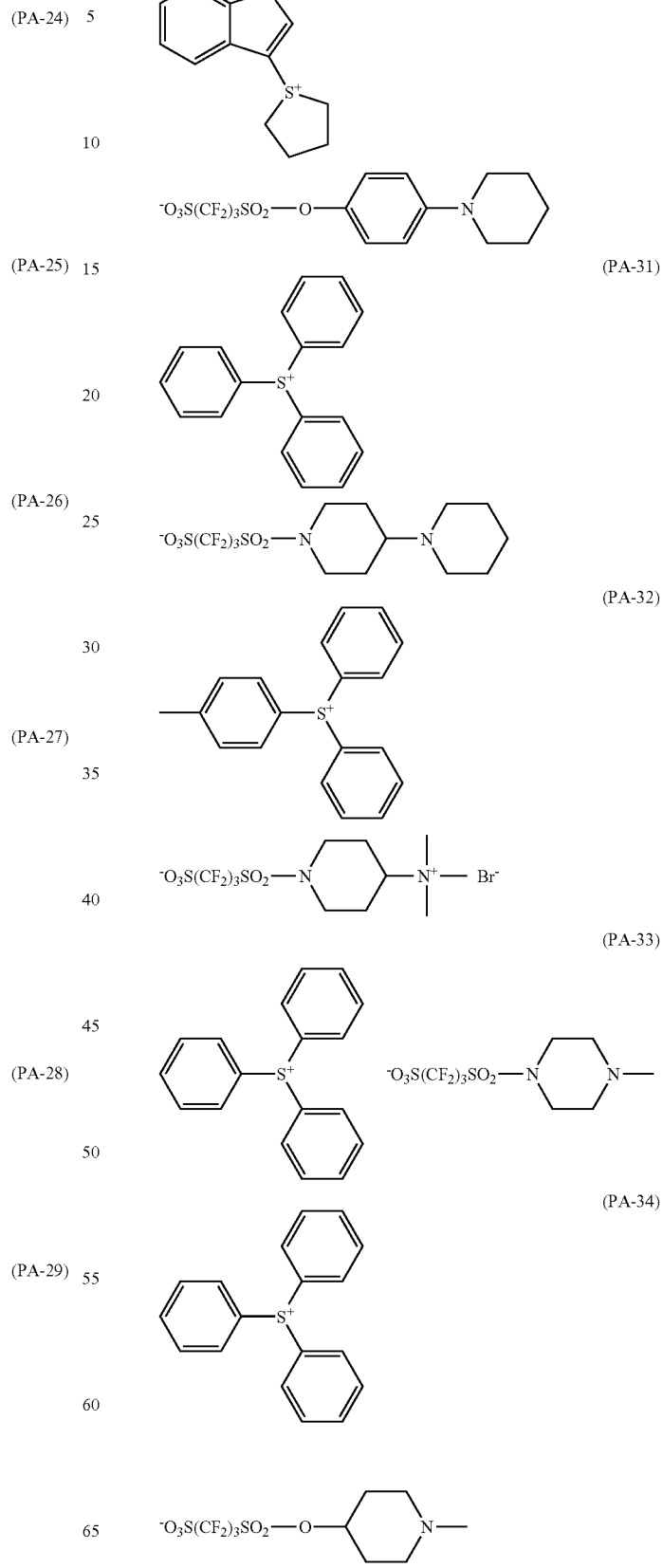

(PA-35)
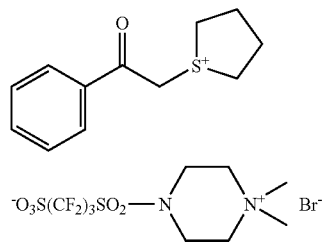
(PA-36)
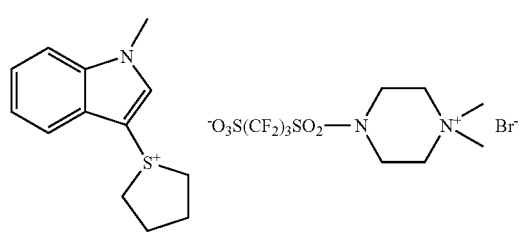
(PA-37)
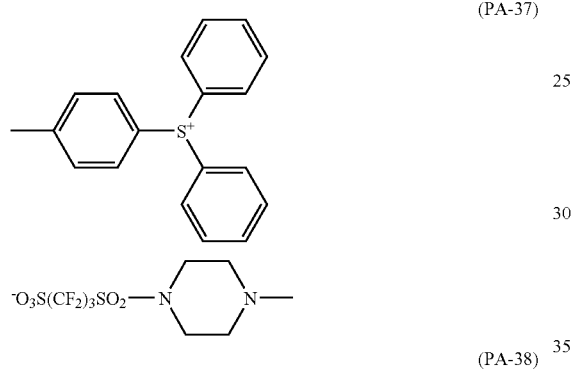
(PA-38)
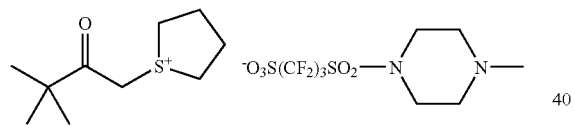
(PA-39)
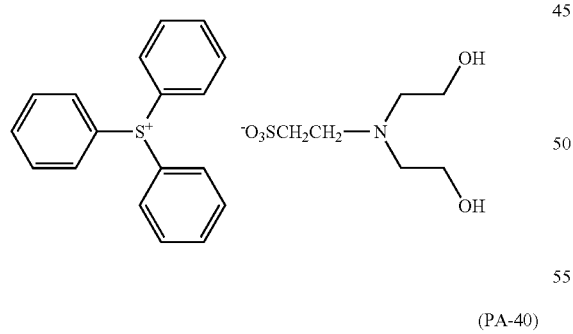
(PA-40)
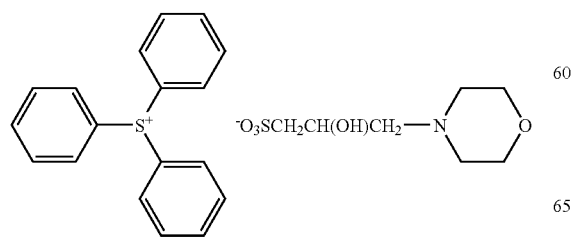
(PA-41)
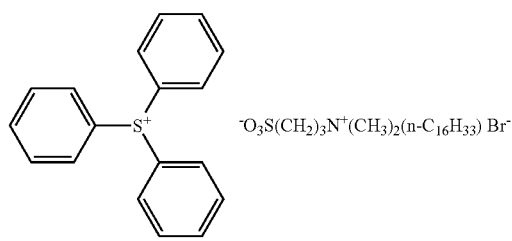
(PA-42)
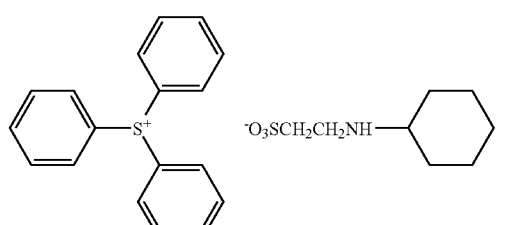
(PA-43)
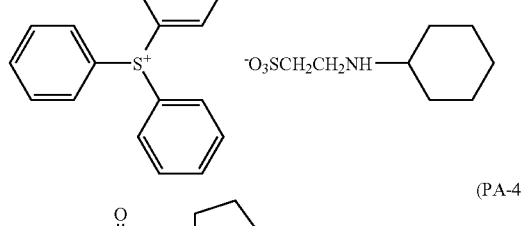
(PA-44)
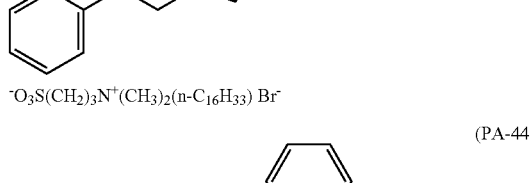
(PA-45)
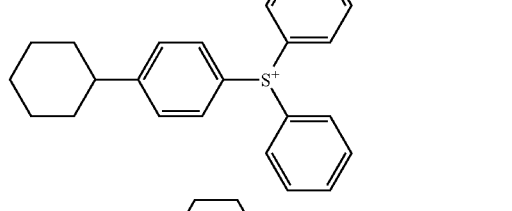
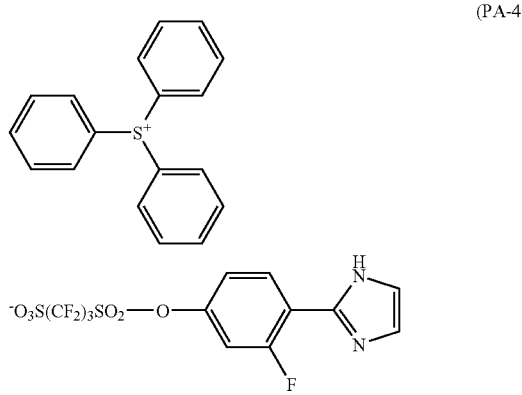
(PA-46)
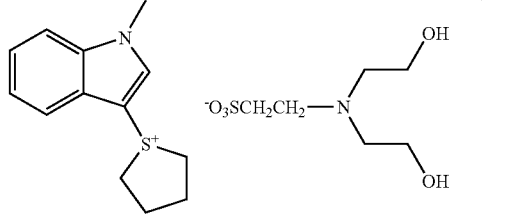

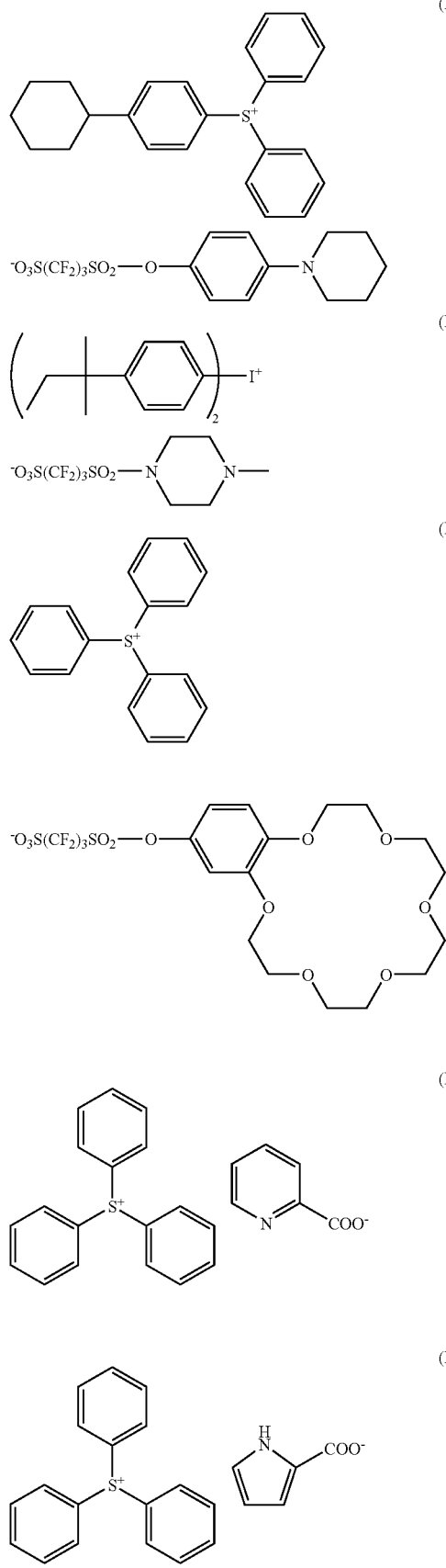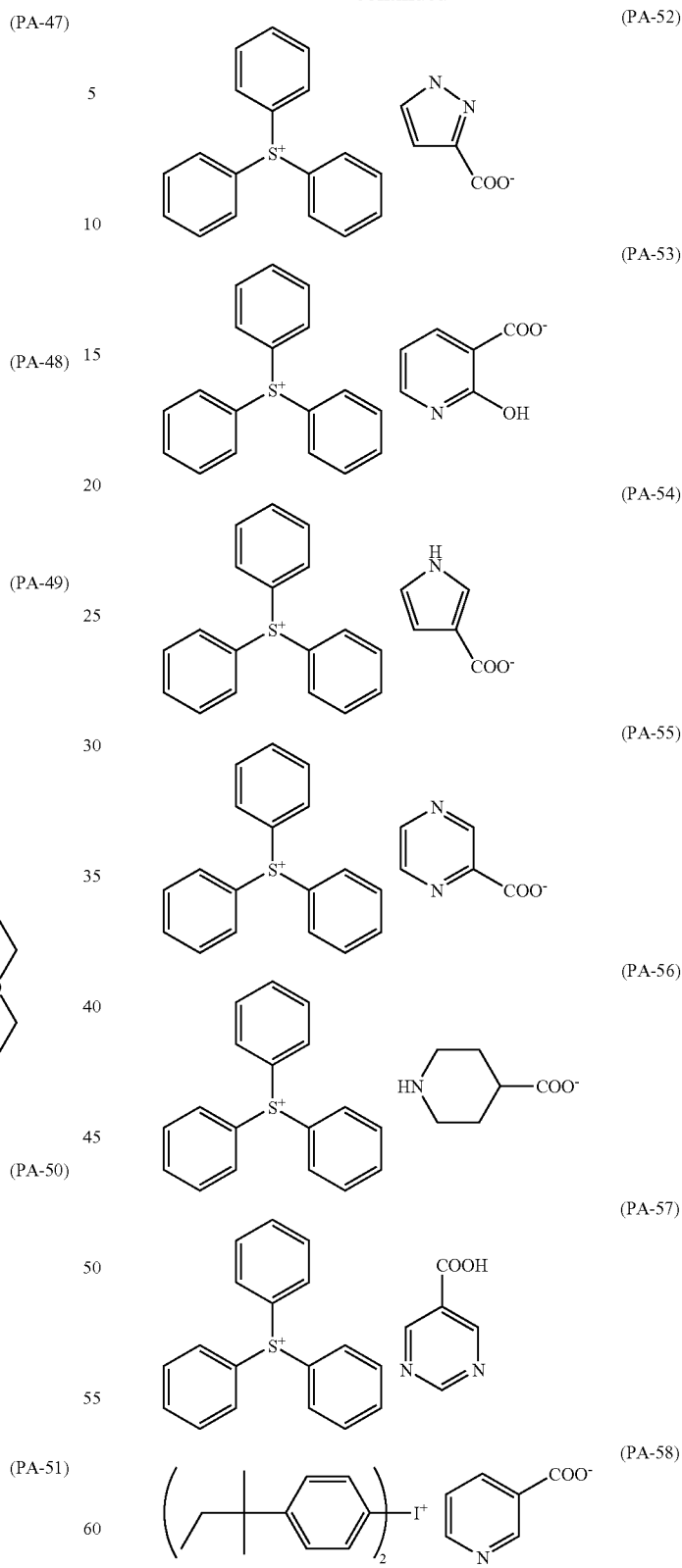
These compounds can be easily synthesized from the compound represented by formula (PA-I) or lithium, sodium or potassium salt thereof and hydroxide, bromide or chloride of iodonium or sulfonium according to salt exchange methods disclosed in (the term "JP-T" as used herein refers to a "published Japanese translation of a PCT patent application") and JP-A-2003-246786.

The specific examples of compounds (PA) capable of generating the compound represented by formula (PA-II) upon irradiation with actinic ray or radiation are shown below, but the invention is not restricted to these compounds.

(PA-59)
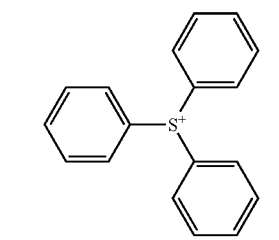

(PA-60)
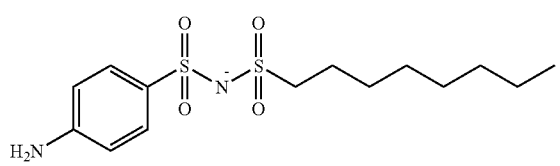

(PA-61)
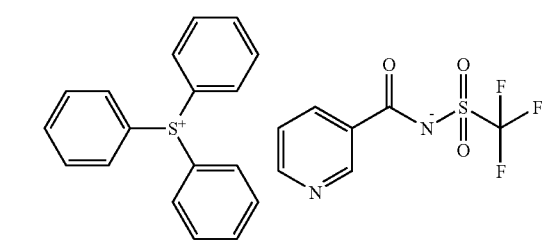

(PA-62)
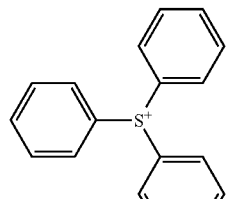

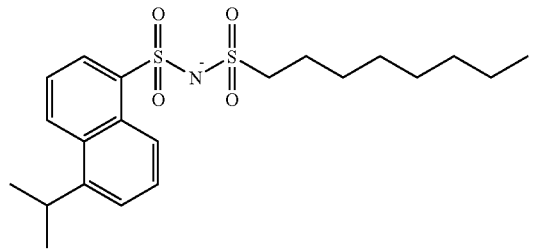

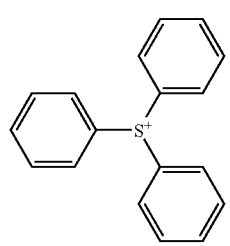

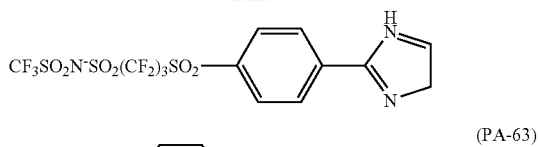

(PA-63)

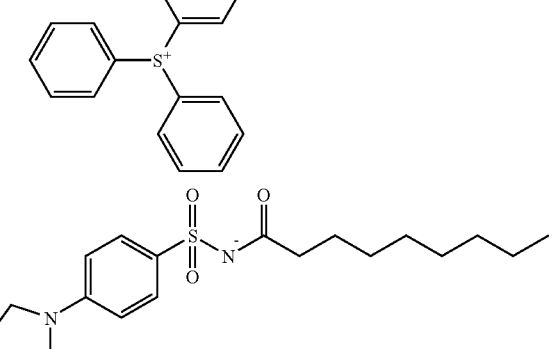

(PA-64)
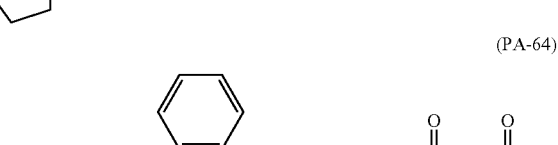

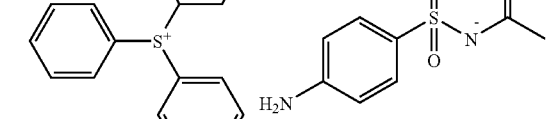

(PA-65)
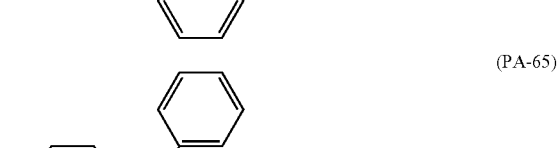

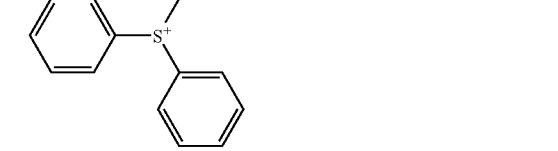

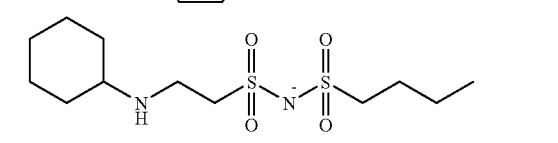

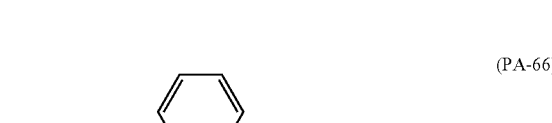

(PA-66)
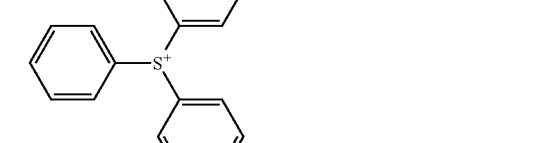

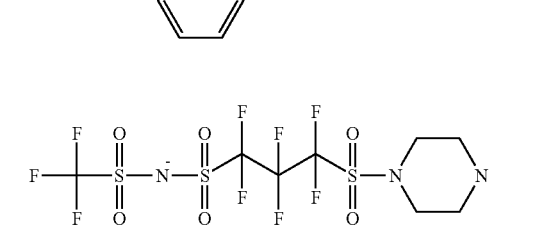

(PA-67)
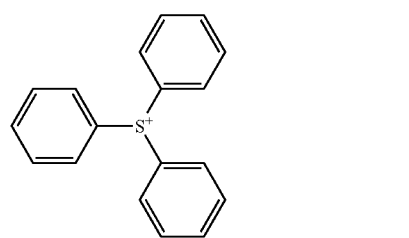
(PA-68)
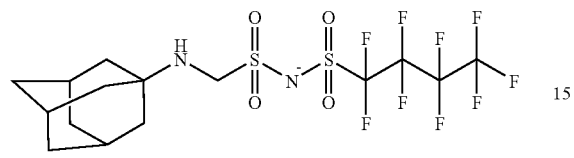
(PA-69)
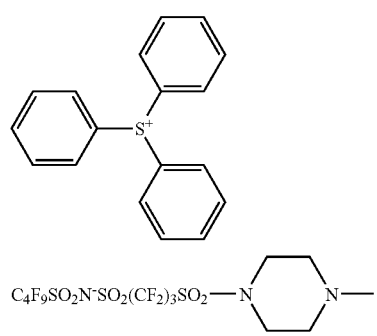
(PA-70)
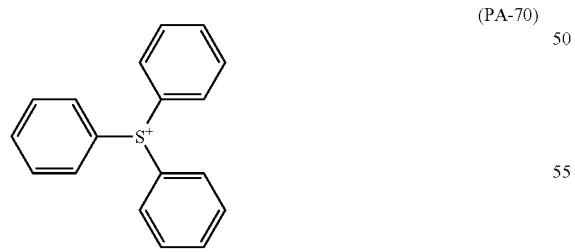
(PA-71)
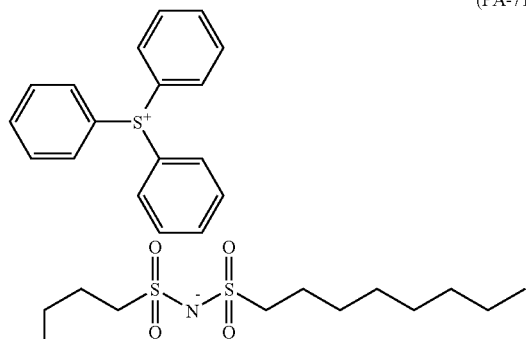
(PA-72)
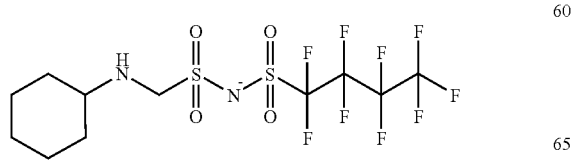
(PA-73)
(PA-74)
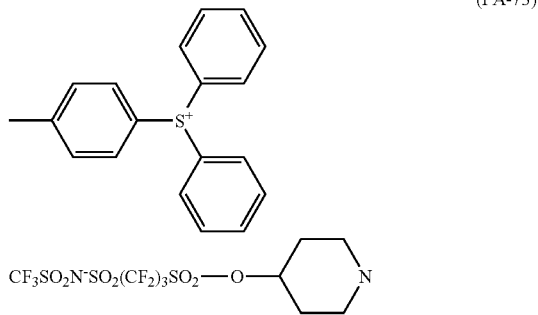
(PA-75)
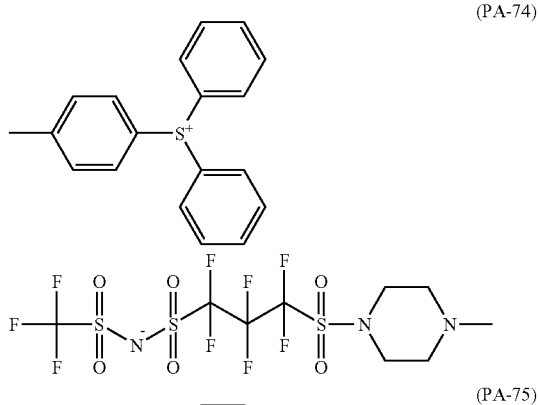

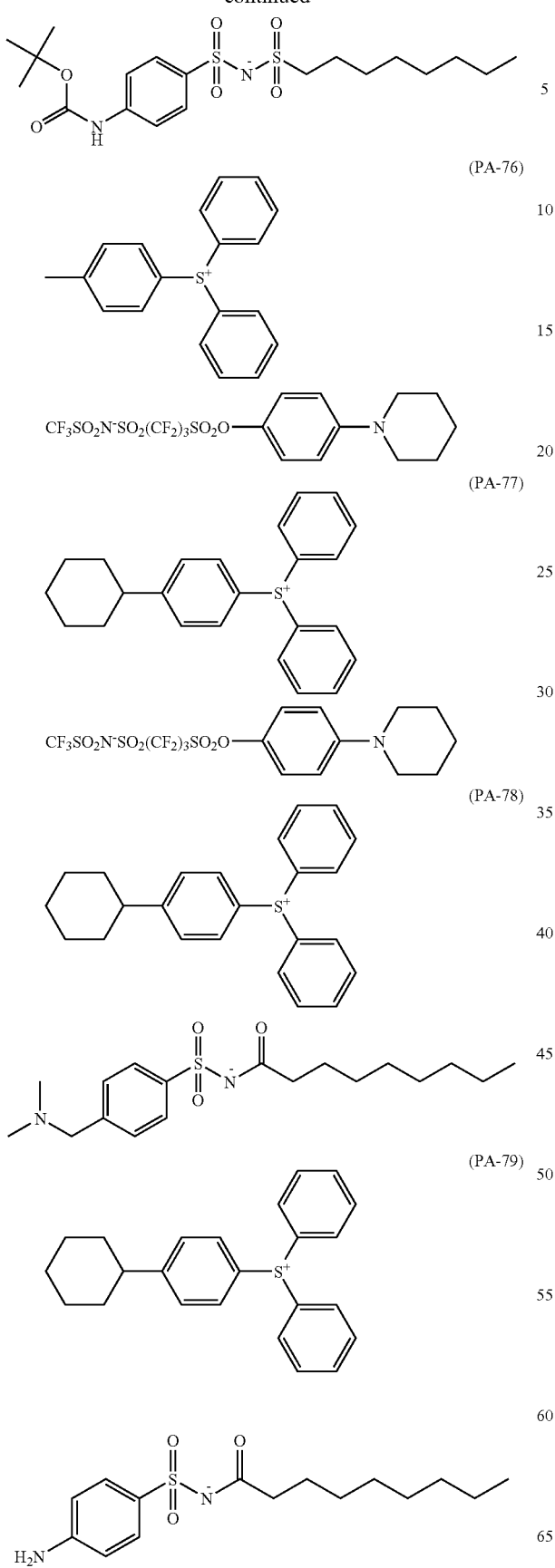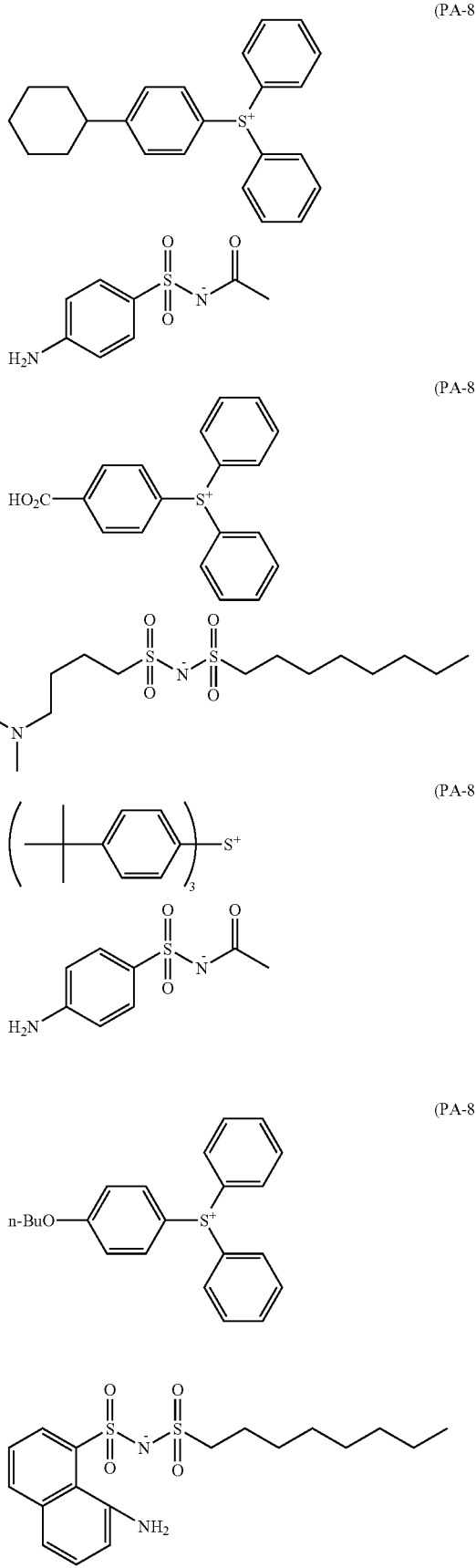

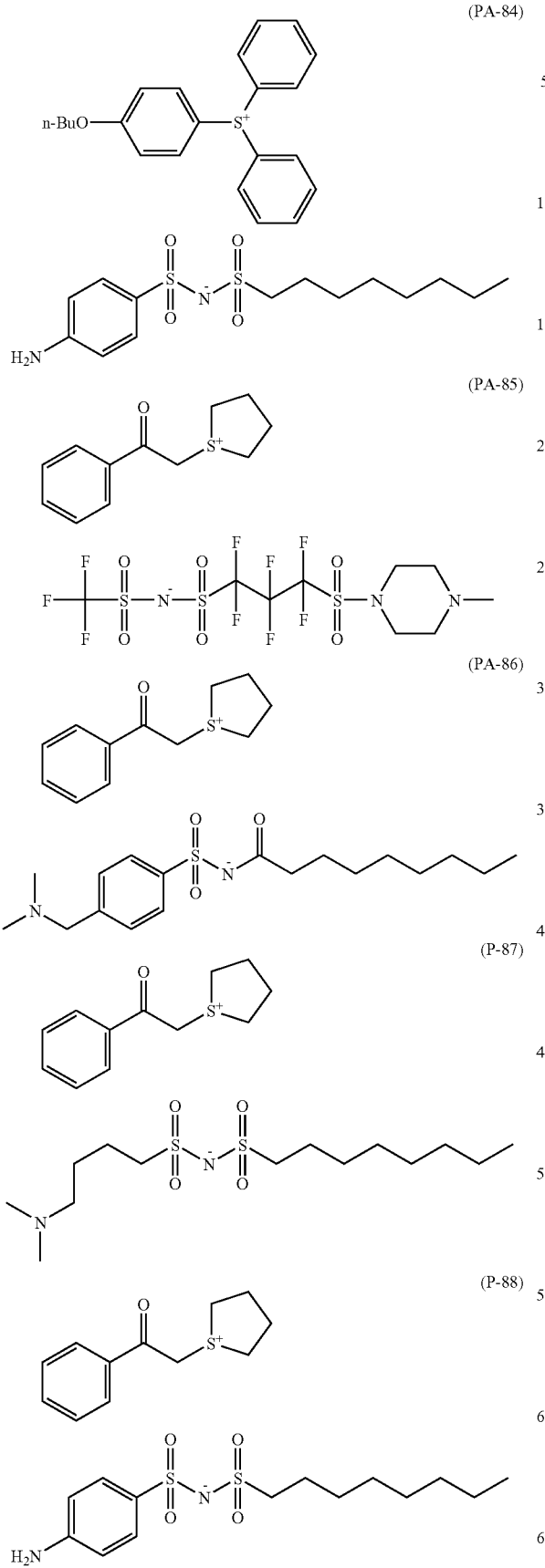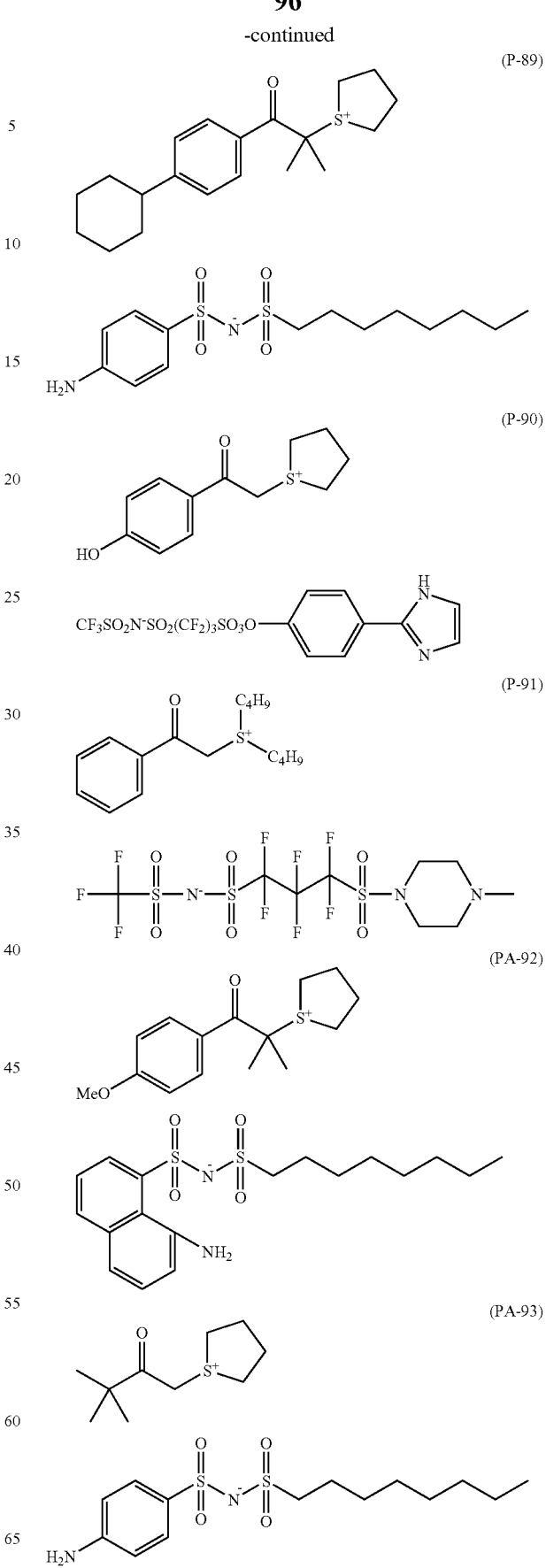

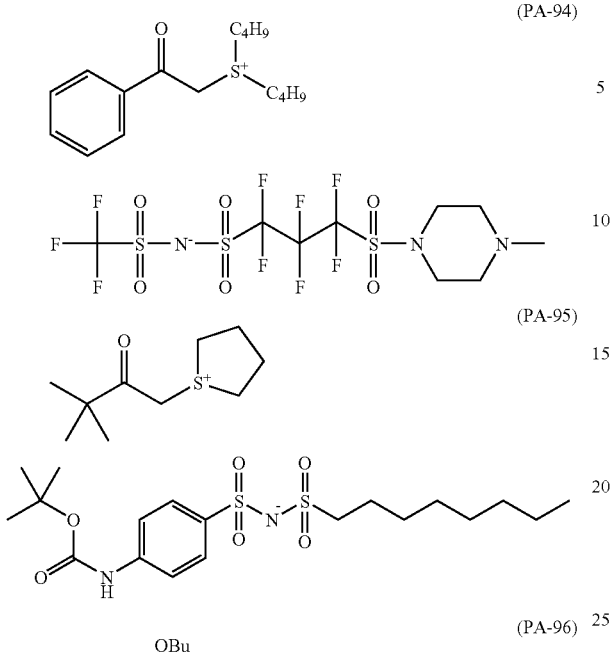
(PA-94)
(PA-95)
(PA-96)
(PA-97)
(PA-98)
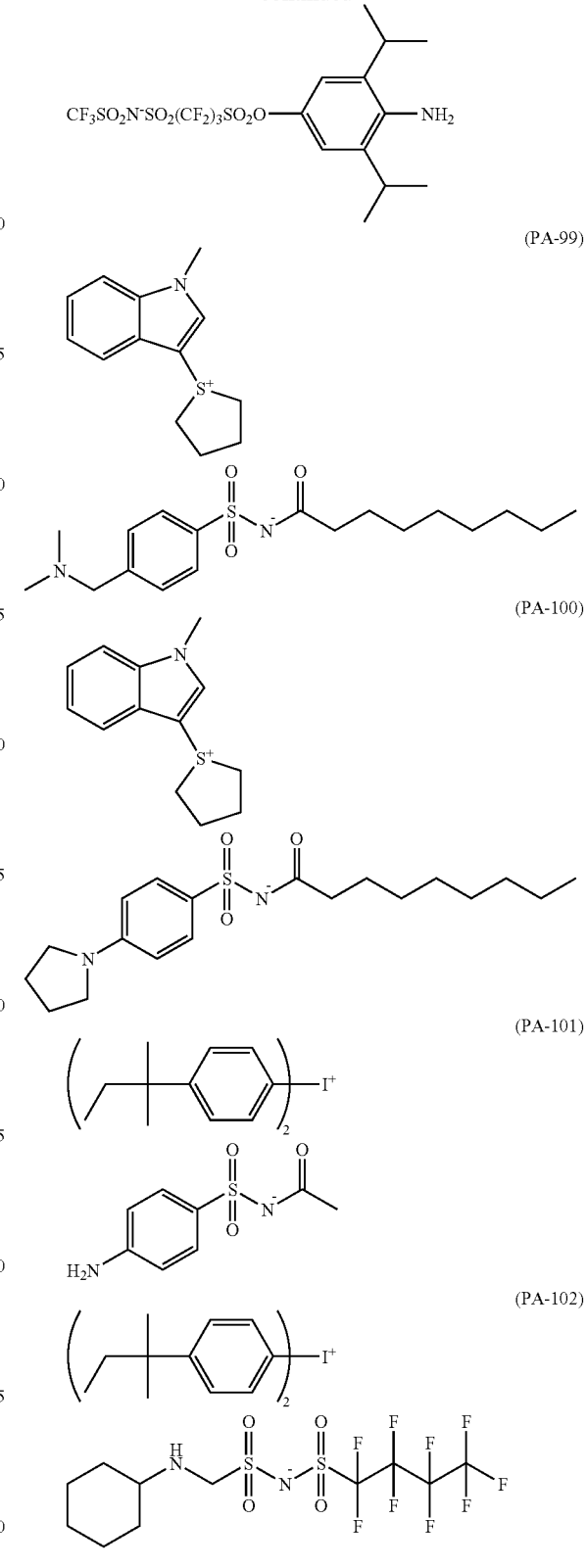
(PA-99)
(PA-100)
(PA-101)
(PA-102)
These compounds can be easily synthesized by ordinary sulfonic acid esterification reaction or sulfonamidation reaction. For example, the compound can be obtained by a method of reacting the sulfonyl halide portion on the one side of a bissulfonyl halide compound selectively with amine containing the partial structure represented by formula (PA-II) and alcohol to form a sulfonamide bond and a sulfonate bond, and then hydrolyzing the sulfonyl halide portion on the other side, or a method of ring opening a cyclic sulfonic acid anhydride with amine containing the partial structure represented by formula (PA-II) and alcohol. Amine containing the partial structure represented by formula (PA-II) and alcohol can be synthesized by reacting amine and alcohol with anhydride such as $(R'O_2C)_2O$ or $R'O_2CCl$ and an acid chloride compound under basic condition.

The content of compound (PA) in the positive resist composition of the invention is preferably from 0.1 to 20 mass % based on the solid content of the composition, and more preferably from 0.1 to 10 mass %.

[4] Organic Basic Compounds:

The organic basic compound contained in the resist composition of the invention is preferably a compound stronger in basicity than phenol. The molecular weight of the organic basic compound is generally from 100 to 900, preferably from 150 to 800, and more preferably from 200 to 700. A nitrogen-containing basic compound is especially preferably used in the invention.

The preferred nitrogen-containing basic compound is a compound having any of the following structures (A) to (E) as preferred chemical environment. Formulae (B) to (E) may be a part of a cyclic structure.

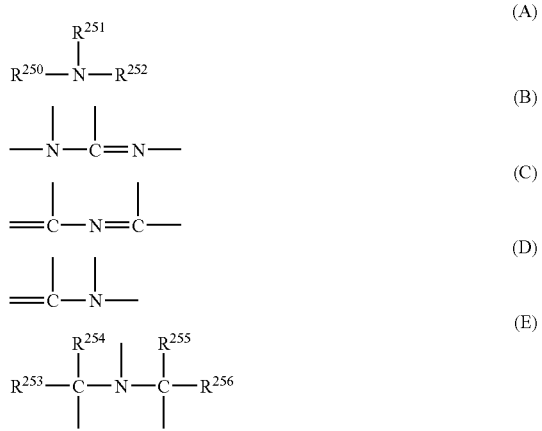

In formula (A), $R^{250}$, $R^{251}$ and $R^{252}$, which may be the same or different, each represents a hydrogen atom, an alkyl group (preferably having from 1 to 20 carbon atoms), a cycloalkyl group (preferably having from 3 to 20 carbon atoms), or an aryl group (preferably having from 6 to 20 carbon atoms), and $R^{251}$ and $R^{252}$ may be bonded to each other to form a ring.

The alkyl group may be unsubstituted or substituted, and the substituted alkyl group is preferably an aminoalkyl group having from 1 to 6 carbon atoms, or a hydroxyalkyl group having from 1 to 6 carbon atoms.

$R^{253}$, $R^{254}$, $R^{255}$ and $R^{256}$, which may be the same or different, each represents an alkyl group having from 1 to 6 carbon atoms.

More preferred compounds are nitrogen-containing basic compounds having two or more nitrogen atoms of different chemical environments in a molecule, and especially preferred compounds are compounds containing both of a substituted or unsubstituted amino group and a cyclic structure containing a nitrogen atom, or compounds having an alkylamino group.

Further, at least one kind of nitrogen-containing compound selected from an amine compound having a phenoxy group, an ammonium salt compound having a phenoxy group, an amine compound having a sulfonate group, and an ammonium salt compound having a sulfonate group can be exemplified.

As the amine compound, primary, secondary and tertiary amine compounds can be used, and an amine compound having at least one alkyl group bonding to the nitrogen atom is preferred. The amine compound is more preferably a tertiary amine compound. As the amine compound, a cycloalkyl group (preferably having from 3 to 20 carbon atoms) or an aryl group (preferably having from 6 to 12 carbon atoms) may be bonded to the nitrogen atom besides an alkyl group so long as at least one alkyl group (preferably having from 1 to 20 carbon atoms) is bonded to the nitrogen atom. It is preferred that the amine compound has an oxygen atom in the alkyl chain to form an oxyalkylene group. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred.

As the ammonium salt compound, primary, secondary, tertiary and quaternary ammonium salt compounds can be used, and an ammonium salt compound having at least one alkyl group bonding to the nitrogen atom is preferred. As the ammonium salt compound, a cycloalkyl group (preferably having from 3 to 20 carbon atoms) or an aryl group (preferably having from 6 to 12 carbon atoms) may be bonded to the nitrogen atom besides an alkyl group so long as at least one alkyl group (preferably having from 1 to 20 carbon atoms) is bonded to the nitrogen atom. It is preferred that the ammonium salt compound has an oxygen atom in the alkyl chain to form an oxy-alkylene group. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred. As the anion of the ammonium salt compound, a halogen atom, sulfonate, borate, phosphate and the like are exemplified, and a halogen atom and sulfonate are especially preferred. As the halogen atom, chloride, bromide and iodide are especially preferred, and organic sulfonate having from 1 to 20 carbon atoms is especially preferred as the sulfonate. As the organic sulfonate, alkylsulfonate having from 1 to 20 carbon atoms and arylsulfonate are exemplified. The alkyl group of the alkylsulfonate may have a substituent, e.g., fluorine, chlorine, bromine, an alkoxyl group, an acyl group, an aryl group and the like are exemplified. As the alkylsulfonate, methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate are specifically exemplified. As the aryl group of the arylsulfonate, a benzene ring, a naphthalene ring, and an anthracene ring are exemplified. The benzene ring, naphthalene ring and anthracene ring may have a substituent, and, e.g., a straight chain or branched alkyl group having from 1 to 6 carbon atoms and a cycloalkyl group having from 3 to 6 carbon atoms are preferred as the substituents. As the straight chain or branched alkyl group and cycloalkyl group, methyl, ethyl, n-propyl, isopropyl, n-butyl, i-butyl, t-butyl, n-hexyl and cyclohexyl are specifically exemplified. As other substituents, an alkoxyl group having from 1 to 6 carbon atoms, a halogen atom, a cyano group, a nitro group, an acyl group and an acyloxy group are exemplified.

The amine compound having a phenoxy group and the ammonium salt compound having a phenoxy group are those each having a phenoxy group at terminals on the opposite side to the nitrogen atom of the alkyl group of the amine compound and the ammonium salt compound. The phenoxy group may have a substituent. As the substituent of the phenoxy group, e.g., an alkyl group, an alkoxyl group, a halogen atom, a cyano group, a nitro group, a carboxyl group, a carboxylate group, a sulfonate group, an aryl group, an aralkyl group, an acyloxy group and an aryloxy group are exemplified. The substituent may be substituted anywhere from 2- to 6-positions. The number of the substituent may be any in the range of from 1 to 5.

It is preferred to have at least one oxyalkylene group between the phenoxy group and the nitrogen atom. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred.

In the amine compound having a sulfonate group and the ammonium salt compound having a sulfonate group, the sulfonate group may be any of alkylsulfonate, cycloalkylsulfonate and arylsulfonate. It is preferred that in the case of alkylsulfonate, the alkyl group has from 1 to 20 carbon atoms, in the case of cycloalkylsulfonate, the cycloalkyl group has from 3 to 20 carbon atoms, and in the case of arylsulfonate, the aryl group has from 6 to 12 carbon atoms. Each of the alkylsulfonate, cycloalkyl-sulfonate and arylsulfonate may have a substituent, and, e.g., a halogen atom, a cyano group, a nitro group, a carboxyl group, a carboxylate group and a sulfonate group are preferred as the substituents.

It is preferred to have at least one oxyalkylene group between the sulfonate group and the nitrogen atom. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred.

As preferred specific examples of basic compounds, guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine are exemplified. These compounds may have a substituent, and as preferred substituents, an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group, and a cyano group are exemplified.

As especially preferred compounds, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylamino-pyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-amino-pyrrolidine, piperazine, N-(2-aminoethyl)piperazine, N-(2-aminoethyl)-piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine are exemplified, but the invention is not restricted thereto.

Tetraalkylammonium salt type nitrogen-containing basic compounds can also be used. As such compounds, tetraalkylammonium hydroxide (e.g., tetramethyl-ammonium hydroxide, tetraethylammonium hydroxide, tetra(n-butyl) ammonium hydroxide, etc.) having from 1 to 8 carbon atoms are especially preferred. These nitrogen-containing basic compounds are used alone, or two or more compounds are used in combination.

The use proportion of an acid generator and an organic basic compound in a composition is preferably (an acid generator)/(an organic basic compound) (in a molar ratio) of from 1.0 to 300. That is to say, the molar ratio is preferably 1.0 or more in view of sensitivity and resolution, and in the point of the prevention of decrease in resolution due to thickening of a resist pattern by aging after exposure until heating treatment, it is preferably 300 or less. (An acid generator)/(an organic basic compound) (molar ratio) is more preferably from 1.5 to 200, and still more preferably from 2.0 to 150.

[5] Surfactant:

It is preferred for the resist composition in the invention to further contain either one, or two or more of fluorine and/or silicon surfactants (a fluorine surfactant and a silicon surfactant, a surfactant containing both a fluorine atom and a silicon atom).

By containing fluorine and/or silicon surfactants, it becomes possible for the resist composition in the invention to provide a resist pattern excellent in sensitivity and resolution, and low in defects in adhesion and development in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. Commercially available surfactants shown below can also be used as they are.

As commercially available fluorine or silicon surfactants that can be used in the invention, e.g., Eftop EF301 and EF303 (manufactured by Shin-Akita Kasei Co., Ltd.), Fluorad FC 430 and 431 (manufactured by Sumitomo 3M Limited), Megafac F171, F173, F176, F189, and R08 (manufactured by Dainippon Ink and Chemicals Inc.), Sarfron S-382, SC 101, 102, 103, 104, 105 and 106 (manufactured by ASAHI GLASS CO., LTD)., Troy Sol S-366 (manufactured by Troy Chemical Co., Ltd.) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. The fluoro-aliphatic compounds can be synthesized by the method disclosed in JP-A-2002-90991.

As the polymers having fluoro-aliphatic groups, copolymers of monomers having fluoro-aliphatic groups and at least one of (poly(oxyalkylene)) acrylate and (poly(oxyalkylene)) methacrylate are preferred, and they may be distributed at random or block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene) acrylate (or methacrylate) may be not only bipolymers but also terpolymers or higher polymers obtained by copolymerization of monomers having different two or more kinds of fluoro-aliphatic groups and different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly(oxypropylene)) acrylate (or methacrylate), copolymers of acrylate (or methacrylate) having a $C_8F_{17}$ group and (poly(oxyalkylene)) acrylate (or methacrylate), and copolymers of acrylate (or methacrylate) having a $C_8F_{17}$ group, (poly(oxyethylene)) acrylate (or methacrylate), and poly(oxypropylene) acrylate (or methacrylate) can be exemplified.

As preferred surfactant, a surfactant represented by the following formula (Da) can be exemplified.

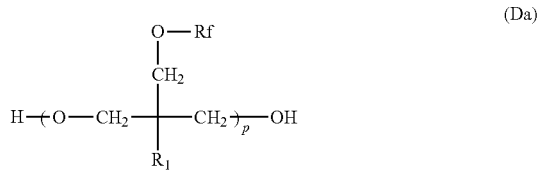

(Da)

In formula (Da), Rf represents a fluoroalkyl group.
$R_1$ represents a hydrogen atom or an alkyl group.
p represents an integer of from 1 to 30.

The fluoroalkyl group represented by Rf in formula (Da) is preferably a fluoroalkyl group having from 1 to 10 carbon atoms. All the hydrogen atoms of the fluoroalkyl group may be substituted with fluorine atoms, or a part of the hydrogen atoms may be substituted with fluorine atoms. The fluoroalkyl group may have an oxy group en route in the alkyl group. As the fluoroalkyl group represented by Rf, e.g., —$CF_3$, —$C_2F_5$, —$C_3F_7$, —$C_4F_9$, —$CH_2CF_3$, —$CH_2C_2F_5$, —$CH_2C_3F_7$, —$CH_2C_4F_9$, —$CH_2C_6F_{13}$, —$C_2H_4CF_3$, —$C_2H_4C_2F_5$, —$C_2H_4C_4F_9$, —$C_2H_4C_6F_{13}$, —$C_2H_4C_8F_{17}$, —$CH_2CH(CH_3)CF_3$, —$CH_2CH(CF_3)_2$, —$CH_2CF(CF_3)_2$, —$CH_2CH(CF_3)_2$, —$CF_2CF(CF_3)OCF_3$, —$CF_2CF(CF_3)OC_3F_7$, —$C_2H_4OCF_2CF(CF_3)OCF_3$, —$C_2H_4OCF_2CF(CF_3)OC_3F_7$, and —$C(CF_3)$=$C[CF(CF_3)_2]_2$ can be exemplified.

The alkyl group represented by $R_1$ is preferably a straight chain alkyl group having from 1 to 5 carbon atoms.

The specific examples of the surfactants represented by formula (Da) are shown below, but the invention is not restricted thereto.

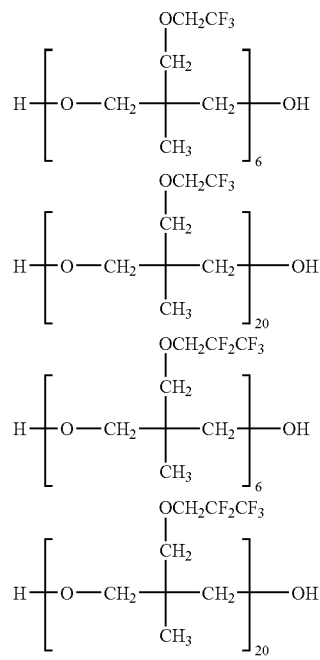

The addition amount of surfactants is preferably from 0.0001 to 2 mass % based on all the amount of the resist composition (excluding solvents), and more preferably from 0.001 to 1 mass %.

[6] Antioxidant:

It is preferred for the resist composition in the invention to contain an antioxidant.

The antioxidant is the one to prevent organic materials from being oxidized in the presence of oxygen.

The antioxidants to be used in the invention are not particularly restricted so long as they are effective in the inhibition of oxidation of generally used plastics and the like and, e.g., phenolic antioxidants, antioxidants comprising organic acid derivatives, sulfur-containing antioxidants, phosphorus antioxidants, amine antioxidants, antioxidants comprising amine-aldehyde condensation products, and antioxidants comprising amine-ketone condensation products are exemplified. Of these antioxidants, for the purpose of revealing the advantage of the invention without lowering the function of the resist, it is preferred to use phenolic antioxidants and antioxidants comprising organic acid derivatives.

As the phenolic antioxidants, for example, substituted phenols, e.g., 1-oxy-3-methyl-4-isopropylbenzene, 2,6-di-t-butylphenol, 2,6-di-t-butyl-4-ethylphenol, 2,6-di-t-butyl-4-methylphenol, 4-hydroxymethyl-2,6-di-t-butylphenol, butylhydroxyanisole, 2-(1-methylcyclohexyl)-4,6-dimethylphenol, 2,4-dimethyl-6-t-butylphenol, 2-methyl-4,6-dinonylphenol, 2,6-di-t-butyl-α-dimethylamino-p-cresol, 6-(4-hydroxy-3,5-di-t-butyl-anilino)-2,4-bis-octyl-thio-1,3, 5-triazine, n-octadecyl-3-(4'-hydroxy-3',5'-di-t-butylphenyl) propionate, octylated phenol, aralkyl-substituted phenols, alkylated p-cresol, and hindered phenol are exemplified, and bis, tris, polyphenols, e.g., 4,4'-dihydroxydiphenol, methylene-bis(dimethyl-4,6-phenol), 2,2'-methylene-bis(4-methyl-6-t-butylphenol), 2,2'-methylene-bis(4-methyl-6-cyclohexylphenol), 2,2'-methylene-bis(4-ethyl-6-t-butylphenol), 4,4'-methylene-bis(2,6-di-t-butylphenol), 2,2'-methylene-bis(6-α-methyl-benzyl-p-cresol), methylene-crosslinked polyhydric alkylphenol, 4,4'-butylidene-bis(3-methyl-6-t- butylphenol), 1,1-bis(4-hydroxyphenyl)-cyclohexane, 2,2'-dihydroxy-3,3'-di(α-methylcyclohexyl)-5,5'-dimethyldiphenyl-methane, alkylated bisphenol, hindered bisphenol, 1,3,5-trimethyl-2,4,6-tris(3,5-di-t-butyl-4-hydroxybenzyl) benzene, tris(2-methyl-4-hydroxy-5-t-butylphenyl)butane, tetrakis[methylene-3-(3',5'-di-t-butyl-4'-hydroxyphenyl) propionate]methane are exemplified, and further, commercially available antioxidants can be used as they are. As the commercially available antioxidant, Irganox (manufactured by Ciba Specialty Chemicals Inc.) is exemplified.

The specific preferred examples of antioxidants for use in the invention include 2,6-di-t-butyl-4-methylphenol, 4-hydroxymethyl-2,6-di-t-butylphenol, 2,2'-methylenebis(4-methyl-6-t-butylphenol), butylhydroxyphenol, t-butylhydroquinone, 2,4,5-trihydroxybutyrophenone, nordihydroguaiaretic acid, propyl gallate, octyl gallate, lauryl gallate, and isopropyl citrate. Of these antioxidants, 2,6-di-t-butyl-4-methyl-phenol, 4-hydroxymethyl-2,6-di-t-butylphenol, butyl-hydroxyanisole and t-butyl-hydroquinone are preferred, and 2,6-di-t-butyl-4-methylphenol and 4-hydroxymethyl-2,6-di-t-butylphenol are more preferred.

The content of antioxidants is preferably 1 ppm or more in chemical amplification resist composition, more preferably 5 ppm or more, still more preferably 10 ppm or more, yet preferably 50 ppm or more, still yet preferably 100 ppm or more, and especially preferably from 100 to 10,000 ppm. Two or more antioxidants may be used as mixture.

[7] Solvent

The above components of the resist composition in the invention are dissolved in a solvent and coated on a support. The concentration of the solids content of all the resist composition is generally preferably from 2 to 30 mass %, and more preferably from 3 to 25 mass %.

As the solvents used here, solvents containing at least one of propylene glycol monoalkyl ether carboxylate, propylene glycol monoalkyl ether, alkyl lactate, acetate, alkyl alkoxypropionate, chain ketone and cyclic ketone are preferred.

As the propylene glycol monoalkyl ether carboxylate, propylene glycol monomethyl ether acetate, propylene glycol monomethyl ether propionate, and propylene glycol monoethyl ether acetate are preferred.

As the propylene glycol monoalkyl ether, propylene glycol monomethyl ether and propylene glycol monoethyl ether are preferred.

As the alkyl lactate, ethyl lactate and butyl lactate are preferred.

As the acetate, butyl acetate is preferred.

As the alkyl alkoxypropionate, methoxy methylpropionate and ethoxy ethylpropionate are preferred.

As the chain ketone, methyl amyl ketone is preferred.

As the cyclic ketone, cyclohexanone, γ-butyrolactone, and propylene carbonate are preferred.

The above solvents may be used by one kind alone, or may be used in combination.

As the solvents to be combined, it is preferred to combine propylene glycol monomethyl ether acetate with propylene glycol monomethyl ether, ethyl lactate, butyl acetate, ethoxy ethylpropionate, or methyl amyl ketone.

[8] Other Components

The resist composition in the invention can further contain a dye and a photo-base generator, if necessary.

1. Dyes:

A dye can be used in the invention.

As preferred dyes, oil dyes and basic dyes are exemplified. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Chemical Industries, Ltd.), Crystal Violet (C.I. 42555), Methyl Violet (C.I. 42535), Rhodamine B (C.I. 45170B), Malachite Green (C.I. 42000), Methylene Blue (C.I. 52015), etc., can be exemplified.

2. Photo-Base Generators:

As photo-base generators that can be added to the resist composition in the invention, the compounds disclosed in JP-A-4-151156, JP-A-4-162040, JP-A-5-197148, JP-A-5-5995, JP-A-6-194834, JP-A-8-146608, JP-A-10-83079, and EP 622,682 can be exemplified. Specifically, 2-nitrobenzylcarbamate, 2,5-dinitrobenzyl-cyclohexylcarbamate, N-cyclohexyl-4-methylphenylsulfonamide, and 1,1-dimethyl-2-phenylethyl-N-isopropylcarbamate can be preferably used. These photo-base generators are added for the purpose of the improvement of resist form and the like.

[9] Pattern-Forming Method:

The resist composition in the invention is coated on a substrate to form a thin film. The thickness of the coated film is preferably from 0.05 to 4.0 μm.

In the invention, if necessary, commercially available inorganic or organic antireflection films can be used. It is also possible to coat antireflection films as the upper and lower layers of the resist.

As antireflection films used as the lower layer of the resist, both of an inorganic film type, e.g., titanium, titanium dioxide, titanium nitride, chromium oxide, carbon, amorphous silicon, etc., and an organic film type, e.g., films comprising light absorbers and polymer materials can be used. The former necessitates equipments such as a vacuum evaporation apparatus, a CVD apparatus, or a sputtering apparatus in film forming. As organic antireflection films, e.g., those comprising condensation products of diphenylamine derivatives and formaldehyde-modified melamine resins, alkali-soluble resins and light absorbers as disclosed in JP-B-7-69611 (the term "JP-B" as used herein refers to an "examined Japanese patent publication"), reaction products of maleic anhydride copolymers and diamine-type light absorbers as disclosed in U.S. Pat. No. 5,294,680, antireflection films containing resin binders and methylolmelamine series thermal crosslinking agents as disclosed in JP-A-6-118631, acrylic resin type antireflection films having a carboxylic acid group, an epoxy group and a light-absorbing group in the same molecule as disclosed in JP-A-6-118656, antireflection films comprising methylolmelamine and benzophenone series light absorbers as disclosed in JP-A-8-87115, and antireflection films obtained by adding low molecular weight light absorbers to polyvinyl alcohol resins as disclosed in JP-A-8-179509 are exemplified.

As organic antireflection films, commercially available products such as DUV-30 series and DUV-40 series manufactured by Brewer Science, and AR-2, AR-3 and AR-5 manufactured by Shipley Co. can also be used.

As organic antireflection films for the upper layer of the resist, organic antireflection films such as AQUATAR-II, AQUATAR-III and AQUATAR-VII manufactured by AZ Electronic Materials can also be used.

In a pattern-forming process on a resist film in the manufacture of precision integrated circuit elements, the positive resist composition of the invention is coated on a substrate (e.g., a silicon/silicon dioxide coated substrate, a glass substrate, an ITO substrate, a quartz/chromium oxide coated substrate, etc.) to form a resist film, and the resist film is irradiated with actinic ray or radiation such as KrF excimer laser beams, electron beams, EUV rays, etc., heating, development, rinsing, and drying, whereby a good resist pattern can be formed.

As alkali developing solutions for use in the development process, alkali aqueous solutions (generally from 0.1 to 20 mass %) of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, choline, etc., and cyclic amines, e.g., pyrrole, piperidine, etc., can be used. An appropriate amount of alcohols, e.g., isopropyl alcohol, etc., and nonionic surfactants may be added to the aqueous solutions of the alkalis.

Of these developing solutions, quaternary ammonium salts are preferred, and tetramethylammonium hydroxide and choline are more preferred.

The pH of the alkali developing solution is generally from 10 to 15.

EXAMPLE

The invention will be described in further detail with reference to examples, however the invention is by no means restricted thereto.

The polymers used in Examples and Comparative Examples are listed in Table 1 below.

In Tables hereafter "–" means that the corresponding compound is not added.

TABLE 1

| Resin | Weight Average Molecular Weight | Unit of Composition | | | Ratio of Composition | | | Polydispersity |
|---|---|---|---|---|---|---|---|---|
| | | (I) | (II) | (III) | (I) | (II) | (III) | |
| A-1 | 15,000 | I-1 | II-18 | III-1 | 30 | 10 | 60 | 1.35 |
| A-2 | 12,000 | I-3 | II-18 | III-1 | 21 | 12 | 67 | 1.35 |
| A-3 | 12,000 | I-1 | II-13 | III-2 | 20 | 12 | 68 | 1.25 |
| A-4 | 8,000 | I-19 | II-58 | III-1 | 25 | 10 | 65 | 1.40 |
| A-5 | 15,000 | I-1 | II-25 | III-1 | 26 | 5 | 69 | 1.60 |
| A-6 | 10,000 | I-28 | II-25 | III-1 | 20 | 4 | 76 | 1.65 |
| A-7 | 13,000 | I-44 | II-25 | III-1 | 29 | 7 | 64 | 1.45 |
| A-8 | 9,000 | I-1 | II-39 | III-1 | 30 | 15 | 55 | 1.40 |
| A-9 | 13,000 | I-1 | II-40 | III-1 | 28 | 10 | 62 | 1.55 |
| A-10 | 10,000 | I-28 | II-40 | III-1 | 32 | 6 | 62 | 1.30 |
| A-11 | 18,000 | I-1 | II-41 | III-1 | 20 | 5 | 75 | 1.50 |
| A-12 | 8,000 | I-1 | II-44 | III-1 | 18 | 5 | 77 | 1.35 |
| A-13 | 6,000 | I-2 | II-56 | III-2 | 23 | 4 | 73 | 1.40 |
| A-14 | 10,000 | I-28 | II-6 | III-1 | 28 | 9 | 63 | 1.50 |
| A-15 | 14,000 | I-30 | II-10 | III-1 | 19 | 9 | 72 | 1.45 |
| A-16 | 13,000 | I-1 | — | III-1 | 29 | 0 | 71 | 1.35 |
| A-17 | 15,000 | I-28 | — | III-1 | 30 | 0 | 70 | 1.30 |
| A-18 | 12,000 | I-2 | Styrene | III-1 | 30 | 10 | 60 | 1.50 |
| A-19 | 14,000 | THP | II-13 | III-1 | 30 | 10 | 60 | 1.45 |

The structures used as unit (III) of resin (A) are shown below.

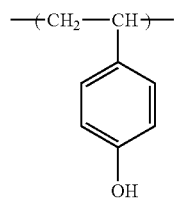

(III-1)

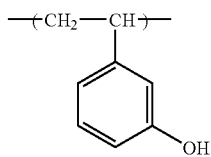

(III-2)

The structure of A-18 of resin (A) is shown below.

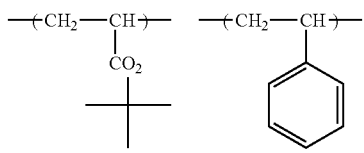

The structure of A-19 of resin (A) is shown below.

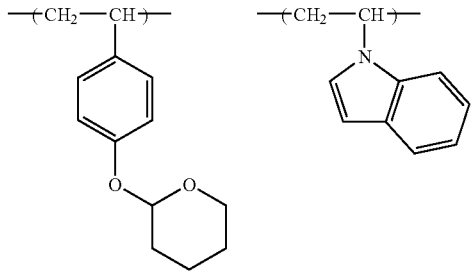

-continued

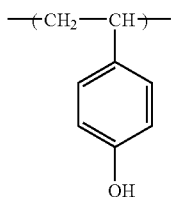

Synthesis Example 1

Synthesis of Polymer (A-1)

4-Acetoxystyrene (29.19 g) (0.18 mol), 12.80 g (0.09 mol) of t-butyl methacrylate, 4.66 g (0.03 mol) of 4-vinylquinoline, and 3.45 g (0.015 mol) of polymerization initiator V-601 (manufactured by Wako Pure Chemical Industries) are dissolved in 148.99 g of cyclohexanone. Cyclohexanone (37.25 g) is put in a reaction vessel and the above solution is dropped into the reaction system at 80° C. over 6 hours under nitrogen gas atmosphere. After dropping, the reaction solution is stirred while heating for 2 hours, and then allowed to cool to room temperature. The solution is dropped into 2.5 liters of hexane to thereby precipitate and filter the polymer. The solid filtered is roughly washed with 500 ml of hexane and dried under reduced pressure to obtain 41.30 g of t-butyl methacrylate/4-vinylquinoline/4-acetoxystyrene copolymer.

After the obtained polymer (40.00 g) is dissolved in 92 ml of ethyl acetate and 92 ml of methanol in the reaction vessel, 39.78 g of a 28% methanol solution of sodium methoxide is added to the solution and stirred for 3 hours, and then hydrochloric acid is added to the system to make it acidic. Ethyl acetate (500 ml) is added thereto, and the reaction solution is washed with 200 ml of distilled water five times. The organic layer is taken out and concentrated, and then dissolved in 150 ml of methanol. The solution is dropped into 1.5 liters of distilled water/methanol (7/3), and the precipitated polymer is filtered. The solid filtered is roughly washed with 500 ml of distilled water/methanol (7/3) and dried under reduced pressure to obtain 29.46 g of t-butyl methacrylate/4-vinylquinoline/4-hydroxystyrene copolymer. The weight average molecular weight of the copolymer by GPC is 15,000, and the polydispersity (Mw/Mn) is 1.35.

The resins shown in Table 1 above are synthesized in the same manner as Synthesis Example 1.

Examples 1 to 26 and Comparative Examples 1 to 4

(1) Preparation of Positive Resist and Coating

Each component shown in Table 2 below is dissolved in the solvents, and the obtained solution is precisely filtered through a membrane filter having a pore diameter of 0.1 μm to obtain a resist solution.

Hexamethyldisilazane treatment is performed on 8 inch silicon wafer with a spin coater ACT8 (manufactured by Tokyo Electron Limited), and then the resist solution obtained above is coated and baked at 130° C. for 60 seconds to obtain a film having an average film thickness of 420 nm.

TABLE 2

| Example No. | Resin (0.966 g) | Acid Generator (0.03 g) | | Ratio | Organic Basic Compound (0.003 g) | Surfactant (0.001 g) | Solvent (14 g) | | Ratio | Dye (0.03 g) | Antioxidant (100 ppm) |
|---|---|---|---|---|---|---|---|---|---|---|---|
| Example 1 | A-1 | z35 | — | 100 | C-1 | D-2 | E-1 | E-2 | 80/20 | — | — |
| Example 2 | A-2 | z36 | — | 100 | C-1 | D-2 | E-1 | E-2 | 80/20 | — | — |
| Example 3 | A-3 | z55 | — | 100 | C-1 | D-2 | E-1 | E-2 | 80/20 | — | — |
| Example 4 | A-4 | z84 | — | 100 | C-1 | D-2 | E-1 | E-2 | 80/20 | — | — |
| Example 5 | A-5 | z35 | — | 100 | C-1 | D-2 | E-1 | E-2 | 80/20 | — | — |
| Example 6 | A-6 | z36 | — | 100 | C-1 | D-2 | E-1 | E-2 | 70/30 | — | — |
| Example 7 | A-7 | z55 | — | 100 | C-1 | D-2 | E-1 | E-2 | 60/40 | — | — |
| Example 8 | A-8 | z84 | — | 100 | C-2 | D-2 | E-1 | E-2 | 80/20 | — | — |
| Example 9 | A-9 | z35 | — | 100 | C-1 | D-2 | E-1 | E-2 | 80/20 | — | — |
| Example 10 | A-10 | z36 | — | 100 | C-1 | D-1 | E-1 | E-2 | 80/20 | — | — |
| Example 11 | A-11 | z55 | — | 100 | C-1 | D-2 | E-1 | E-2 | 80/20 | — | — |
| Example 12 | A-12 | z84 | — | 100 | C-1 | D-2 | E-1 | — | 100 | — | — |
| Example 13 | A-13 | z36 | — | 100 | C-2 | D-2 | E-1 | E-2 | 80/20 | — | — |
| Example 14 | A-14 | z55 | — | 100 | C-1 | D-2 | E-1 | E-2 | 80/20 | — | — |
| Example 15 | A-15 | z84 | — | 100 | C-1 | D-2 | E-1 | E-2 | 70/30 | — | — |
| Example 16 | A-1 | z2 | — | 100 | C-1 | D-2 | E-1 | E-3 | 80/20 | — | G-1 |
| Example 17 | A-1 | z1 | z35 | 60/40 | C-1 | D-2 | E-1 | — | 100 | — | — |
| Example 18 | A-1 | z7 | z36 | 50/50 | C-1 | D-2 | E-1 | E-3 | 60/40 | — | — |
| Example 19 | A-1 | z23 | z40 | 50/50 | C-1 | D-2 | E-1 | E-2 | 80/20 | — | — |
| Example 20 | A-5 | z2 | — | 100 | C-1 | D-2 | E-1 | E-2 | 80/20 | — | — |
| Example 21 | A-5 | z84 | z55 | 70/30 | C-1 | D-1 | E-1 | E-2 | 80/20 | — | — |
| Example 22 | A-5 | z35 | z84 | 80/20 | C-1 | D-2 | E-1 | E-2 | 80/20 | — | G-1 |
| Example 23 | A-5 | z71 | — | 100 | C-1 | D-2 | E-1 | E-2 | 80/20 | — | — |
| Example 24 | A-5 | z55 | z1 | 50/50 | C-1 | D-2 | E-1 | E-2 | 80/20 | — | — |
| Example 25 | A-10 | z84 | z7 | 50/50 | C-2 | D-2 | E-1 | E-2 | 80/20 | — | — |
| Example 26 | A-10 | z36 | z32 | 70/30 | C-2 | D-2 | E-1 | E-4 | 70/30 | — | G-1 |
| Comparative Example 1 | A-16 | z2 | — | 100 | C-1 | D-2 | E-1 | E-2 | 80/20 | — | — |
| Comparative Example 2 | A-17 | z2 | — | 100 | C-1 | D-2 | E-1 | E-2 | 80/20 | — | — |
| Comparative Example 3 | A-18 | z1 | — | 100 | C-1 | D-2 | E-1 | E-2 | 80/20 | F-1 | — |
| Comparative Example 4 | A-19 | z1 | — | 100 | C-1 | D-2 | E-1 | E-2 | 80/20 | — | — |

The components used in Examples and Comparative Examples are as follows.
Organic Basic Compounds:
C-1: Tetra(n-butyl)ammonium hydroxide
C-2: Tri-n-hexylamine
Surfactants:
D-1: Megafac F176 (fluorine surfactant, manufactured by Dainippon Ink and Chemicals Inc.)
D-2: PF6320 (manufactured by OMNOVA Solution Inc.)
Solvents:
E-1: Propylene glycol monomethyl ether acetate
E-2: Propylene glycol monomethyl ether
E-3: Ethyl lactate
E-4: Methyl amyl ketone
Dye:

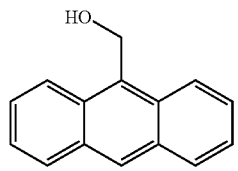

(F-1)

Antioxidant:

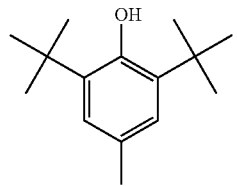

G-1

(2) Forming Method of a Positive Resist Pattern

The obtained resist film is subjected to pattern exposure with a KrF excimer laser scanner (PAS5500/850C, manufactured by ASML, wavelength: 248 nm, NA: 0.70, Sigma: 0.80). The resist film is baked at 130° C. for 60 seconds after irradiation, and then immersion treated with a 2.38 mass % tetramethylammonium hydroxide (TMAH) aqueous solution for 60 seconds, rinsed with water for 30 seconds and dried. The obtained pattern is evaluated according to the following methods.

(2-1) Sensitivity

The line width of the obtained pattern is observed with a scanning electron microscope (S-9260, manufactured by Hitachi, Ltd.), and irradiation energy required for the mask of 0.20 μm line (line/space: 1/1) to become 0.20 μm is taken as sensitivity.

(2-2) Evaluation of Resolution In the sensitivity obtained in above (2-1), to how many micrometers of line/space of 1/1 can be resolved is observed with the same scanning electron microscope.

(2-3) Evaluation of LWR (Line Width Roughness)

In the sensitivity obtained in above (2-1), as to the line of 0.20 μm wide obtained by the mask of 0.20 μm line pattern (line/space: 1/1), the line width is detected at plural points (64 points in a length of 1 μm) with a scanning electron microscope (S-9220, manufactured by Hitachi, Ltd.) in the measuring monitor, and the dispersion of irregularity at the detected positions (3σ) is taken as the index of LWR.

(2-4) Evaluation of Residual Standing Wave

In the sensitivity obtained in above (2-1), the sidewall of the resist pattern at the time of the mask of 0.20 μm line (line/space: 1/1) is 0.20 μm is observed with a scanning electron microscope (S-4800, manufactured by Hitachi, Ltd.) and evaluated according to the following five grades.
A: A case where standing wave is not observed at all and the pattern sidewall is very clear.
B: A case where standing wave is observed a little, or unevenness is observed on the pattern sidewall.
C: A case where standing wave is apparently observed.
D: A case where standing wave is a little strongly observed.
E: A case where standing wave is very strongly observed.

(2-5) Evaluation of Swing

Films having an average film thickness of 360 nm, 380 nm, 400 nm, 440 nm, nm and 480 nm are prepared by the method in the above (1) preparation of positive resist and coating, and patterns are formed according to the above (2) forming method of a positive resist pattern. The line width of the mask of 0.20 μm line (line/space: 1/1) of each film thickness in the sensitivity of the average film thickness of 420 nm obtained in (2-1) is measured. The difference between the maximum value and the minimum value of the line widths obtained by the above measurement is taken as the value of swing.

The results in Examples 1 to 26 and Comparative Examples 1 to 4 are shown in Table 3 below.

TABLE 3

| Example No. | Sensitivity (mJ/cm$^2$) | Resolution (nm) | LWR (nm) | Standing Wave (five grade evaluation) | SW (nm) |
|---|---|---|---|---|---|
| Example 1 | 14 | 145 | 6.3 | A | 30 |
| Example 2 | 24 | 155 | 6.8 | B | 31 |
| Example 3 | 25 | 155 | 6.7 | B | 42 |
| Example 4 | 20 | 170 | 7.4 | C | 50 |
| Example 5 | 18 | 150 | 6.7 | A | 36 |
| Example 6 | 25 | 160 | 7.5 | A | 34 |
| Example 7 | 18 | 155 | 6.3 | B | 28 |
| Example 8 | 20 | 140 | 6.4 | B | 42 |
| Example 9 | 22 | 160 | 7.2 | A | 25 |
| Example 10 | 16 | 165 | 8.7 | A | 41 |
| Example 11 | 25 | 160 | 6.7 | B | 28 |
| Example 12 | 25 | 165 | 7.2 | A | 35 |
| Example 13 | 32 | 175 | 6.8 | B | 47 |
| Example 14 | 18 | 150 | 6.3 | A | 29 |
| Example 15 | 29 | 170 | 8.2 | A | 32 |
| Example 16 | 18 | 165 | 6.6 | A | 32 |
| Example 17 | 17 | 165 | 7.4 | B | 34 |
| Example 18 | 20 | 160 | 7.5 | A | 34 |
| Example 19 | 25 | 170 | 9.2 | A | 35 |
| Example 20 | 26 | 170 | 8.8 | A | 33 |
| Example 21 | 24 | 170 | 7.9 | A | 30 |
| Example 22 | 18 | 155 | 6.1 | A | 32 |
| Example 23 | 16 | 145 | 6.3 | A | 36 |
| Example 24 | 20 | 160 | 8.9 | B | 42 |
| Example 25 | 23 | 165 | 7.2 | A | 34 |
| Example 26 | 22 | 165 | 6.3 | A | 31 |
| Comparative Example 1 | 46 | 185 | 14.2 | E | 85 |
| Comparative Example 2 | 48 | 190 | 15.5 | D | 90 |
| Comparative Example 3 | 37 | 180 | 13.8 | C | 48 |
| Comparative Example 4 | 44 | 190 | 11.2 | C | 45 |

From the results in Table 3, as to pattern forming by KrF excimer laser exposure, it can be seen that the positive resist compositions in the invention are high in sensitivity and resolution, excellent in LWR and swing performance, and little in standing wave, as compared with the case of using the comparative compounds.

Examples 27 to 41 and Comparative Examples 5 and 6

(3) Manufacture of Pattern and Evaluation (EB)

Each component shown in Table 4 below is dissolved in the solvents, and the obtained solution is precisely filtered through a membrane filter having a pore diameter of 0.1 µm to obtain a resist solution.

The resist solution is coated on a silicon wafer having been subjected to hexamethyldisilazane treatment with a spin coater Mark 8 (manufactured by Tokyo Electron Limited), and baked at 130° C. for 60 seconds to obtain a resist film having an average film thickness of 300 nm.

The resist film is irradiated with electron beams with an electron beam imaging apparatus (HL750, manufactured by Hitachi, Ltd., accelerating voltage: 50 KeV). The resist film is baked at 130° C. for 60 seconds after irradiation, and then immersion treated with a 2.38 mass % tetramethylammonium hydroxide (TMAH) aqueous solution for 60 seconds, rinsed with water for 30 seconds and dried. The obtained pattern is evaluated according to the following methods.

TABLE 4

| Example No. | Resin (0.966 g) | Acid Generator (0.03 g) | | Organic Basic Compound (0.003 g) | Surfactant (0.001 g) | Solvent (14 g) | | |
|---|---|---|---|---|---|---|---|---|
| | | | Ratio | | | | | Ratio |
| Example 27 | A-1 | z2 | 100 | C-1 | D-2 | E-1 | E-2 | 80/20 |
| Example 28 | A-2 | z2 | 100 | C-1 | D-2 | E-1 | E-2 | 80/20 |
| Example 29 | A-3 | z55 | 100 | C-1 | D-2 | E-1 | E-2 | 80/20 |
| Example 30 | A-4 | z84 | 100 | C-1 | D-2 | E-1 | E-2 | 80/20 |
| Example 31 | A-5 | z7 | 100 | C-1 | D-2 | E-1 | E-2 | 80/20 |
| Example 32 | A-6 | z35 | 100 | C-1 | D-2 | E-1 | E-2 | 70/30 |
| Example 33 | A-7 | z7 | 100 | C-1 | D-2 | E-1 | E-2 | 60/40 |
| Example 34 | A-8 | z84 | 100 | C-2 | D-2 | E-1 | E-2 | 80/20 |
| Example 35 | A-9 | z7 | 100 | C-1 | D-2 | E-1 | E-2 | 80/20 |
| Example 36 | A-10 | z7 | 100 | C-1 | D-1 | E-1 | E-2 | 80/20 |
| Example 37 | A-11 | z55 | 100 | C-1 | D-2 | E-1 | E-2 | 80/20 |
| Example 38 | A-12 | z84 | 100 | C-1 | D-2 | E-1 | — | 100 |
| Example 39 | A-13 | z36 | 100 | C-2 | D-2 | E-1 | E-2 | 80/20 |
| Example 40 | A-14 | z55 | 100 | C-1 | D-2 | E-1 | E-2 | 80/20 |
| Example 41 | A-15 | z84 | 100 | C-1 | D-2 | E-1 | E-2 | 70/30 |
| Comparative Example 5 | A-16 | z2 | 100 | C-1 | D-2 | E-1 | E-2 | 80/20 |
| Comparative Example 6 | A-17 | z2 | 100 | C-1 | D-2 | E-1 | E-2 | 80/20 |

(3-1) Sensitivity

The line width of the obtained pattern is observed with a scanning electron microscope (S-9260, manufactured by Hitachi, Ltd.), and irradiation energy required for the mask of 0.15 µm line (line/space: 1/1) to become 0.15 µm is taken as sensitivity.

(3-2) Evaluation of Resolution

In the sensitivity obtained in above (3-1), to how many micrometers of line/space of 1/1 can be resolved is observed with the same scanning electron microscope.

(3-3) Evaluation of LWR

In the sensitivity obtained in above (3-1), LWR at the time of the mask of 0.15 µm line pattern (line/space: 1/1) is 0.15 µm is measured with the same scanning electron microscope.

The results in Examples 27 to 41 and Comparative Examples 5 and 6 are shown in Table 5 below.

TABLE 5

| Example No. | Sensitivity (µC/cm$^2$) | Resolution (nm) | LWR (nm) |
|---|---|---|---|
| Example 27 | 6.0 | 85 | 4.8 |
| Example 28 | 7.1 | 70 | 4.4 |
| Example 29 | 7.5 | 90 | 5.7 |
| Example 30 | 5.3 | 150 | 7.2 |
| Example 31 | 6.7 | 90 | 7.4 |
| Example 32 | 7.7 | 100 | 5.7 |
| Example 33 | 6.4 | 95 | 5.6 |
| Example 34 | 5.7 | 95 | 5.9 |
| Example 35 | 6.7 | 95 | 6.0 |
| Example 36 | 8.7 | 100 | 7.2 |
| Example 37 | 7.3 | 95 | 6.7 |
| Example 38 | 8.3 | 90 | 5.2 |
| Example 39 | 8.5 | 135 | 6.7 |
| Example 40 | 10.7 | 110 | 5.3 |
| Example 41 | 6.2 | 80 | 4.8 |
| Comparative Example 5 | 15.0 | 180 | 13.4 |
| Comparative Example 6 | 16.9 | 185 | 12.5 |

From the results in Table 5, as to pattern forming by electron beam irradiation, it can be seen that the resist compositions in the invention are high in sensitivity and resolution, and excellent in LWR performance as compared with the case of using the comparative compounds.

Examples 42 to 51 and Comparative Examples 7 and 8

(4) Manufacture of Pattern and Evaluation (EUV)

Each component shown in Table 6 below is dissolved in the solvents, and the obtained solution is precisely filtered through a membrane filter having a pore diameter of 0.1 μm to obtain a resist solution.

The resist solution is coated on a silicon wafer having been subjected to hexamethyldisilazane treatment with a spin coater Mark 8 (manufactured by Tokyo Electron Limited), and baked at 130° C. for 60 seconds to obtain a resist film having an average film thickness of 150 nm.

The obtained resist film is subjected to exposure with EUV radiation (wavelength: 13 nm, EUVES, manufactured by Lithotrack Japan) by varying the exposure dose 0.5 by 0.5 mJ/cm² within the range of exposure dose of from 0 to 20.0 mJ/cm², and further to baking at 130° C. for 90 seconds. After that, a dissolution rate of the resist film at each exposure dose is measured with a 2.38 mass % tetramethyl-ammonium hydroxide (TMAH) aqueous solution to obtain a dissolution rate curve.

TABLE 6

| Example No. | Resin (0.966 g) | Acid Generator (0.03 g) | | Organic Basic Compound (0.003 g) | Surfactant (0.001 g) | | Solvent (14 g) | |
|---|---|---|---|---|---|---|---|---|
| | | | Ratio | | | | | Ratio |
| Example 42 | A-1 | z2 | 100 | C-1 | D-2 | E-1 | E-2 | 80/20 |
| Example 43 | A-3 | z55 | 100 | C-1 | D-2 | E-1 | E-2 | 80/20 |
| Example 44 | A-4 | z84 | 100 | C-1 | D-2 | E-1 | E-2 | 80/20 |
| Example 45 | A-5 | z7 | 100 | C-1 | D-2 | E-1 | E-2 | 80/20 |
| Example 46 | A-6 | z35 | 100 | C-1 | D-2 | E-1 | E-2 | 70/30 |
| Example 47 | A-8 | z84 | 100 | C-2 | D-2 | E-1 | E-2 | 80/20 |
| Example 48 | A-10 | z7 | 100 | C-1 | D-1 | E-1 | E-2 | 80/20 |
| Example 49 | A-11 | z55 | 100 | C-1 | D-2 | E-1 | E-2 | 80/20 |
| Example 50 | A-13 | z36 | 100 | C-2 | D-2 | E-1 | E-2 | 80/20 |
| Example 51 | A-14 | z55 | 100 | C-1 | D-2 | E-1 | E-2 | 80/20 |
| Comparative Example 7 | A-16 | z2 | 100 | C-1 | D-2 | E-1 | E-2 | 80/20 |
| Comparative Example 8 | A-17 | z2 | 100 | C-1 | D-2 | E-1 | E-2 | 80/20 |

Sensitivity and Resolution (Dissolution Contrast):

In the dissolution rate curve, the exposure dose at the time when the dissolution rate of the resist is saturated is taken as sensitivity, and dissolution contrast (γ value) is computed from the gradient of the straight line part of the dissolution rate curve as the index of resolution. The greater the γ value, the better is the dissolution contrast and the higher is the resolution.

TABLE 7

| Example No. | Sensitivity (mJ/cm²) | Resolution (γ value) |
|---|---|---|
| Example 42 | 6.0 | 6.1 |
| Example 43 | 7.0 | 6.1 |
| Example 44 | 7.0 | 4.8 |
| Example 45 | 6.0 | 6.8 |
| Example 46 | 7.0 | 6.8 |
| Example 47 | 7.0 | 6.2 |
| Example 48 | 7.0 | 6.7 |
| Example 49 | 7.0 | 8.3 |
| Example 50 | 6.0 | 5.4 |
| Example 51 | 7.0 | 6.2 |
| Comparative Example 7 | 12.0 | 4.4 |
| Comparative Example 8 | 13.0 | 4.1 |

From the results in Table 7, as to pattern forming by EUV exposure, it can be seen that the positive resist compositions in the invention are high in sensitivity and dissolution contrast as compared with the case of using the comparative compounds.

As described above, the positive resist compositions in the invention exhibit good results also by EUV irradiation.

In connection with pattern formation by irradiation with electron beams, KrF excimer laser beams or EUV rays, a resist composition showing high sensitivity, high resolution, and good LWR, and further reduced in swing due to standing wave, shape, and variation of a resist film thickness in a high reflection substrate represented by KrF ion implantation process, and a pattern-forming method using the same can be provided according to the invention.

The entire disclosure of each and every foreign patent application from which the benefit of foreign priority has been claimed in the present application is incorporated herein by reference, as if fully set forth.

What is claimed is:

1. A resist composition comprising:
   (A) a resin comprising:
      a repeating unit capable of decomposing by the action of an acid to increase solubility in an alkali developing solution and represented by the following formula (I), and
      a repeating unit represented by the following formula (II); and
   (B) a compound capable of generating an acid upon irradiation with actinic ray or radiation:

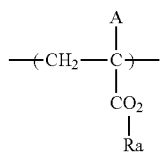

(I)

-continued (II)

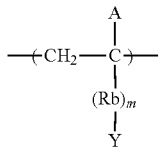

wherein
A represents a hydrogen atom, an alkyl group, a hydroxyl group, an alkoxyl group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group;
Ra represents a group containing a group capable of decomposing by the action of an acid;
Rb represents an alkylene group, a cycloalkylene group, or a group of combining these groups;
Y represents a polycyclic heterocyclic group containing nitrogen; and
m represents 0 or 1;
wherein the resin (A) further comprises:
a repeating unit represented by the following formula (III):

(III)

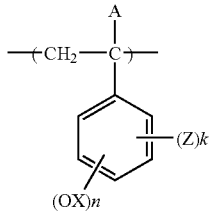

wherein
A represents a hydrogen atom, an alkyl group, a hydroxyl group, an alkoxyl group, a halogen atom, a cyano group, a nitro group, an acyl group, an acyloxy group, a cycloalkyl group, an aryl group, a carboxyl group, an alkyloxycarbonyl group, an alkylcarbonyloxy group, or an aralkyl group;
X represents a hydrogen atom or a group containing a group capable of decomposing by the action of an acid, and when there are a plurality of X's, each X may be the same as or different from every other X;
Z represents a substituent, and when there are a plurality of Z's, each Z may be the same as or different from every other Z;
n represents an integer of from 1 to 5;
k represents an integer of from 0 to 4; and
n and k satisfy $1 \leq n+k \leq 5$.

2. The resist composition as claimed in claim 1, wherein Ra in the formula (I) in the resin (A) is a group represented by —C(Rc)(Rd)(Re) wherein
each of Rc, Rd and Re independently represents a hydrogen atom, an alkyl group, a cycloalkyl group or an aryl group, and
Rd and Re may be bonded to each other to form a ring.

3. The resist composition as claimed in claim 1, wherein the polycyclic heterocyclic group represented by Y in the formula (II) in the resin (A) includes a 5- or 6-membered ring.

4. The resist composition as claimed in claim 1, wherein the polycyclic heterocyclic group represented by Y in the formula (II) in the resin (A) includes an aromatic heterocyclic ring.

5. A pattern-forming method comprising:
forming a resist film with the resist composition as claimed in claim 1, exposing the resist film, and
developing the resist film.

* * * * *